United States Patent
Hwang et al.

(10) Patent No.: US 8,809,938 B2
(45) Date of Patent: Aug. 19, 2014

(54) THREE DIMENSIONAL SEMICONDUCTOR MEMORY DEVICES

(75) Inventors: Sung-Min Hwang, Seoul (KR); Hansoo Kim, Suwon-si (KR); Changseok Kang, Seongnam-si (KR); Wonseok Cho, Suwon-si (KR); Jae-Joo Shim, Suwon-si (JP)

(73) Assignee: Samsung Electronics Co., Ltd, Suwon-si, Gyeonggi-do (KR)

( * ) Notice: Subject to any disclaimer, the term of this patent is extended or adjusted under 35 U.S.C. 154(b) by 305 days.

(21) Appl. No.: 13/229,136

(22) Filed: Sep. 9, 2011

(65) Prior Publication Data

US 2012/0061744 A1  Mar. 15, 2012

(30) Foreign Application Priority Data

Sep. 10, 2010 (KR) .................. 10-2010-0089058

(51) Int. Cl.
 *H01L 29/792* (2006.01)
 *H01L 27/115* (2006.01)
 *H01L 27/108* (2006.01)

(52) U.S. Cl.
 USPC .............. 257/324; 257/326; 257/E21.423; 257/E21.679; 257/E29.309; 438/287

(58) Field of Classification Search
 USPC .............. 257/324, E27.081, 326, E29.309, 257/E21.423, E21.679; 438/287
 See application file for complete search history.

(56) References Cited

U.S. PATENT DOCUMENTS

| | | | |
|---|---|---|---|
| 7,558,141 B2 * | 7/2009 | Katsumata et al. | 365/210.1 |
| 7,821,058 B2 * | 10/2010 | Kidoh et al. | 257/324 |
| 8,194,467 B2 * | 6/2012 | Mikajiri et al. | 365/185.29 |
| 8,278,699 B2 * | 10/2012 | Tanaka et al. | 257/324 |
| 8,405,141 B2 * | 3/2013 | Matsuda et al. | 257/324 |
| 2008/0186771 A1 * | 8/2008 | Katsumata et al. | 365/185.17 |
| 2009/0230449 A1 * | 9/2009 | Sakaguchi et al. | 257/298 |
| 2010/0109065 A1 * | 5/2010 | Oh et al. | 257/314 |
| 2010/0133599 A1 * | 6/2010 | Chae et al. | 257/315 |
| 2010/0207195 A1 * | 8/2010 | Fukuzumi et al. | 257/326 |
| 2011/0065270 A1 * | 3/2011 | Shim et al. | 438/589 |
| 2012/0012895 A1 * | 1/2012 | Or-Bach et al. | 257/204 |

* cited by examiner

*Primary Examiner* — Cheung Lee
*Assistant Examiner* — Jeremy Joy
(74) *Attorney, Agent, or Firm* — F. Chau & Associates, LLC

(57) ABSTRACT

Three dimensional semiconductor memory devices are provided. The three dimensional semiconductor memory device includes a first stacked structure and a second stacked structure sequentially stacked on a substrate. The first stacked structure includes first insulating patterns and first gate patterns which are alternately and repeatedly stacked on a substrate, and the second stacked structure includes second insulating patterns and second gate patterns which are alternately and repeatedly stacked on the first stacked structure. A plurality of first vertical active patterns penetrate the first stacked structure, and a plurality of second vertical active patterns penetrate the second stacked structure. The number of the first vertical active patterns is greater than the number of the second vertical active patterns.

20 Claims, 40 Drawing Sheets

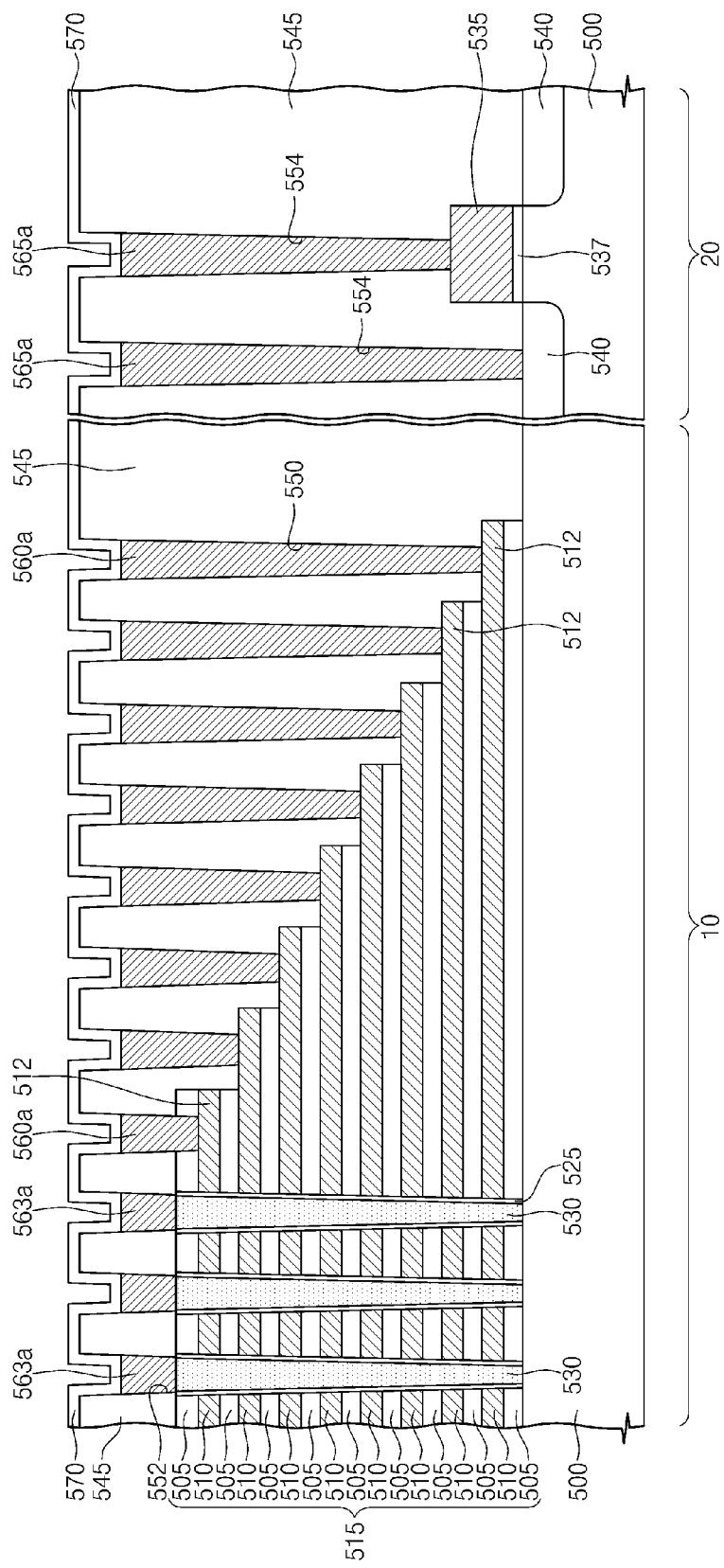

THREE DIMENSIONAL SEMICONDUCTOR MEMORY DEVICES

CROSS-REFERENCE TO RELATED APPLICATIONS

This U.S. non-provisional patent application claims priority under 35 U.S.C. §119 to Korean Patent Application No. 10-2010-0089058, filed on Sep. 10, 2010, the entirety of which is incorporated by reference herein.

BACKGROUND

1. Technical Field

The present disclosure herein relates to semiconductor devices and, more particularly, to three dimensional semiconductor memory devices.

2. Discussion of Related Art

In two dimensional semiconductor memory devices, memory capacity may be limited by the number of memory cells that can be placed on the planar surface of the substrate. The integration density of the two dimensional semiconductor memory devices may be influenced by a minimum feature size which relates to a process technology for forming fine patterns. However, there may be limitations in the process technology for forming smaller patterns.

A need therefore exists for three dimensional semiconductor memory devices that include a plurality of memory cells which are three dimensionally arrayed.

SUMMARY

Embodiments of the inventive concept are directed to three dimensional semiconductor memory devices.

According to an embodiment, the three dimensional semiconductor memory device comprises a first stacked structure and a second stacked structure sequentially stacked on a substrate. The first stacked structure includes first insulating patterns and first gate patterns which are alternately and repeatedly stacked, and the second stacked structure includes second insulating patterns and second gate patterns which are alternately and repeatedly stacked. A plurality of first vertical active patterns penetrate the first stacked structure, and a plurality of second vertical active patterns penetrate the second stacked structure. The number of the first vertical active patterns is greater than the number of the second vertical active patterns.

According to an embodiment, the first vertical active patterns may include some of the first vertical active patterns which are respectively connected to the second vertical active patterns and at least one first vertical active pattern which is not connected to the second vertical active patterns. Each of the first and second gate patterns may include a pad portion, and the pad portions of the first and second gate patterns may be stacked to constitute a step structure. The at least one first vertical active pattern being not connected to the second vertical active patterns may be disposed between the first vertical active patterns connected to the second vertical active patterns and the pad portions of the first gate patterns. The device may further include an interlayer dielectric layer and a plurality of contact structures penetrating the interlayer dielectric layer. The interlayer dielectric layer may include a first planarized dielectric layer covering the pad portions of the first gate patterns and a second planarized dielectric layer covering the pad portions of the second gate patterns. The plurality of contact structures may be connected to the pad portions of the first and second gate patterns, respectively.

Each of the contact structures may include a first contact portion and a second contact portion which are sequentially stacked in a contact hole penetrating the interlayer dielectric layer. A width of a top surface of the second contact portion may be less than a width of a top surface of the first contact portion. The device may further include an insulating spacer between an inner sidewall of the respective contact holes and the second contact portion therein. The insulating spacer may be disposed on an edge of the top surface of the first contact portion, and the second contact portion may be disposed on a central portion of the top surface of the first contact portion. The second contact portion may include a different conductive material from the first contact portion. Alternatively, the second contact portion may include the same conductive material as the first contact portion. The second contact portion may include an air gap therein. The plurality of contact structures may be arrayed in a specific direction. Two immediately adjacent contact structures of the plurality of contact structures may be separated from each other by a contact-space in the specific direction. One of the contact-spaces between the plurality of contact plugs may be different from another contact-space. The contact-spaces may be gradually reduced in a descent direction of the pad portions constituting a step structure. Alternatively, the contact-spaces may be gradually increased in a descent direction of the pad portions constituting a step structure.

According to an embodiment, the device may further include a first data storing layer and a second data storing layer. The first data storing layer may be disposed between a sidewall of each first vertical active pattern and the first gate patterns adjacent thereto, and the second data storing layer may be disposed between a sidewall of each second vertical active pattern and the second gate patterns adjacent thereto.

According to an embodiment, the device may further include a lower stacked structure between the first stacked structure and the substrate, a plurality of lower vertical active patterns penetrating the lower stacked structure, an upper stacked structure on the second stacked structure, and a plurality of upper vertical active patterns penetrating the upper stacked structure. The lower stacked structure may include lower insulating patterns and lower gate patterns which are alternately and repeatedly stacked, and the upper stacked structure may include upper insulating patterns and upper gate patterns which are alternately and repeatedly stacked. The number of the lower vertical active patterns may be equal to the number of the first vertical active patterns, and the first vertical active patterns may be respectively disposed on the lower vertical active patterns. The number of the upper vertical active patterns may be equal to the number of the second vertical active patterns, and the upper vertical active patterns may be respectively disposed on the second vertical active patterns. Each of the lower gate patterns, the first gate patterns, the second gate patterns and the upper gate patterns may include a pad portion. The pad portions of the lower gate patterns, the first gate patterns, the second gate patterns and the upper gate patterns may be stacked to constitute a step structure.

According to an embodiment, there is provided a semiconductor memory device comprising a substrate, a plurality of stacked structures that are sequentially stacked on a top surface of the substrate, wherein each of the stacked structures includes insulating patterns and gate patterns that are alternately arranged in a first direction perpendicular to the top surface of the substrate, a plurality of rows of vertical active patterns that are sequentially arranged on the top of the surface to penetrate the plurality of stacked structures, respectively, wherein vertical active patterns in each row are spaced apart from each other by a predetermined distance in a second direction parallel to the top surface of the substrate, wherein the number of vertical active patterns in a first row of the rows is equal to or less than the number of vertical active patterns in a second row of the rows, wherein the second row is positioned under the first row.

The vertical active patterns in the first row are connected to at least some of the vertical active patterns in the second row, respectively.

The semiconductor memory device further comprises a plurality of contact structures that are respectively formed on top surfaces of the vertical active patterns in an uppermost row and pad portions that are respectively included in side edges of the gate patterns and form a step structure, and an interlayer dielectric layer filling a space between top surfaces of the contact structures and the top surface of the substrate.

Each of the plurality of contact structures includes a first contact portion and a second contact portion that is formed under the first contact portion and has a width larger than a width of the first contact portion.

A distance between two neighboring contact structures increases in the second direction from the vertical active patterns toward the pad portions.

BRIEF DESCRIPTION OF THE DRAWINGS

The embodiments of the inventive concept will become more apparent in view of the attached drawings and accompanying detailed description.

FIGS. 8A to 8C are cross sectional views illustrating a method of fabricating a three dimensional semiconductor memory device according to an exemplary embodiment of the inventive concept;

DETAILED DESCRIPTION OF THE EMBODIMENTS

Figure 1:
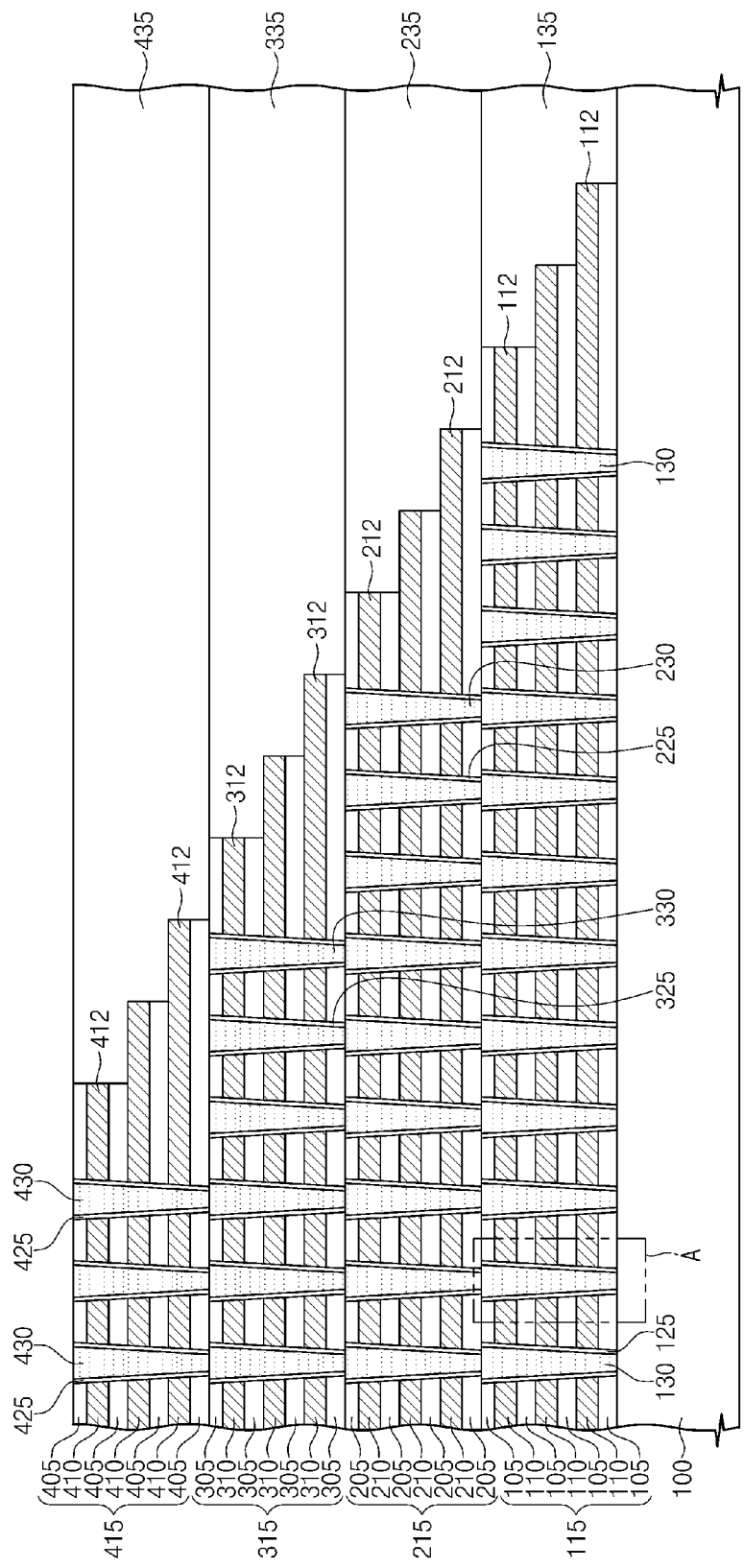
FIG. 1 is a cross sectional view illustrating a three dimensional semiconductor memory device according to an exemplary embodiment of the inventive concept.

The embodiments of the inventive concept will now be described more fully hereinafter with reference to the accompanying drawings.

Similarly, it will be understood that when an element such as a layer, region or substrate is referred to as being "on" another element, it can be directly on the other element or intervening elements may be present. The same reference numerals or the same reference designators may be used to denote the same or substantially the same elements throughout the specification and the drawings.

FIG. 1 is a cross sectional view illustrating a three dimensional semiconductor memory device according to an exemplary embodiment of the inventive concept.

Referring to FIG. 1, a plurality of stacked structures 115, 215, 315 and 415 may be sequentially stacked on a semiconductor substrate 100 (hereinafter, referred to as a substrate). A first stacked structure 115 may be disposed on the substrate 100. The substrate 100 may include a silicon substrate, a germanium substrate, or a silicon-germanium substrate. The first stacked structure 115 may include first insulating patterns 105 and first gate patterns 110 which are alternately and repeatedly stacked. A plurality of first vertical active patterns 130 may extend in a direction substantially perpendicular to a top surface of the substrate 100 to penetrate the first stacked structure 115. The first vertical active patterns 130 may be laterally separated from each other. The first vertical active patterns 130 may contact the substrate 100. The first vertical active patterns 130 may be arrayed in a predetermined direction parallel to the top surface on the substrate 100. A first data storing layer 125 may be disposed between a sidewall of each first vertical active pattern 130 and the first gate patterns 110 adjacent to the first vertical active pattern 130. According to an embodiment, the first data storing layer 125 may extend in a direction substantially perpendicular to the top surface of the substrate 100 to intervene between a sidewall of each first vertical active pattern 130 and the first insulating patterns 105 adjacent to the first vertical active pattern 130. The first gate patterns 110 may correspond to gates of respective vertical transistors. Each of the vertical transistors may include a vertical channel region which is defined at the sidewall of each corresponding vertical active pattern 130.

Each of the first gate patterns 110 may include a conductive material. For example, according to an embodiment, each of the first gate patterns 110 may include at least one of a doped semiconductor layer (e.g., a doped silicon layer), a conductive metal nitride layer (e.g., a titanium nitride layer or a tantalum nitride layer), a metal layer (e.g., a tungsten layer, a copper layer, or an aluminum layer), a transition metal layer (e.g., a titanium layer or a tantalum layer), and a metal-semiconductor compound layer (e.g., a metal silicide layer). Each of the first insulating patterns 105 may include an oxide layer, a nitride layer, and/or an oxynitride layer. Each of the first vertical active patterns 130 may include the same semiconductor material as the substrate 100. For example, according to an embodiment, when the substrate 100 is a silicon substrate, each of the first vertical active patterns 130 may include silicon. The first vertical active patterns 130 may have a single crystalline state or a polycrystalline state. According to an embodiment, the first vertical active patterns 130 may have a pillar-shaped configuration, as illustrated in FIG. 1. However, the first vertical active patterns 130 are not limited to the pillar-shaped configuration.

The first data storing layer 125 may include a tunneling dielectric layer, a charge storing layer, and a blocking dielectric layer. The tunneling dielectric layer may include an oxide material layer. The charge storing layer may include a dielectric material layer having traps which are capable of storing charges. For example, according to an embodiment, the charge storing layer may include a nitride material layer. The blocking dielectric layer may include a high-k dielectric layer having a dielectric constant which is higher than a dielectric constant of the tunneling dielectric layer. For example, according to an embodiment, the blocking dielectric layer may include a metal oxide layer, such as a hafnium oxide layer and/or an aluminum oxide layer. The blocking dielectric layer may further include a barrier insulating layer (e.g., an oxide layer) having an energy band gap which is greater than an energy band gap of the high-k dielectric layer. The charge storing layer may be disposed between the tunneling dielectric layer and the blocking dielectric layer. The tunneling dielectric layer may be disposed between the sidewall of each first vertical active pattern 130 and the charge storing layer, and the blocking dielectric layer may be disposed between the charge storing layer and a sidewall of the first gate pattern 110 adjacent to the first vertical active pattern 130. In the event that the blocking dielectric layer includes the barrier insulating layer and the high-k dielectric layer, the barrier insulating layer may be disposed between the charge storing layer and the high-k dielectric layer.

Each of the first gate patterns 110 may extend in a predetermined direction parallel to the top surface of the substrate 100 and may include a pad portion 112 at an end of the first gate pattern 110. The pad portions 112 of the first gate patterns 110 may constitute a step structure. A first planarized dielectric layer 135 may be disposed at the pad portions 112 of the first gate patterns 110. For example, the pad portions 112 of the first gate patterns 110 may be covered by the first planarized dielectric layer 135. The first planarized dielectric layer 135 may be substantially coplanar with top surfaces of the first vertical active patterns 130 and a top surface of an uppermost first insulating pattern in the first stacked structure 115.

A second stacked structure 215 may be disposed on the first stacked structure 115. The second stacked structure 215 may include second insulating patterns 205 and second gate patterns 210 which are alternately and repeatedly stacked. A plurality of second vertical active patterns 230 may penetrate the second stacked structure 215. A second data storing layer 225 may be disposed between a sidewall of each second vertical active pattern 230 and the second gate patterns 210 adjacent to the second vertical active pattern 230. Each of the second gate patterns 210 may extend in a predetermined direction parallel to the top surface of the substrate 100 and may include a pad portion 212 at an end of the second gate pattern 210. The pad portions 212 of the second gate patterns 210 may constitute a step structure together with the pad portions 112 of the first gate patterns 110.

The second vertical active patterns 230 may contact top surfaces of the first vertical active patterns 130. The number of the first vertical active patterns 130 may be greater than the number of the second vertical active patterns 230. Thus, the plurality of first vertical active patterns 130 may include a first group of the first vertical active patterns 130 which are respectively connected to the second vertical active patterns 230 and a second group of first vertical active patterns 130 which are not connected to the second vertical active patterns 230. The number of the second group of the first vertical active patterns 130 may be one or more. Hereinafter, the first vertical active patterns 130 which belong to the first group may be also referred to as "connected first vertical active patterns", and the first vertical active patterns 130 which belong to the second group may be also referred to as "non-connected first vertical active patterns". For example, the number of the non-connected first vertical active patterns 130 may be one or more. The non-connected first vertical active patterns 130 may be disposed between the connected first vertical active patterns 130 and the pad portions 112 of the first gate patterns 110. According to an embodiment, a lowermost second gate pattern 210 of the plurality of second gate patterns 210 may extend to cover top surfaces of the non-connected first vertical active patterns 130.

A second planarized dielectric layer 235 may be disposed at the pad portions 212 of the second gate patterns 210 and on the first planarized dielectric layer 135. A top surface of the second planarized dielectric layer 235 may be substantially coplanar with top surfaces of the second vertical active patterns 230. The top surface of the second planarized dielectric layer 235 may be substantially coplanar with a top surface of an uppermost second insulating pattern of the second insulating patterns 205 in the second stacked structure 215.

The second gate patterns 210, the second vertical active patterns 230, and the second data storing layer 225 may be formed of the same materials as the first gate patterns 110, the first vertical active patterns 130 and the first data storing layer 125, respectively. Similarly, the second insulating patterns 205 may be formed of the same material as the first insulating patterns 105. The second planarized dielectric layer 235 may include an oxide layer, a nitride layer, and/or an oxynitride layer. The second planarized dielectric layer 235 may be formed of the same material as the first planarized dielectric layer 135.

A third stacked structure 315 may be disposed on the second stacked structure 215. The third stacked structure 315 may include third insulating patterns 305 and third gate patterns 310 which are alternately and repeatedly stacked. A plurality of third vertical active patterns 330 may penetrate the third stacked structure 315. A third data storing layer 325 may be disposed between a sidewall of each third vertical active pattern 330 and the third gate patterns 310 adjacent to the third vertical active pattern 330. Each of the third gate patterns 310 may extend in a predetermined direction parallel to the top surface of the substrate 100 and may include a pad portion 312 located at an end of the third gate pattern 310. The pad portions 312 of the third gate patterns 310 may constitute a step structure together with the pad portions 112 and 212 of the first and second gate patterns 110 and 210.

According to an embodiment, the number of the third vertical active patterns 330 may be less than the number of the second vertical active patterns 230. According to an embodiment, the plurality of second vertical active patterns 230 may include some of the second vertical active patterns 230 which are respectively connected to the third vertical active patterns 330 and the other (at least one) second vertical active pattern 230 which is not connected to the third vertical active patterns 330. The second vertical active patterns 230 non-connected to the third vertical active patterns 330 may be disposed between the second vertical active patterns 230 connected to the third vertical active patterns 330 and the pad portions 212 of the second gate patterns 210. According to an embodiment, a lowermost third gate pattern 310 of the plurality of third gate patterns 310 may extend to cover top surfaces of the second vertical active patterns 230 non-connected to the third vertical active patterns 330.

A third planarized dielectric layer 335 may cover the pad portions 312 of the third gate patterns 310 and the second planarized dielectric layer 235. A top surface of the third planarized dielectric layer 335 may be substantially coplanar with top surfaces of the third vertical active patterns 330. The third gate patterns 310, the third insulating patterns 305, the third vertical active patterns 330, the third data storing layer 325, and the third planarized dielectric layer 335 may be formed of the same materials as the first gate patterns 110, the first insulating patterns 105, the first vertical active patterns 130, the first data storing layer 125, and the first planarized dielectric layer 135, respectively.

A fourth stacked structure 415 may be disposed on the third stacked structure 315. The fourth stacked structure 415 may include fourth insulating patterns 405 and fourth gate patterns 410 which are alternately and repeatedly stacked. A plurality of fourth vertical active patterns 430 may penetrate the fourth stacked structure 415. A fourth data storing layer 425 may be disposed between a sidewall of each fourth vertical active pattern 430 and the fourth gate patterns 410 adjacent to the fourth vertical active pattern 430. Each of the fourth gate patterns 410 may extend in a predetermined direction parallel to the top surface of the substrate 100 and may include a pad portion 412 located at an end of the fourth gate pattern 410. The pad portions 412 of the fourth gate patterns 410 may constitute a step structure together with the pad portions 112, 212, and 312 of the first to third gate patterns 110, 210, and 310.

According to an embodiment, the number of the fourth vertical active patterns 430 may be less than the number of the third vertical active patterns 330. According to an embodiment, the plurality of third vertical active patterns 330 may include some of the third vertical active patterns 330 which are respectively connected to the fourth vertical active patterns 430 (which are also referred to as "connected third vertical active patterns") and the other (at least one) third vertical active pattern 330 which is not connected to the fourth vertical active patterns 430 (which are also referred to as "non-connected third vertical active patterns"). The non-connected third vertical active patterns 330 may be disposed between the connected third vertical active patterns 330 and the pad portions 312 of the third gate patterns 310. According to an embodiment, a lowermost fourth gate pattern 410 of the plurality of fourth gate patterns 410 may extend to cover top surfaces of the non-connected third vertical active patterns 330.

A fourth planarized dielectric layer 435 may cover the pad portions 412 of the fourth gate patterns 410 and the third planarized dielectric layer 335. A top surface of the fourth planarized dielectric layer 435 may be substantially coplanar with top surfaces of the fourth vertical active patterns 430. The fourth gate patterns 410, the fourth insulating patterns 405, the fourth vertical active patterns 430, the fourth data storing layer 425, and the fourth planarized dielectric layer 435 may be formed of the same materials as the first gate patterns 110, the first insulating patterns 105, the first vertical active patterns 130, the first data storing layer 125, and the first planarized dielectric layer 135, respectively.

The second, third and fourth vertical active patterns 230, 330, and 430 may have the same configuration as the first vertical active patterns 130. The second, third, and fourth data storing layers 225, 325, and 425 may have the same configuration as the first data storing layers 125.

A lowermost first gate pattern of the first gate patterns 110 may correspond to a gate of a ground selection transistor, and an uppermost fourth gate pattern of the fourth gate patterns 410 may correspond to a gate of a string selection transistor. The first to fourth gate patterns 110, 210, 310, and 410 disposed between the lowermost first gate pattern 110 and the uppermost fourth gate pattern 410 may correspond to gates of cell transistors, respectively. Each of the cell transistors may employ the charge storing layer of the data storing layer 125, 225, 325, or 425 as a data storing element. Thus, each of the cell transistors may acts as a non-volatile memory cell. A set of the first to fourth vertical active patterns 130, 230, 330, and 430, which are sequentially stacked and serially connected to each other, may constitute a single vertical cell string. The non-connected first to third vertical active patterns 130, 230 and 330, which are not connected to any one of the fourth vertical active patterns 430, may constitute transistors other than the transistors in the cell strings. Alternatively, the non-connected first to third vertical active patterns 130, 230 and 330, which are not connected to any one of the fourth vertical active patterns 430, may correspond to dummy patterns.

According to the three dimensional semiconductor memory device described above, the number of the vertical active patterns penetrating the stacked structure located at a relatively lower level may be greater than the number of the vertical active patterns penetrating the stacked structure located at a relatively higher level. Thus, a planarization process of the three dimensional semiconductor memory device may be more easily performed because of the presence of the non-connected first to third vertical active patterns 130, 230, and 330.

For example, according to an embodiment, the pad portions 112, 212, 312, and 412 of the first to fourth gate patterns 110, 210, 310, and 410 may constitute a step structure as described above. As a consequence, if the first vertical active patterns 130, which are not connected to the fourth vertical active patterns 430, are not formed, a dishing phenomenon may easily occur at an area between the first vertical active patterns 130 connected to the fourth vertical active patterns 430 and the pad portions 112 of the first gate patterns 110 during the planarization process for forming the first planarized dielectric layer 135, for example, due to the absence of the first vertical active patterns 130 acting as polishing stoppers between the first vertical active patterns 130 connected to the fourth vertical active patterns 430 and the pad portions 112 of the first gate patterns 110. Thus, the reliability of the three dimensional semiconductor memory device may be degraded. However, according to the embodiments of the inventive concept, the non-connected first to third vertical active patterns 130, 230, and 330 may be formed, as illustrated in FIG. 1, so that even though the first to third dielectric layers are planarized using a planarization process, such as a chemical mechanical polishing (CMP) technique, the dishing phenomenon may be significantly suppressed due to the presence of the non-connected first to third vertical active patterns 130, 230, and 330. As a result, the formation of the non-connected first to third vertical active patterns 130, 230 and 330 may enhance the reliability of the three dimensional semiconductor memory device.

As described above, according to an embodiment, four stacked structures 115, 215, 315, and 415 may be sequentially stacked on a substrate. However, the inventive concept is not limited to the embodiment. For example, the three dimensional semiconductor memory device according to the embodiments of the inventive concept may include two, three, five, or more stacked structures.

In the aforementioned three dimensional semiconductor memory device, each of the vertical active patterns may have a pillar shape, and at least one of the data storing layers may extend to intervene between the vertical active patterns and the insulating patterns. Alternatively, the vertical active pattern or the data storing layer may have a different configuration from those described in connection with FIG. 1. Modified embodiments will be described with reference to the drawings hereinafter.

Figure 2A:
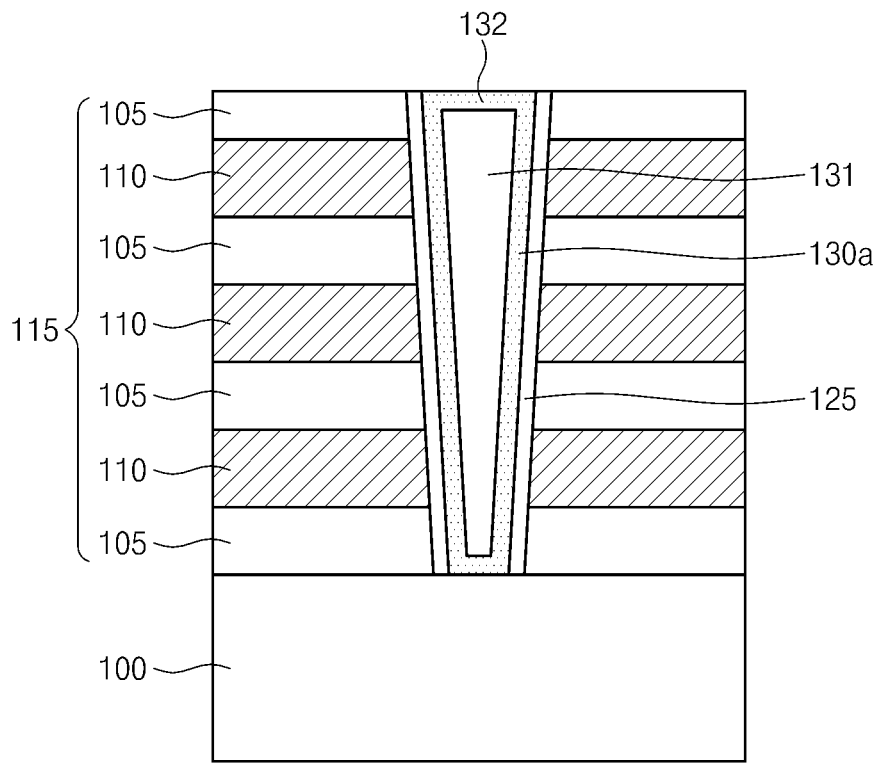
FIG. 2A is an enlarged view of a portion 'A' of FIG. 1 to illustrate a three dimensional semiconductor memory device according to an exemplary embodiment of the inventive concept.

FIG. 2A is an enlarged view of a portion 'A' of FIG. 1 to illustrate a three dimensional semiconductor memory device according to an exemplary embodiment of the inventive concept.

Referring to FIG. 2A, a first vertical active pattern 130a according to a modified embodiment may include an empty inner space. The inner space of the first vertical active pattern 130a may be filled with a filling dielectric pattern 131. The filling dielectric pattern 131 may include an oxide material, a nitride material, and/or an oxynitride material. A capping semiconductor pattern 132 may be disposed on the filling dielectric pattern 131. The capping semiconductor pattern 132 may be electrically and/or physically connected to the first vertical active pattern 130a. The first vertical active pattern 130a may be formed of the same semiconductor material as the first vertical active pattern 130 illustrated in FIG. 1, and the capping semiconductor pattern 132 may be formed of the same material as the first vertical active pattern 130a. The second to fourth vertical active patterns 230, 330, and 430 of FIG. 1 may have the same shape as the first vertical active pattern 130a.

Figure 2B:
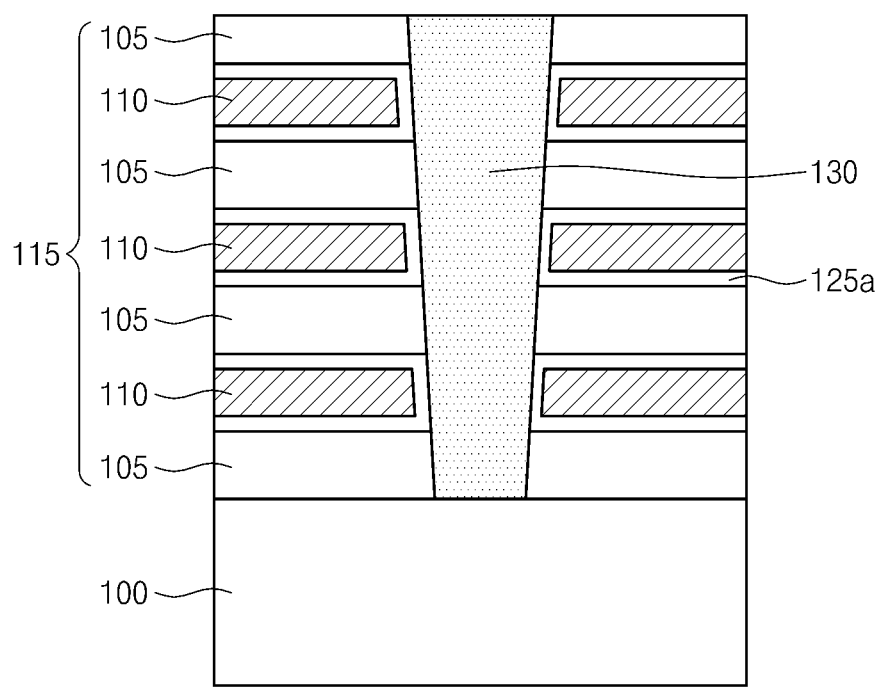
FIG. 2B is an enlarged view of a portion 'A' of FIG. 1 to illustrate a three dimensional semiconductor memory device according to an exemplary embodiment of the inventive concept.

FIG. 2B is an enlarged view of a portion 'A' of FIG. 1 to illustrate a three dimensional semiconductor memory device according to an exemplary embodiment of the inventive concept.

Referring to FIG. 2B, first data storing layers 125a may be disposed between sidewalls of the first vertical active patterns 130 and the first gate patterns 110. The first data storing layers 125a may extend to intervene between the first gate patterns 110 and the first insulating patterns 105 adjacent to the first gate patterns 110. Extensions of the first data storing layer 125a may contact bottom surfaces and top surfaces of the first gate patterns 110. The first data storing layer 125a may be formed of the same material as the first data storing layer 125 described with reference to FIG. 1. According to an embodiment, the first vertical active patterns 130 illustrated in FIG. 2B may be replaced with the first vertical active patterns 130a illustrated in FIG. 2A. The second, third, and fourth data storing layers 225, 325, and 425 may have the same shape as the first data storing layer 125a illustrated in FIG. 2B.

Figure 2C:
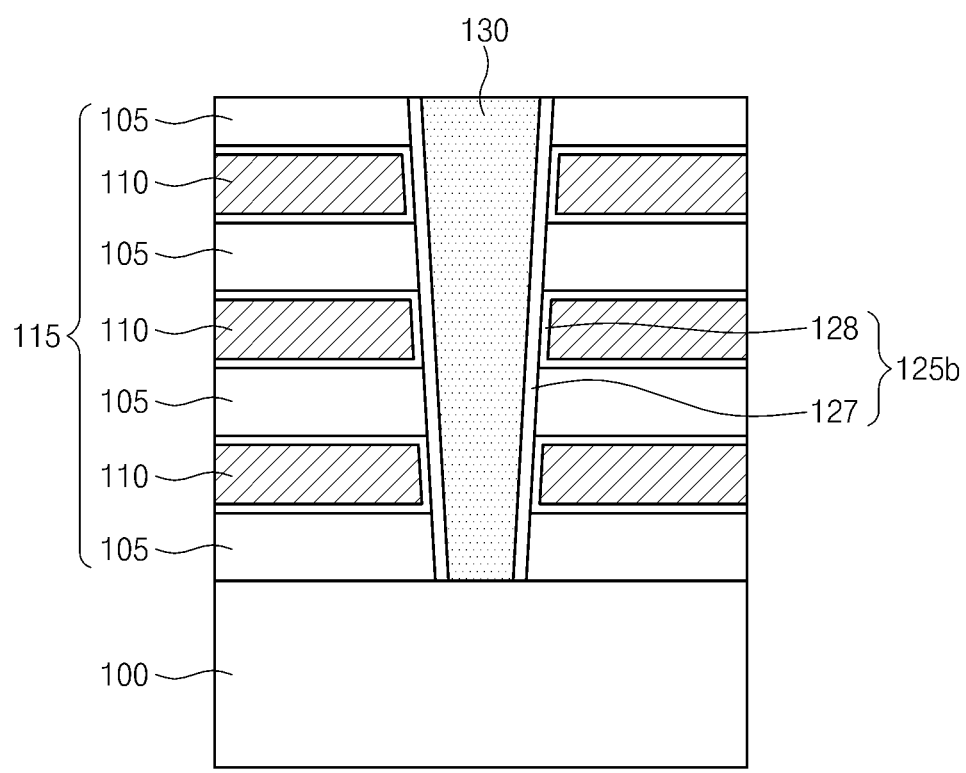
FIG. 2C is an enlarged view of a portion 'A' of FIG. 1 to illustrate a three dimensional semiconductor memory device according to an exemplary embodiment of the inventive concept.

FIG. 2C is an enlarged view of a portion 'A' of FIG. 1 to illustrate a three dimensional semiconductor memory device according to an exemplary embodiment of the inventive concept.

Referring to FIG. 2C, a first data storing layer 125b according to a modified embodiment may include a first sub layer 127 and a second sub layer 128. The first data storing layer 125b may be disposed between the sidewall of the first vertical active pattern 130 and the first gate patterns 110. The first sub layer 127 may extend to intervene between the sidewall of the first vertical active pattern 130 and the first insulating patterns 105. The second sub layer 128 may extend to intervene between the first gate patterns 110 and the first insulating patterns 105 adjacent to the first gate patterns 110. The extensions of the second sub layer 128 may contact the top and bottom surfaces of the first gate patterns 110.

The first data storing layer 125b may include a tunneling dielectric layer, a charge storing layer, and a blocking dielectric layer, like the first data storing layer 125 described with reference to FIG. 1. According to an embodiment, the first sub layer 127 may include a portion of each of the tunneling dielectric layer, the charge storing layer, and the blocking dielectric layer, and the second sub layer 128 may include the other portion of each of the tunneling dielectric layer, the charge storing layer, and the blocking dielectric layer. The first sub layer 127 may include at least the tunneling dielectric layer, and the second sub layer 128 may include a portion of at least the blocking dielectric layer. For example, according to an embodiment, the first sub layer 127 may include the tunneling dielectric layer, the charge storing layer, and the barrier insulating layer of the blocking dielectric layer, and the second sub layer 128 may include the high-k dielectric layer of the blocking dielectric layer. However, the structures of the first and second sub layers 127 and 128 are not limited thereto. For example, the first and second sub layers 127 and 128 may be embodied in different forms from the described form.

According to an embodiment, the first vertical active pattern 130 may be replaced with the vertical active pattern 130a illustrated in FIG. 2A. The second, third, and fourth data storing layers 225, 325, and 425 of FIG. 1 may be embodied to have the same shape as the first data storing layer 125b.

According to the three dimensional semiconductor memory device of FIG. 1, the number of the vertical active patterns may be gradually reduced as the location of the stacked structure is higher. Alternatively, the relationship between the number of the vertical active patterns in the stacked structure and the location of the stacked structure may vary according to an embodiment which will be described hereinafter with reference to FIG. 2D.

Figure 2D:
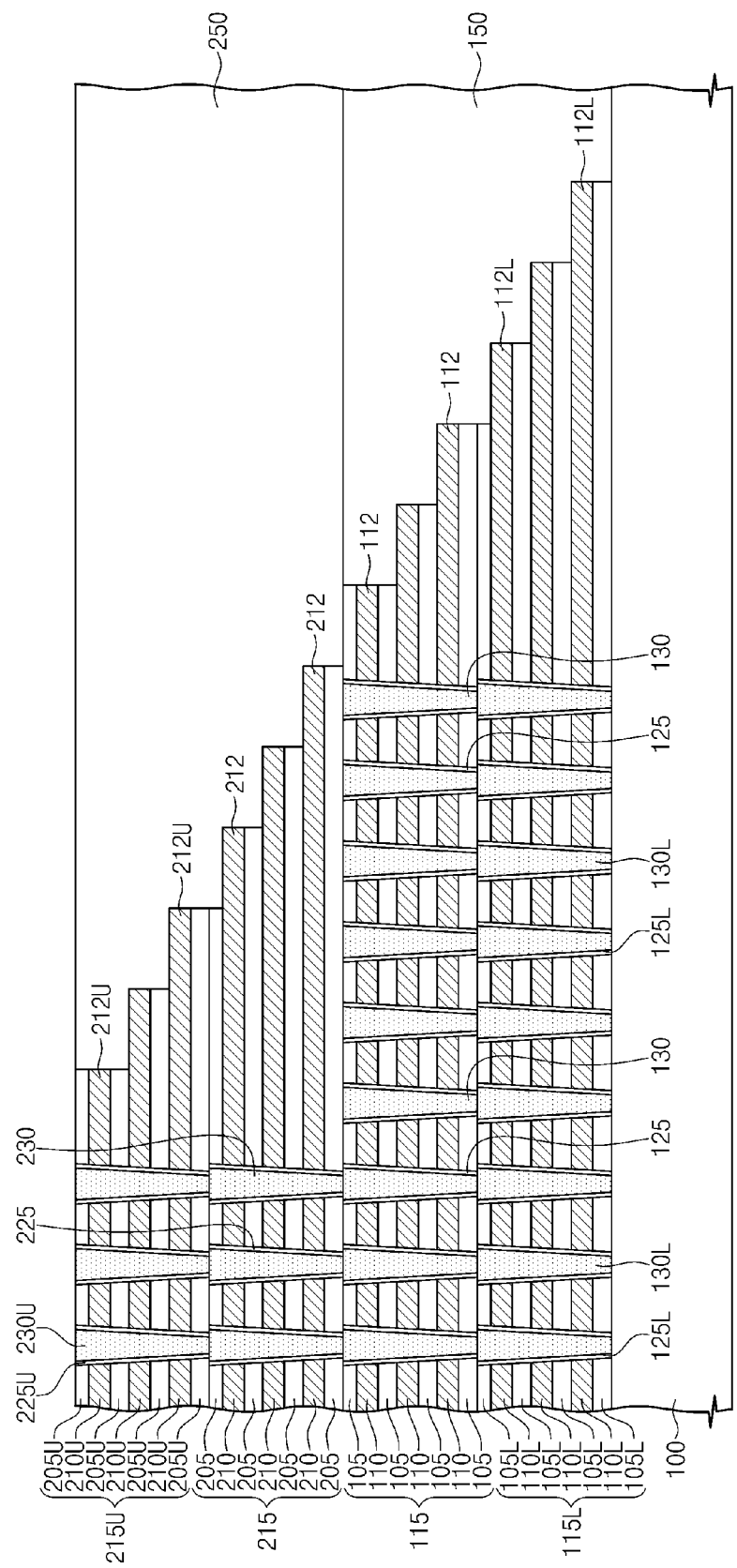
FIG. 2D is a cross sectional view illustrating a three dimensional semiconductor memory device according to an exemplary embodiment of the inventive concept.

FIG. 2D is a cross sectional view of a three dimensional semiconductor memory device according to an exemplary embodiment of the inventive concept.

Referring to FIG. 2D, a lower stacked structure 115L may be disposed between the first stacked structure 115 and the substrate 100. The lower stacked structure 115L may include lower insulating patterns 105L and lower gate patterns 110L which are alternately and repeatedly stacked. Each of the lower gate patterns 110L may include a pad portion 112L. A plurality of lower vertical active patterns 130L may penetrate the lower stack structure 115L. A lower data storing layer 125L may be disposed between a sidewall of each lower vertical active pattern 130L and the lower gate patterns 110L adjacent to the lower vertical active pattern 130L. The number of the lower vertical active patterns 130L may be equal to the number of the first vertical active patterns 130. The first vertical active patterns 130 may be disposed on the lower vertical active patterns 130L, respectively. Further, the first vertical active patterns 130 may be connected to the lower vertical active patterns 130L, respectively.

The pad portions 112 of the first gate patterns 110 and the pad portions 112L of the lower gate patterns 110L may constitute a step structure. A first planarized dielectric layer 150 may cover the pad portions 112 of the first gate patterns 110 and the pad portions 112L of the lower gate patterns 110L. A top surface of the first planarized dielectric layer 150 may be substantially coplanar with the top surfaces of the first vertical active patterns 130. The lower gate patterns 110L, the lower insulating patterns 105L, the lower vertical active patterns 130L, and the lower data storing layers 125L may be formed of the same materials as the first gate patterns 110, the first insulating patterns 105, the first vertical active patterns 130, and the first data storing layers 125, respectively. The first planarized dielectric layer 150 may include an oxide layer, a nitride layer, and/or an oxynitride layer.

The second stacked structure 215 may be disposed on the first stacked structure 115. The number of the first vertical active patterns 130 may be greater than the number of the second vertical active patterns 230 penetrating the second stacked structure 215.

An upper stacked structure 215U may be disposed on the second stacked structure 215. The upper stacked structure 215U may include upper insulating patterns 205U and upper gate patterns 210U which are alternately and repeatedly stacked. Each of the upper gate patterns 210U may extend in a predetermined direction parallel to the top surface of the substrate 100 and may include a pad portion 212U located at an end of the upper gate pattern 210U. A plurality of upper vertical active patterns 230U may penetrate the upper stack structure 215U. An upper data storing layer 225U may be disposed between a sidewall of each upper vertical active pattern 230U and the upper gate patterns 210U adjacent to the upper vertical active pattern 230U. The number of the upper vertical active patterns 230U may be equal to the number of the second vertical active patterns 230. The upper vertical active patterns 230U may be disposed on the second vertical active patterns 230, respectively. Further, the upper vertical active patterns 230U may be connected to the second vertical active patterns 230, respectively.

The pad portions 212U of the upper gate patterns 210U, the pad portions 212 of the second gate patterns 210, the pad portions 112 of the first gate patterns 110, and the pad portions 112L of the lower gate patterns 110L may constitute a step structure. A second planarized dielectric layer 250 may be disposed on the pad portions 212U of the upper gate patterns 210U, the pad portions 212 of the second gate patterns 210, and the first planarized dielectric layer 150. A top surface of the second planarized dielectric layer 250 may be substantially coplanar with top surfaces of the upper vertical active patterns 230U. The upper gate patterns 210U, the upper insulating patterns 205U, the upper vertical active patterns 230U, and the upper data storing layers 225U may be formed of the same materials as the second gate patterns 210, the second insulating patterns 205, the second vertical active patterns 230, and the second data storing layers 225, respectively. The second planarized dielectric layer 250 may include an oxide layer, a nitride layer, and/or an oxynitride layer.

FIGS. 3A to 3E are cross sectional views illustrating a method of fabricating a three dimensional semiconductor memory device according to an exemplary embodiment of the inventive concept.

Figure 3A:
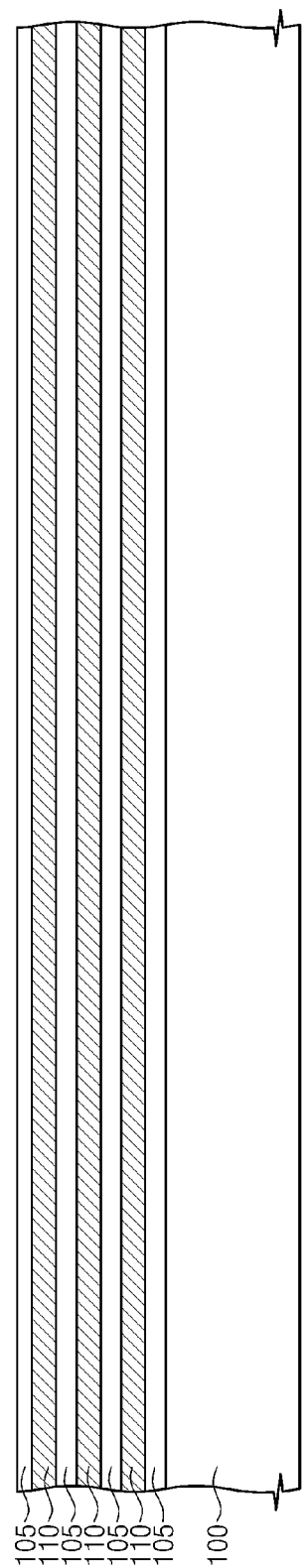
FIGS. 3A to 3E are cross sectional views illustrating a method of fabricating a three dimensional semiconductor memory device according to an exemplary embodiment of the inventive concept.
Figure 3B:
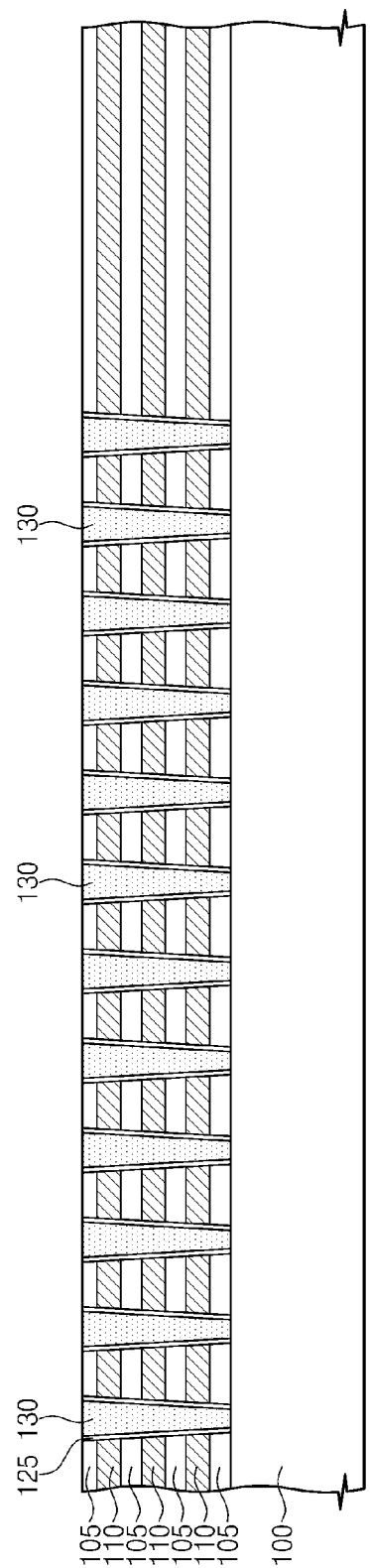

Referring to FIGS. 3A and 3B, first insulating layers 105 and first gate layers 110 may be alternately and repeatedly formed on a substrate 100. A plurality of first channel holes may be formed to penetrate the first insulating layers 105 and the first gate layers 110 which are stacked, and a first data storing layer 125 may be formed on sidewalls of the first channel holes. A plurality of first vertical active patterns 130 may be then formed in the first channel holes, respectively. As illustrated in FIG. 3B, the first vertical active patterns 130 may be formed to have a pillar shape filling the respective first channel holes.

Alternatively, a first semiconductor layer may be conformably formed on the substrate having the first data storing layer 125, and a filling dielectric layer may be then formed on the first semiconductor layer. The filling dielectric layer and the first semiconductor layer may be planarized to form first vertical active patterns 130a filing dielectric patterns 131, as illustrated in FIG. 2A. The first vertical active patterns 130a and the filing dielectric patterns 131 may be then recessed so that upper portions of the first vertical active patterns 130a and the filing dielectric patterns 131 may be lower than upper portions of the first channel holes. A second semiconductor layer may be formed on the substrate having the recessed first vertical active patterns 130a and the recessed filing dielectric patterns 131, and the second semiconductor layer may be planarized to form capping semiconductor patterns 132 illustrated in FIG. 2A.

Figure 3C:
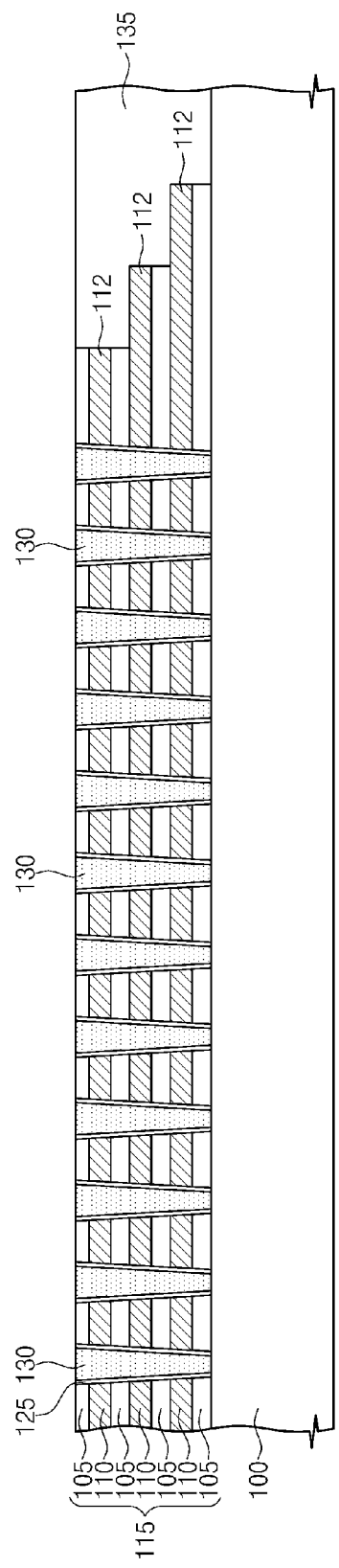

Referring to FIG. 3C, the first insulating layers 105 and the first gate layers 110 may be patterned to form first insulating patterns 105 and first gate patterns 110 having pad portions 112 which constitute a step structure. The first insulating patterns 105 and the first gate patterns 110 may constitute a first stacked structure 115. The pad portions 112 having the step structure may be formed using a first patterning process that employs a mask pattern as a consumption etching mask. Alternatively, the pad portions 112 having the step structure may be formed using a second patterning process that employs a masking method. The masking method adds mask spacers to a reference mask pattern step by step. The detailed descriptions on the first and second patterning processes will be given below with reference to FIGS. 12A to 13B.

Subsequently, referring to FIG. 3C, a first dielectric layer may be formed on an entire surface of the substrate having the pad portions 112, and the first dielectric layer may be planarized until the first vertical active patterns 130 are exposed. As a result, a first planarized dielectric layer 135 may be formed to cover the pad portions 112 of the first gate patterns 110. When the first dielectric layer is planarized, the first vertical active patterns 130 may be used as etch stop layers. Accordingly, a top surface of the first planarized dielectric layer 135 may be substantially coplanar with top surfaces of the first vertical active patterns 130.

Figure 3D:
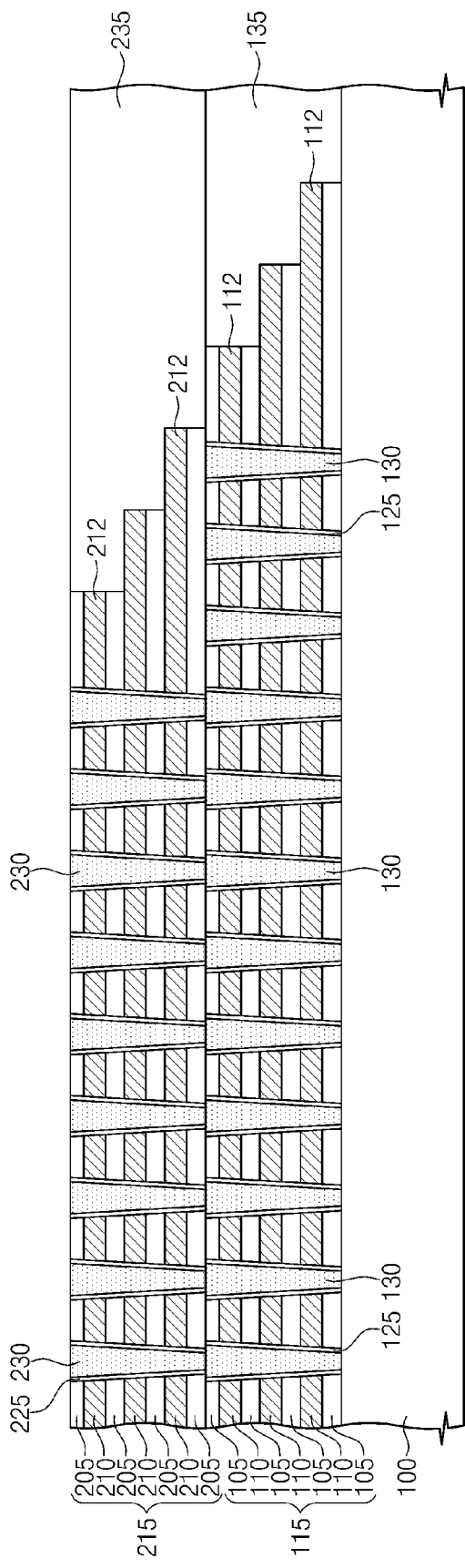

Referring to FIG. 3D, second insulating layers 205 and second gate layers 210 may be alternately and repeatedly stacked on the substrate having the first planarized dielectric layer 135. The second insulating layers 205 and the second gate layers 210 may be then patterned to form a plurality of second channel holes penetrating the second insulating layers 205 and the second gate layers 210. The second channel holes may be formed to expose at least some of the first vertical active patterns 130. A plurality of second vertical active patterns 230 may be then formed in the second channel holes, respectively. Each of the second vertical active patterns 230 may be connected to one of the first vertical active patterns 130. According to an embodiment, the number of the second channel holes may be less than the number of the first channel holes. Thus, the first vertical active patterns 130 may include a first group of the first vertical active patterns 130 which are respectively connected to the second vertical active patterns 230 and a second group of the first vertical active patterns 130 which are not connected to the second vertical active patterns 230. The number of the non-connected first vertical active patterns 130 may be one or more. The non-connected first vertical active patterns 130 may be disposed between the connected first vertical active patterns 130 and the pad portions 112 of the first gate patterns 110. The second vertical active patterns 230 may be formed to have the same shape as the first vertical active patterns 130.

Subsequently, the second insulating layers 205 and the second gate layers 210 may be patterned to form second gate patterns 210 having pad portions 212 that constitute a step structure. During the formation of the second gate patterns 210, second insulating patterns 205 may also be formed. As such, a second stacked structure 215 may be formed to include the second insulating patterns 205 and the second gate patterns 210 which are alternately and repeatedly stacked. The pad portions 212 of the second gate patterns 210 may constitute a step structure together with the pad portions 112 of the first gate patterns 110. For example, the pad portions 112 and 212 of the first and second gate patterns 110 and 210 may exhibit a configuration which is stepped down from the pad portion 212 of the uppermost second gate pattern 210 toward the pad portion 112 of the lowermost first gate pattern 110. The non-connected first vertical active patterns 130 may be disposed under the pad portions 212 of the second gate patterns 210.

A second dielectric layer may be formed on the substrate having the pad portions 212 of the second gate patterns 210. The second dielectric layer may be planarized until the second vertical active patterns 230 are exposed, thereby forming a second planarized dielectric layer 235.

Figure 3E:
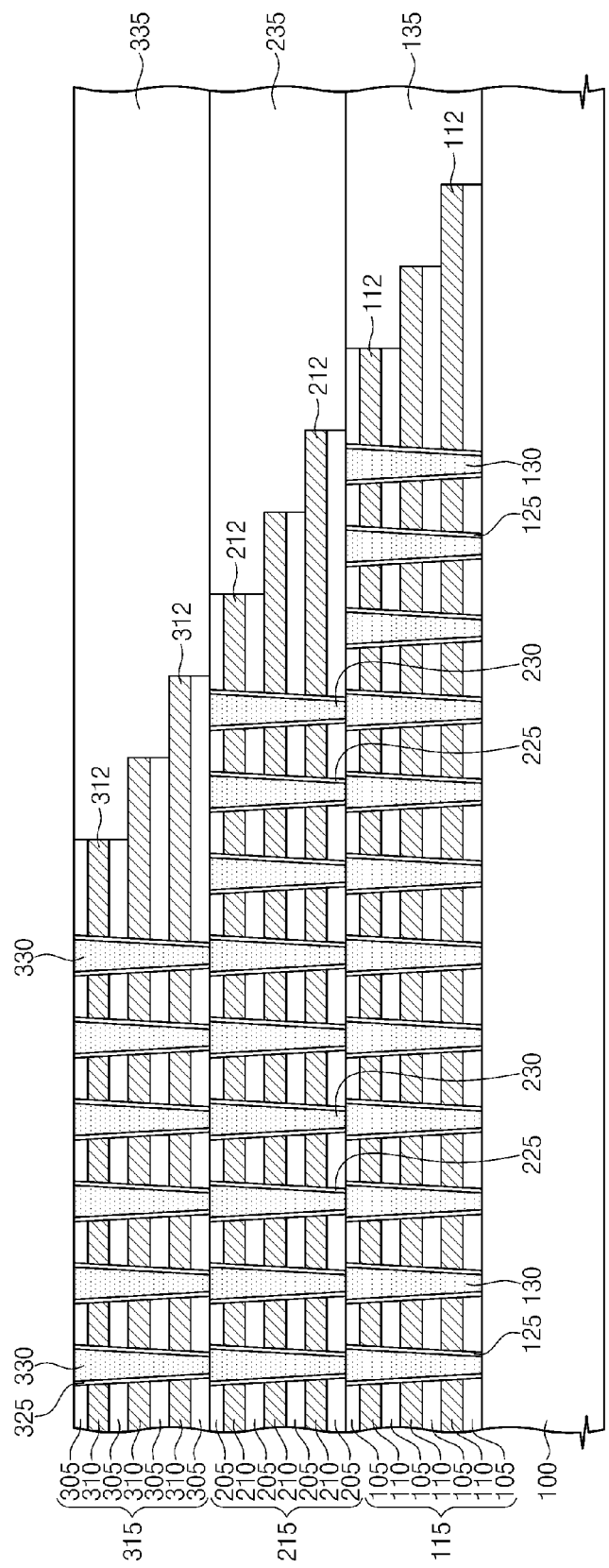

Referring to FIG. 3E, the same methods as described with reference to FIG. 3D may be performed to form third insulating patterns 305, third gate patterns 310, third channel holes, third data storing layers 325, third vertical active patterns 330, pad portions 312 of the third gate patterns 310, and a third planarized dielectric layer 335. The number of the third channel holes may be less than the number of the second channel holes.

Subsequently, the same methods as described with reference to FIG. 3D may be again performed to form fourth insulating patterns 405, fourth gate patterns 410, fourth channel holes, fourth data storing layers 425, fourth vertical active patterns 430, pad portions 412 of the fourth gate patterns 410, and a fourth planarized dielectric layer 435. The number of the fourth channel holes may be less than the number of the third channel holes. As such, the three dimensional semiconductor memory device illustrated in FIG. 1 may be fabricated.

According to the method of fabricating a three dimensional semiconductor memory device described above, the three dimensional semiconductor memory device may be formed so that the number of the first vertical active patterns 130 is greater than the number of the second active patterns 230. Thus, the first vertical active patterns 130, which are not connected to the second vertical active patterns 230, may be formed to be adjacent to the pads portions 112 of the first gate patterns 110. As a consequence, a dishing phenomenon may be suppressed while the first dielectric layer is planarized using the first vertical active patterns 130 as etching stop layers or polishing stop layers. As a result, a high reliable and highly integrated three dimensional semiconductor memory device may be realized. Further, supportability of the first stacked structure 115 may be improved due to the presence of the non-connected first vertical active patterns 130.

According to an embodiment, the gate patterns of the stacked structures may be formed using different methods from the embodiments described above. This will be described with reference to the drawings hereinafter.

FIGS. 4A to 4E are perspective views illustrating a method of fabricating a three dimensional semiconductor memory device according to a modified exemplary embodiment of the inventive concept.

Figure 4A:
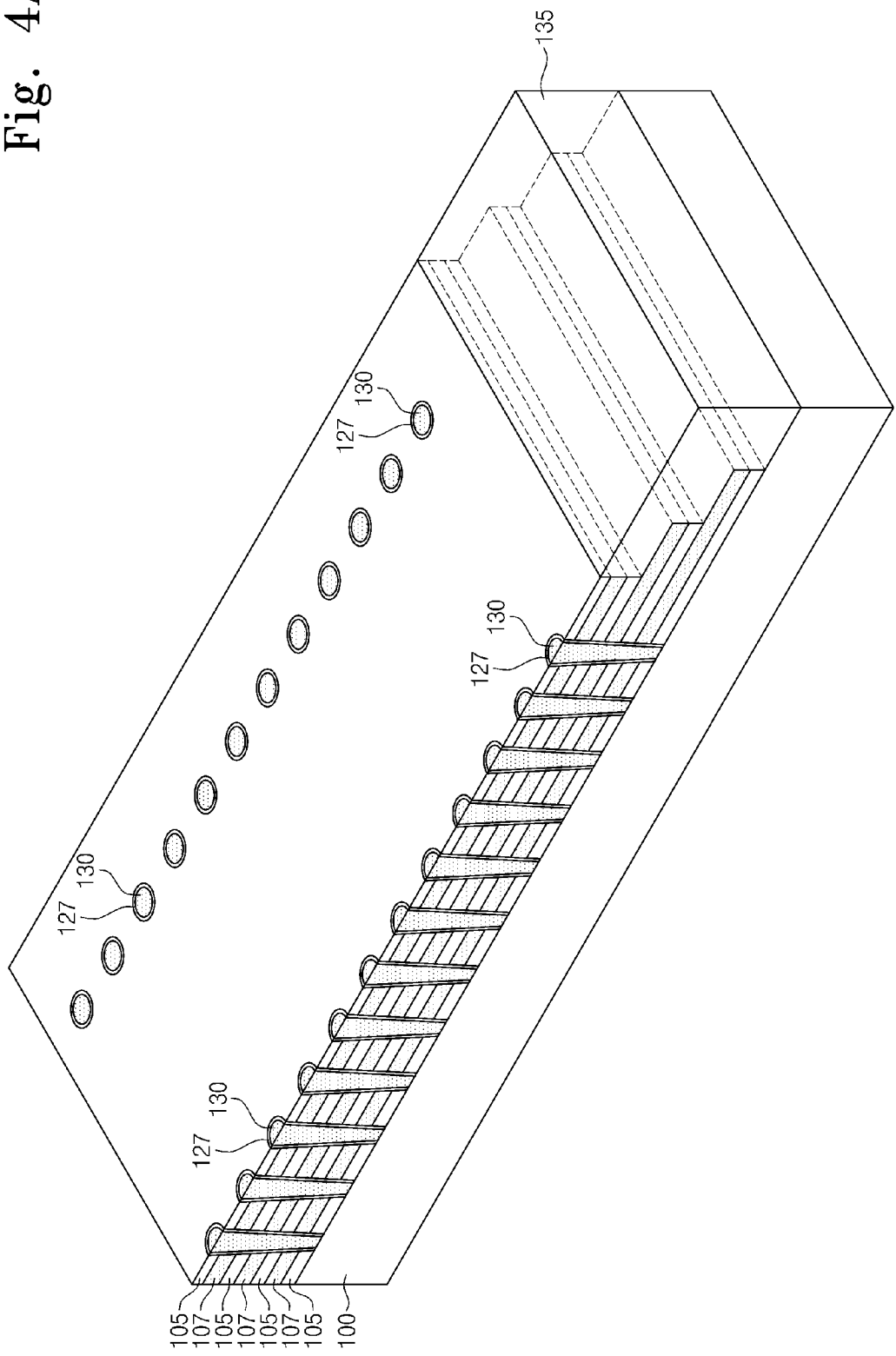
FIGS. 4A to 4E are perspective views illustrating a method of fabricating a three dimensional semiconductor memory device according to an exemplary embodiment of the inventive concept.

Referring to FIG. 4A, insulating layers 105 and sacrificial layers 107 may be alternately and repeatedly formed on a substrate 100. The sacrificial layers 107 may be formed of a material having an etch selectivity with respect to the insulating layers 105. For example, according to an embodiment, the insulating layers 105 may be formed of oxide layers, and the sacrificial layers 107 may be formed of nitride layers. The insulating layers 105 and the sacrificial layers 107 may be patterned to form a plurality of first channel holes penetrating the insulating layers 105 and the sacrificial layers 107. The first channel holes may be two dimensionally arrayed along rows and columns. A first sub layer 127 may be formed on each of sidewalls of the first channel holes. First vertical active patterns 130 may be then formed in the first channel holes surrounded by the first sub layers, respectively. Portions of the insulating layers 105 and the sacrificial layers 107, which are located at a side of the first vertical active patterns 130, may be patterned to form a step structure which is adjacent to the first vertical active patterns 130. A first dielectric layer may be formed on the substrate having the step structure of the insulating layers 105 and the sacrificial layers 107. The first dielectric layer may be planarized using the first vertical active patterns 130 as etching stop layers or polishing stop layers, thereby forming a first planarized dielectric layer 135 having a top surface which is substantially coplanar with top surfaces of the first vertical active patterns 130.

Figure 4B:
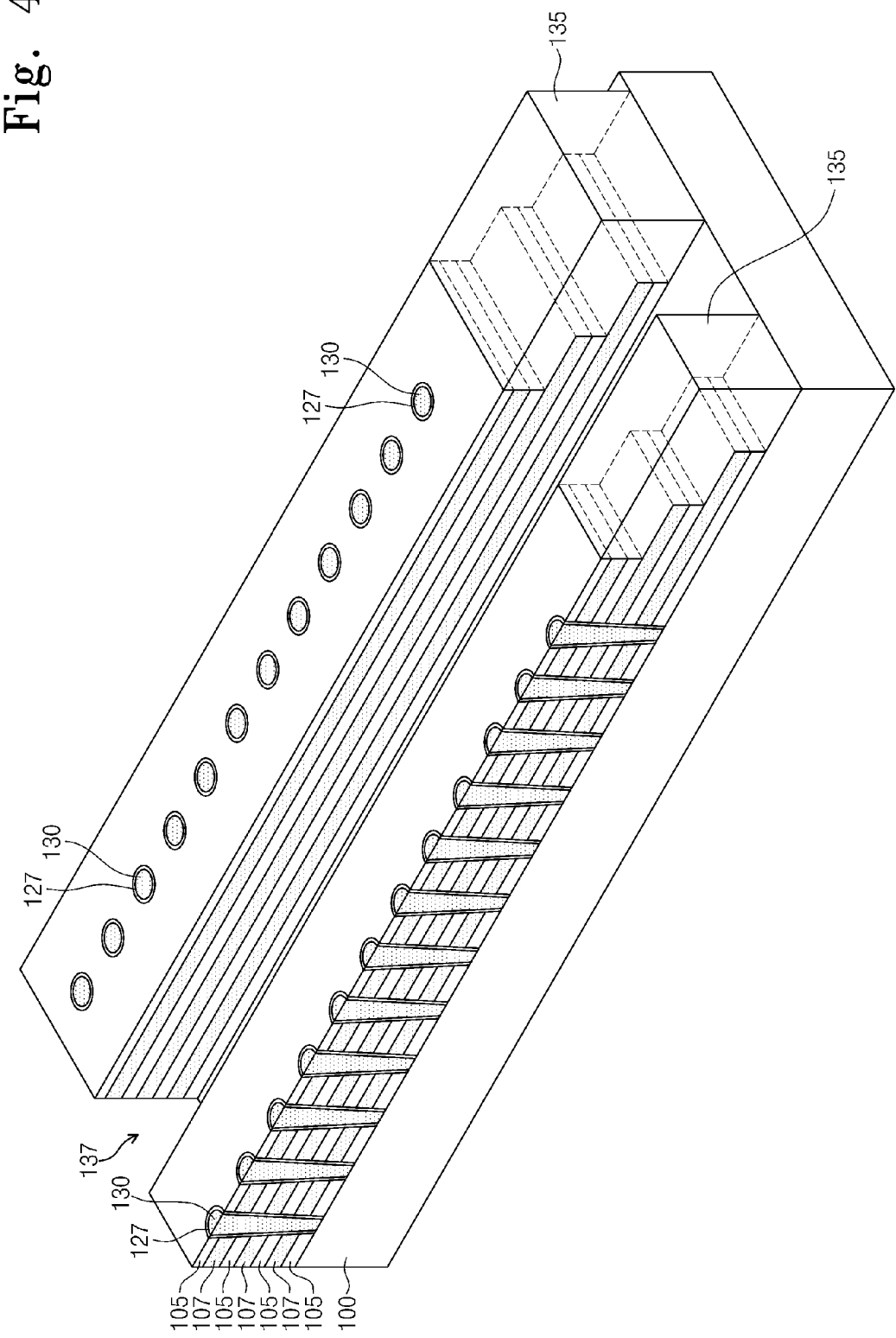

Referring to FIG. 4B, the insulating layers 105, the sacrificial layers 107, and the first planarized dielectric layer 135 may be patterned to form a groove 137 extending in a predetermined direction that may be parallel to the rows of the first vertical active patterns 130. The groove 137 may expose sidewalls of the patterned insulating layers 105 and the patterned sacrificial layers 107.

Figure 4C:
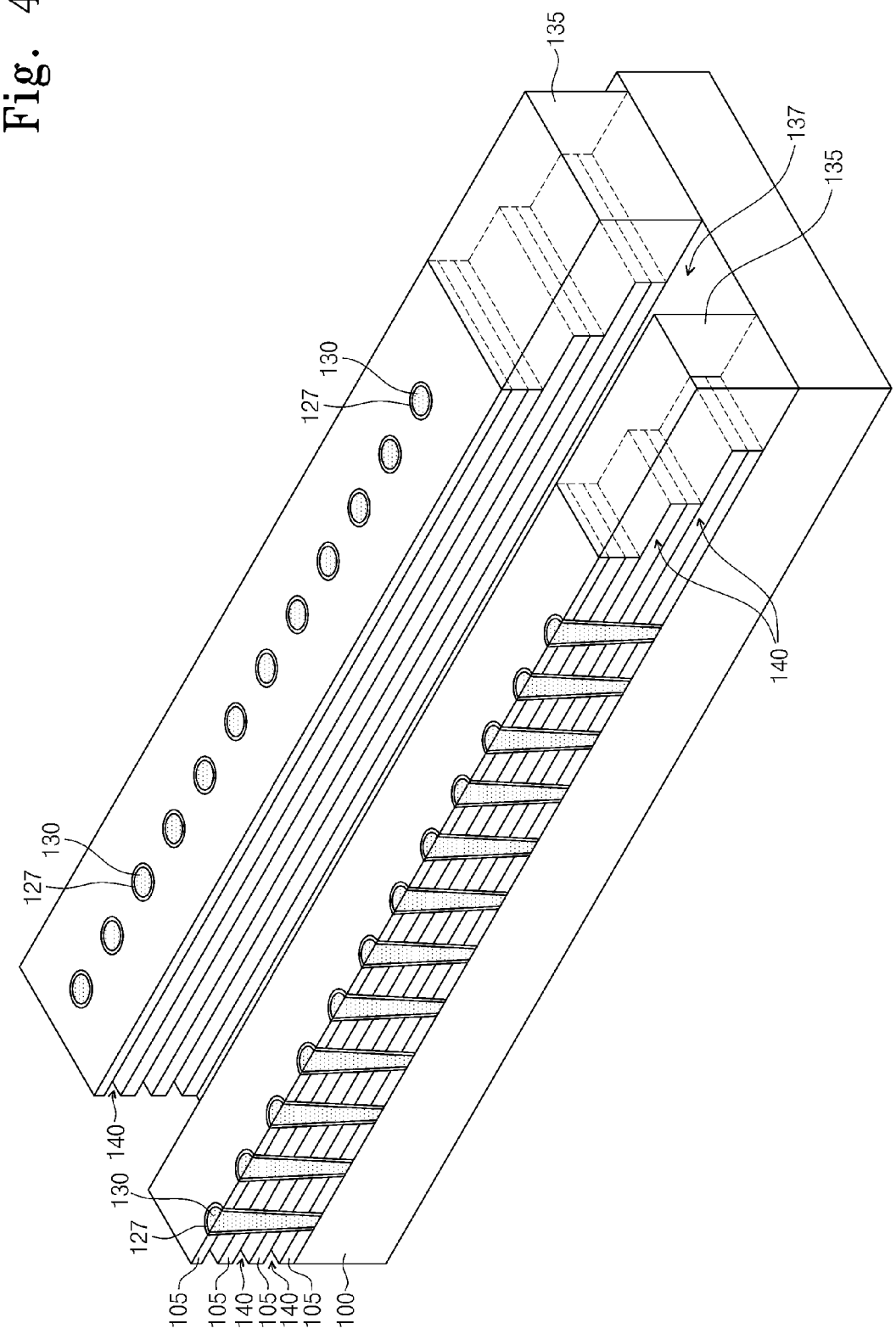

Referring to FIG. 4C, the exposed sacrificial layers 107 may be removed to form empty regions 140. The empty regions 140 may expose the first sub layers 127 on the sidewalls of the first vertical active patterns 130. The empty regions 140 may have a step structure due to the shape of the patterned sacrificial layers 107.

Figure 4D:
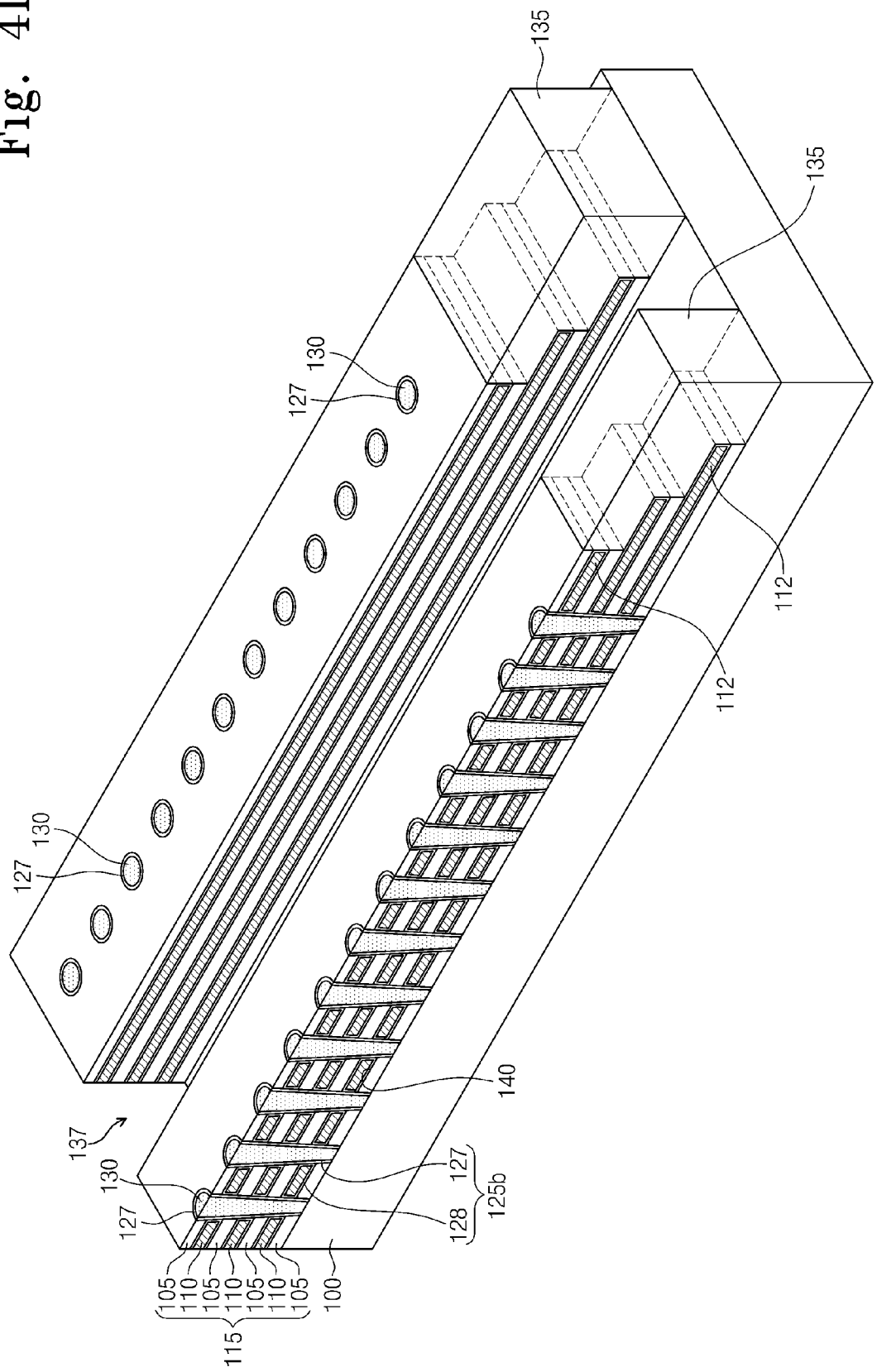

Referring to FIG. 4D, a second sub layer 128 may be conformably formed on the substrate having the empty regions 140. Thus, the second sub layer 128 may be formed to substantially a uniform thickness on inner surfaces of the empty regions 140. A gate conductive layer filling the empty regions 140 may be formed on the substrate having the second sub layer 128. The second sub layer 128 outside the empty regions 140 may be selectively removed to form gate patterns 110 remaining in the empty regions 140. The gate patterns 110 may have pad portions 112 constituting a step structure due to the shape of the empty regions 140. The first and second sub layers 127 and 128 may constitute a data storing layer 125b described with reference to FIG. 2C.

Figure 4E:
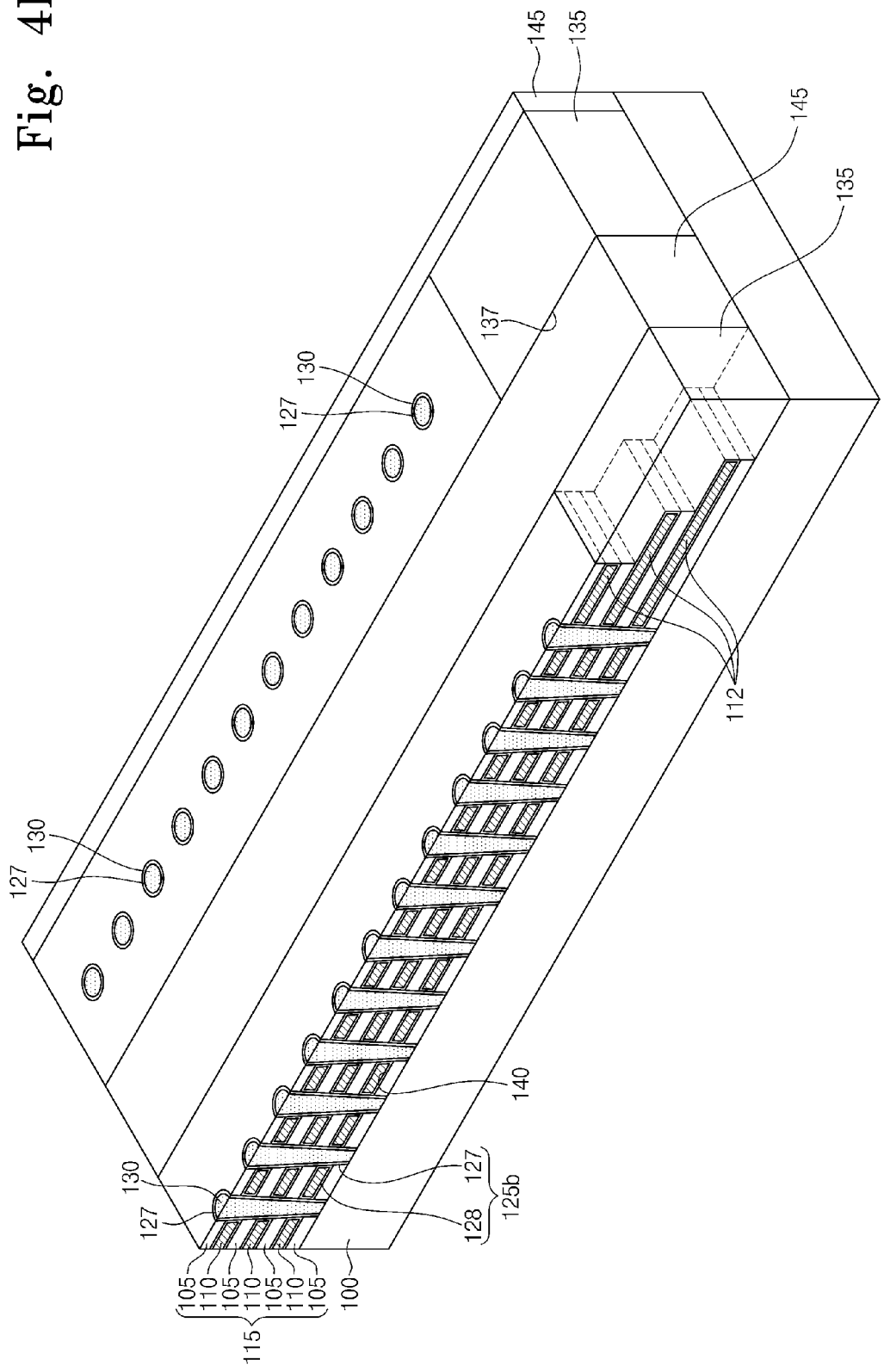

Referring to FIG. 4E, an isolation layer filling the groove 137 may be formed on the substrate having the gate patterns 110. The isolation layer may be planarized to form an isolation pattern 145 remaining in the groove 137. As a consequence, the first stacked structure 115 and the first vertical active patterns 130 penetrating the first stacked structure 115, which are illustrated in FIGS. 1 and 2C, may be formed.

Subsequently, the same methods as described with reference to FIGS. 4A to 4E may be repeatedly performed to form the second to fourth stacked structures illustrated in FIG. 1.

In the fabrication method of the three dimensional semiconductor memory device illustrated in FIGS. 4A to 4E, according to an embodiment, the formation of the first sub layer 127 may be omitted, so that the empty regions 140 may expose the sidewalls of the first vertical active patterns 130. A data storing layer 125a may be conformably formed on the substrate after formation of the empty regions 140 and before formation of the gate conductive layer, as disclosed in FIG. 2B. As a consequence, the three dimensional semiconductor memory device described with reference to FIG. 2B may be realized.

Now, a method of fabricating the three dimensional semiconductor memory device illustrated in FIG. 2D will be described with reference to the drawings.

Figure 5A:
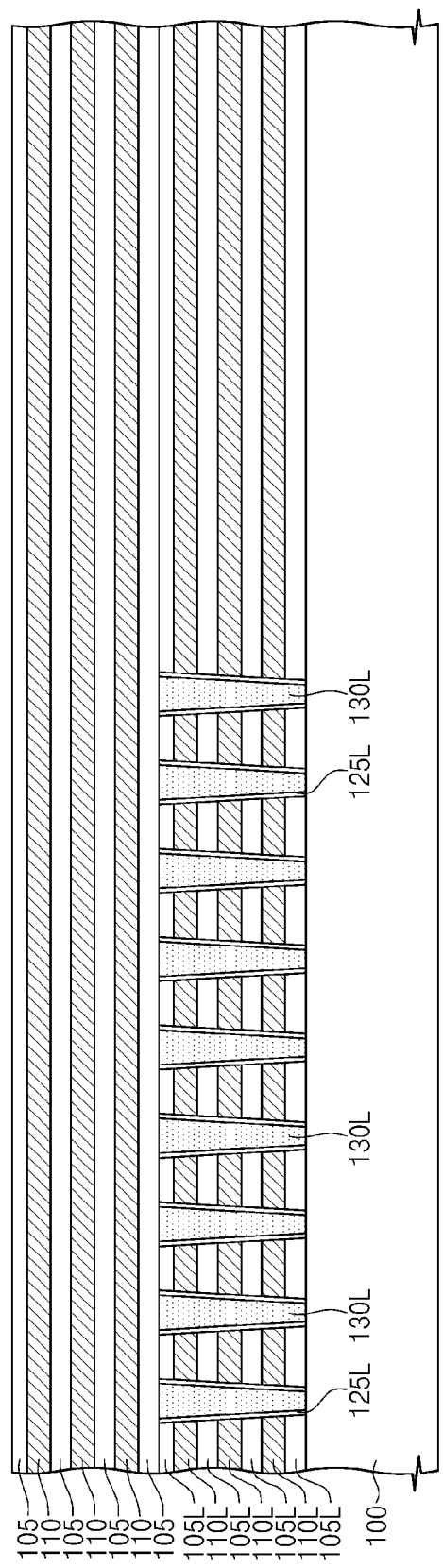
FIGS. 5A to 5C are cross sectional views illustrating a method of fabricating a three dimensional semiconductor memory device according to an exemplary embodiment of the inventive concept.
Figure 5B:
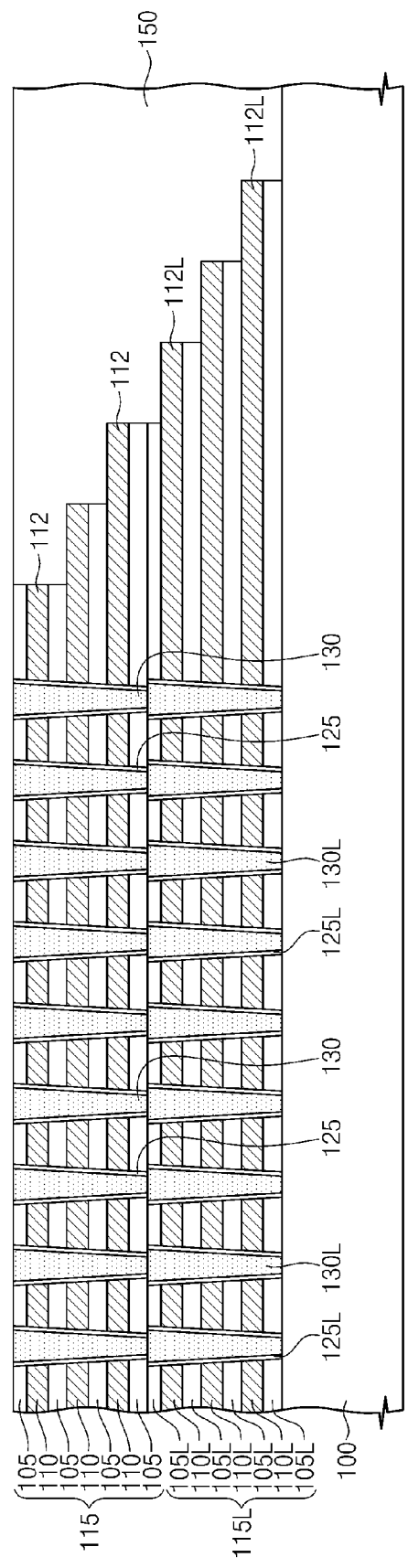
Figure 5C:
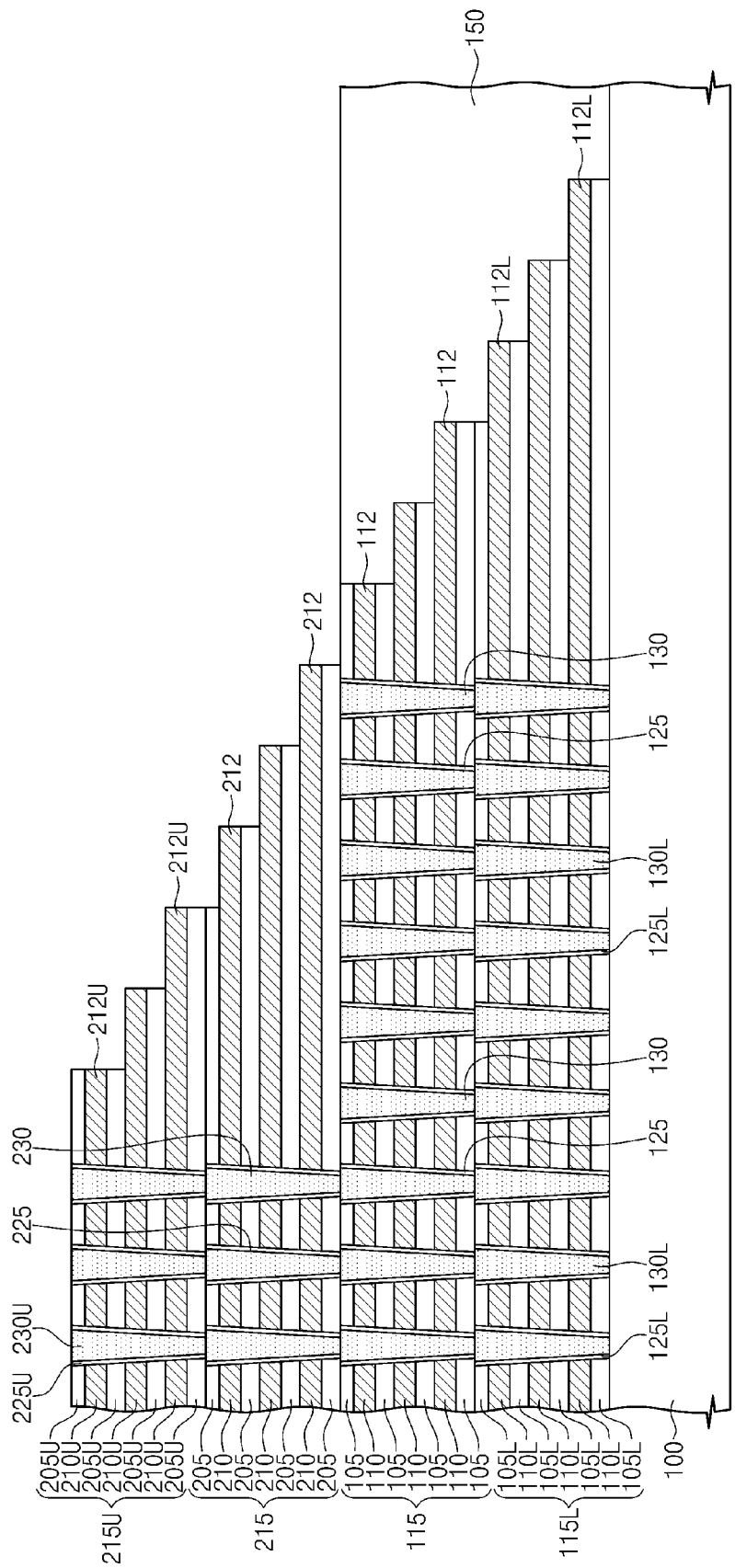

FIGS. 5A to 5C are cross sectional views illustrating a method of fabricating a three dimensional semiconductor memory device according to a modified exemplary embodiment of the inventive concept.

Referring to FIG. 5A, lower insulating layers 105L and lower gate layers 110L may be alternately and repeatedly formed on a substrate 100. A plurality of lower channel holes may be formed to penetrate the lower insulating layers 105L and the lower gate layers 110L, and a lower data storing layer 125L may be formed on each of sidewalls of the lower channel holes. A plurality of lower vertical active patterns 130L may be then formed in the lower channel holes, respectively.

Subsequently, first insulating layers 105 and first gate layers 110 may be alternately and repeatedly formed on an uppermost lower insulating layer 105L of the lower insulating layers 105L and on the lower vertical active patterns 130L.

Referring to FIG. 5B, a plurality of first channel holes may be formed to penetrate the first insulating layers 105 and the first gate layers 110. The first channel holes may expose the lower vertical active patterns 130L, respectively. According to the present modified embodiment, the number of the first channel holes may be equal to the number of the lower channel holes. A first data storing layer 125 may be formed on each of sidewalls of the first channel holes. A plurality of first vertical active patterns 130 may be then formed in the first channel holes, respectively.

Subsequently, the first insulating layers 105, the first gate layers 110, the lower insulating layers 105L, and the lower gate layers 110L may be patterned to form pad portions 112 and 112L constituting a step structure. As a consequence, a lower stacked structure 115L and a first stacked structure 115, which are sequentially stacked, may be formed. A first dielectric layer may be formed on an entire surface of the substrate having the pad portions 112 and 112L. The first dielectric layer may be planarized until top surfaces of the first vertical active patterns 130 are exposed, thereby forming a first planarized dielectric layer 150. The first planarized dielectric layer 150 may cover the pad portions 112L of the lower gate patterns 110L and the pad portions 112 of the first gate patterns 110.

Referring to FIG. 5C, the method of forming the lower stacked structure 110L and the first stacked structure 110 may be applied to the substrate having the first planarized dielectric layer 150, thereby sequentially forming a second stacked structure 215 and an upper stacked structure 215U. The number of the channel holes of the second stacked structure 215 and the upper stacked structure 215U may be different from the number of the channel holes of the first stacked structure 115 and the lower stacked structure 115U. This embodiment will be described in more detail hereinafter.

Second insulating layers 205 and second gate layers 210 may be alternately and repeatedly formed on the substrate having the first planarized dielectric layer 150, and second channel holes penetrating the second insulating layers 205 and the second gate layers 210 may be formed. A second data storing layer 225 may be formed on each of sidewalls of the second channel holes, and second vertical active patterns 230 may be formed in the second channel holes, respectively. The number of the second channel holes may be different from the number of the first channel holes. As a result, the first vertical active patterns 130 may include a first group of the first vertical active patterns 130 which are respectively connected to the second vertical active patterns 230 and a second group of first vertical active patterns 130 which are not connected to the second vertical active patterns 230. The number of the second group of the first vertical active patterns 130 may be one or more. For example, the number of the non-connected first vertical active patterns 130 may be one or more.

Upper insulating layers 205U and upper gate layers 210U may be alternately and repeatedly formed on the substrate having the second vertical active patterns 230. A plurality of upper channel holes penetrating the upper insulating layers 205U and the upper gate layers 210U may be then formed, and an upper data storing layer 225U may be formed on each of sidewalls of the upper channel holes. Upper vertical active patterns 230U may be formed in the upper channel holes surrounded by the upper data storing layers 225U, respectively.

The upper insulating layers 205U, the upper gate layers 210U, the second insulating layers 205, and the second gate layers 210 may be patterned to form pad portions 212 and 212U constituting a step structure. As a consequence, a second stacked structure 215 and an upper stacked structure 215U, which are sequentially stacked, may be formed.

A second dielectric layer may be formed on an entire surface of the substrate having the upper stacked structure 215U. The second dielectric layer may be planarized until the top surfaces of the upper vertical active patterns 230U are exposed, thereby forming a second planarized dielectric layer 250 illustrated in FIG. 2D. As a consequence, the three dimensional semiconductor memory device disclosed in FIG. 2D may be realized.

Figure 6:
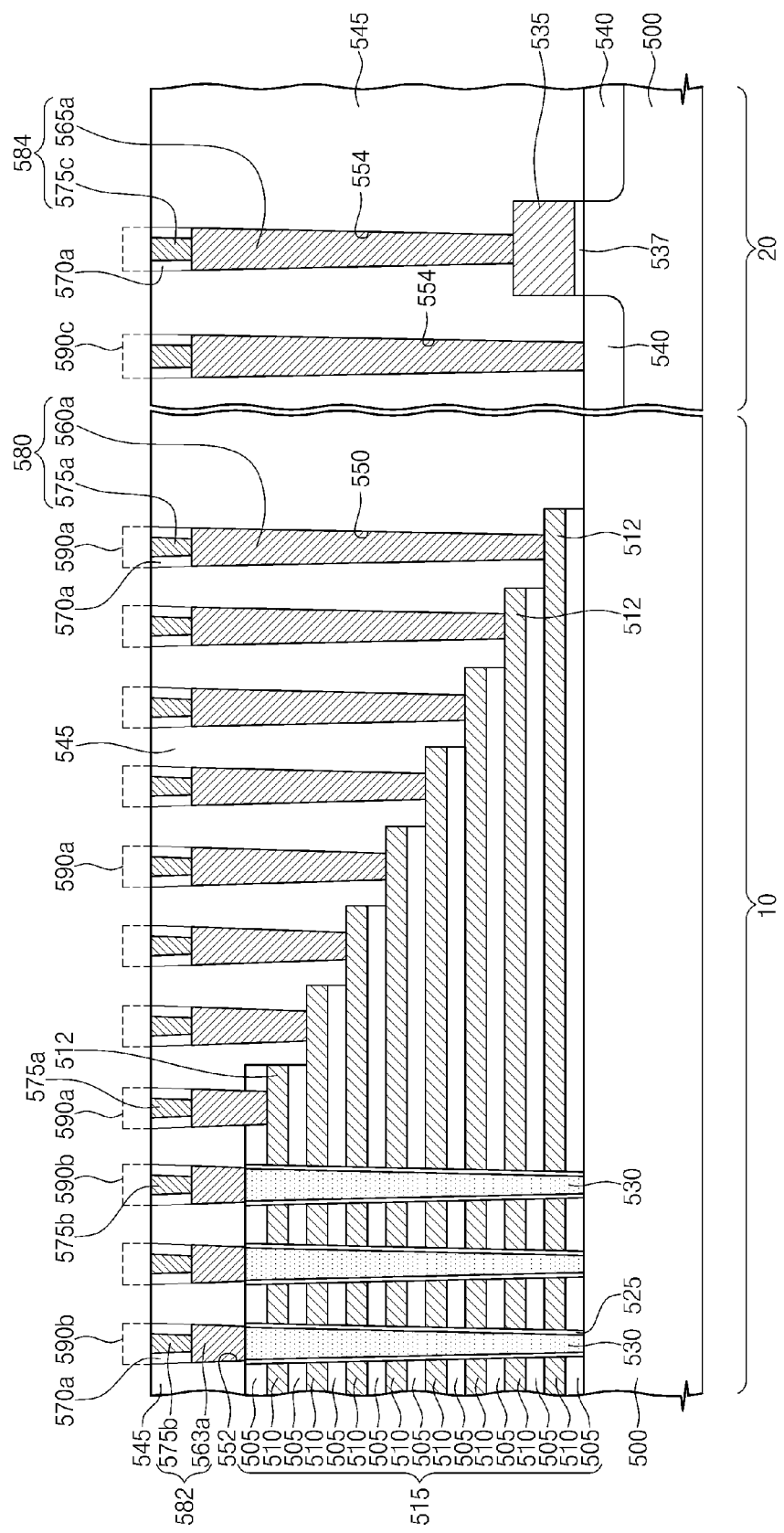
FIG. 6 is a cross sectional view illustrating a three dimensional semiconductor memory device according to an exemplary embodiment of the inventive concept.

FIG. 6 is a cross sectional view illustrating a three dimensional semiconductor memory device according to an exemplary embodiment of the inventive concept.

Referring to FIG. 6, a substrate 500 including a cell region 10 and a peripheral circuit region 20 may be provided. A stacked structure 515 may be disposed on the substrate 500 of the cell region 10. The stacked structure 515 may include insulating patterns 505 and gate patterns 510 which are alternately and repeatedly stacked. A plurality of vertical active patterns 530 may penetrate the stacked structure 515. The vertical active patterns 530 may be connected to the substrate 500. A data storing layer 525 may be disposed between each of sidewalls of the vertical active patterns 530 and the gate patterns 510 adjacent to the vertical active pattern 530. The stacked gate patterns 510 may have pad portions 512 constituting a step structure. The pad portions 512 may be disposed at a side of the vertical active patterns 530. The substrate 500 may include the same material as the substrate 100 illustrated in FIG. 1. The insulating patterns 505, the gate patterns 510, the vertical active patterns 530, and the data storing layers 525 may be formed of the same materials as the first insulating patterns 105, the first gate patterns 110, the first vertical active patterns 130, and the first data storing layers 125 of FIG. 1, respectively. Each of the vertical active patterns 530 may be configured to have the same shape as the vertical active pattern 130a of FIG. 2A. Each of the data storing layers 525 may also be configured to have the same shape as the data storing layers 125a of FIG. 2B or the data storing layers 125b of FIG. 2C.

A peripheral gate 535 may be disposed on the substrate 500 of the peripheral circuit region 20. A peripheral gate dielectric layer 537 may be disposed between the peripheral gate 535 and the substrate 500. Peripheral source/drain regions 540 may be disposed in the substrate 500 at two opposite sides of the peripheral gate 535. The peripheral gate 535 may include at least one of a doped semiconductor layer (e.g., a doped silicon layer), a conductive metal nitride layer (e.g., a titanium nitride layer or a tantalum nitride layer), a metal layer (e.g., a tungsten layer or an aluminum layer), a transition metal layer (e.g., a titanium layer or a tantalum layer), and a metal-semiconductor compound layer (e.g., a metal silicide layer). The peripheral gate dielectric layer 537 may include an oxide layer, a nitride layer, an oxynitride layer, and/or a high-k dielectric layer.

An interlayer dielectric layer 545 may be disposed on an entire surface of the substrate having the stacked structure 515, the vertical active patterns 530, the peripheral gate 535, and the peripheral source/drain regions 540. For example, the interlayer dielectric layer 545 may cover a peripheral transistor including the peripheral gate 535 and the peripheral source/drain regions 540. A top surface of the interlayer dielectric layer 545 may be higher than a top surface of the stacked structure 515. The interlayer dielectric layer 545 may have a single-layered material or a multi-layered material. For example, according to an embodiment, the interlayer dielectric layer 545 may include an oxide layer, a nitride layer, and/or an oxynitride layer.

A plurality of first contact structures 580 may penetrate the interlayer dielectric layer 545 in the cell region 10 and may be respectively connected to the pad portions 512. A plurality of second contact structures 582 may penetrate the interlayer dielectric layer 545 in the cell region 10 and may be respectively connected to the vertical active patterns 530. A plurality of third contact structures 584 may penetrate the interlayer dielectric layer 545 in the peripheral circuit region 20 and may be respectively connected to the peripheral gate 535 and the peripheral source/drain regions 540.

Heights of the first contact structures 580 may be different from each other since the pad portions 512 constitute the step structure. For example, according to an embodiment, as a position of the pad portion 512 becomes lower, the height of the corresponding first contact structure 580 may increase.

The first contact structures 580 may be disposed in first contact holes 550 penetrating the interlayer dielectric layer 545, respectively. Each of the first contact structures 580 may include a first contact portion 560a and a second contact portion 575a which are sequentially stacked in each of the first contact holes 550. A width of a top surface of the second contact portion 575a may be less than a width of a top surface of the first contact portion 560a. Further, a width of a bottom surface of the second contact portion 575a may also be less than a width of the top surface of the first contact portion 560a. The top surfaces of the first contact portions 560a may be positioned at a lower level than the top surface of the interlayer dielectric layer 545. Top surfaces of the second contact portions 575a may be located at the same or substantially the same level as the top surface of the interlayer dielectric layer 545. An insulating spacer 570a may be disposed between an upper sidewall of each of the first contact holes 550 and the second contact portion 575a in the first contact hole 550. The insulating spacers 570a may be disposed on edges of the top surfaces of the first contact portions 560a, respectively. Moreover, the second contact portions 575a may be disposed on central portions of the top surfaces of the first contact portions 560a, respectively.

Each of the insulating spacers 570a may include an oxide layer, a nitride layer, and/or an oxynitride layer. Each of the first contact portions 560a may include at least one of a doped semiconductor layer (e.g., a doped silicon layer), a metal layer (e.g., a tungsten layer, an aluminum layer or a copper layer), a transition metal layer (e.g., a titanium layer or a tantalum layer), a conductive metal nitride layer (e.g., a titanium nitride layer or a tantalum nitride layer), and a metal-semiconductor compound layer (e.g., a metal silicide layer). Each of the second contact portions 575a may include at least one of a doped semiconductor layer (e.g., a doped silicon layer), a metal layer (e.g., a tungsten layer, an aluminum layer or a copper layer), a transition metal layer (e.g., a titanium layer or a tantalum layer), a conductive metal nitride layer (e.g., a titanium nitride layer or a tantalum nitride layer), and a metal-semiconductor compound layer (e.g., a metal silicide layer). The second contact portions 575a may be formed of the same material as the first contact portions 560a. Alternatively, the second contact portions 575a may include a different material from the first contact portions 560a.

According to an embodiment, each of the first contact portions 560a may have a pillar-shaped structure. Each of the second contact portions 575a may also have a pillar-shaped structure.

The second contact structures 582 may be disposed in second contact holes 552 penetrating the interlayer dielectric layer 545, respectively. Each of the second contact structures 582 may include a first contact portion 563a and a second contact portion 575b which are sequentially stacked in each of the second contact holes 552. A width of a top surface of the second contact portion 575b of each of the second contact structures 582 may be less than a width of a top surface of the first contact portion 563a. The insulating spacer 570a may be disposed between an upper sidewall of each of the second contact holes 552 and the second contact portion 575b in the second contact hole 552. The first contact portions 563a and the second contact portions 575b of the second contact structures 582 may be formed of the same materials as the first contact portions 560a and the second contact portions 575a of the first contact structures 580, respectively. According to an embodiment, the top surfaces of the second contact portions 575b of the second contact structures 582 may be located at the same or substantially the same level as the top surfaces of the second contact portions 575a of the first contact structures 580. However, the embodiments of the inventive concept are not limited thereto.

The third contact structures 584 may be disposed in third contact holes 554 penetrating the interlayer dielectric layer 545 in the peripheral circuit region 20, respectively. Each of the third contact structures 584 may include a first contact portion 565a and a second contact portion 575c which are sequentially stacked in the respective third contact holes 554. A width of a top surface of the second contact portion 575c of each of the third contact structures 584 may be less than a width of a top surface of the first contact portion 565a. The insulating spacer 570a may be disposed between an upper sidewall of each of the third contact holes 554 and the second contact portion 575c in the third contact hole 554. The first contact portions 565a and the second contact portions 575c of the third contact structures 584 may be formed of the same materials as the first contact portions 560a and the second contact portions 575a of the first contact structures 580, respectively. According to an embodiment, the top surfaces of the second contact portions 575c of the third contact structures 584 may be located at the same or substantially the same level as the top surfaces of the second contact portions 575a of the first contact structures 580.

First interconnections 590a and second interconnections 590b may be disposed on the interlayer dielectric layer 545 in the cell region 10. The first interconnections 590a may be connected to the second contact portions 575a of the first contact structures 580, respectively. The second interconnections 590b may be connected to the second contact portions 575b of the second contact structures 582, respectively. According to an embodiment, the second interconnections 590b may correspond to bit lines. Third interconnections 590c may be disposed on the interlayer dielectric layer 545 in the peripheral circuit region 20. The third interconnections 590c may be connected to the second contact portions 575c of the third contact structures 584, respectively. Each of the interconnections 590a, 590b, and 590c may include at least one of a metal layer (e.g., a tungsten layer, an aluminum layer or a copper layer), a transition metal layer (e.g., a titanium layer or a tantalum layer), and a conductive metal nitride layer (e.g., a titanium nitride layer or a tantalum nitride layer).

According to the three dimensional semiconductor memory device set forth above, each of the first contact structures 580 may include a first contact portion 560a and a second contact portion 575a which are sequentially stacked in each of the first contact holes 550. The width of the top surface of the second contact portion 575a may be less than the width of the top surface of the first contact portion 560a. Thus, a pitch size of the first interconnections 590a, which are connected to the second contact portions 575a, may be reduced. As a result, a layout scheme of the three dimensional semiconductor memory device may be optimized to increase the integration density of the three dimensional semiconductor memory device. Further, in the event that the second contact portions 575a are formed using the insulating spacers 570a, the second contact portions 575a may be self-aligned with the first contact portions 560a. Thus, there is no need to use a mask aligner, such as a stepper to adjust and/or minimize a misalignment between the first and second contact portions 560a and 575a. As a result, a process margin may be improved, and a high reliable three dimensional semiconductor memory device may be realized.

Now, modified embodiments of the three dimensional semiconductor memory device according to the embodiment of the inventive concept will be described hereinafter with reference to the drawings.

Figure 7A:
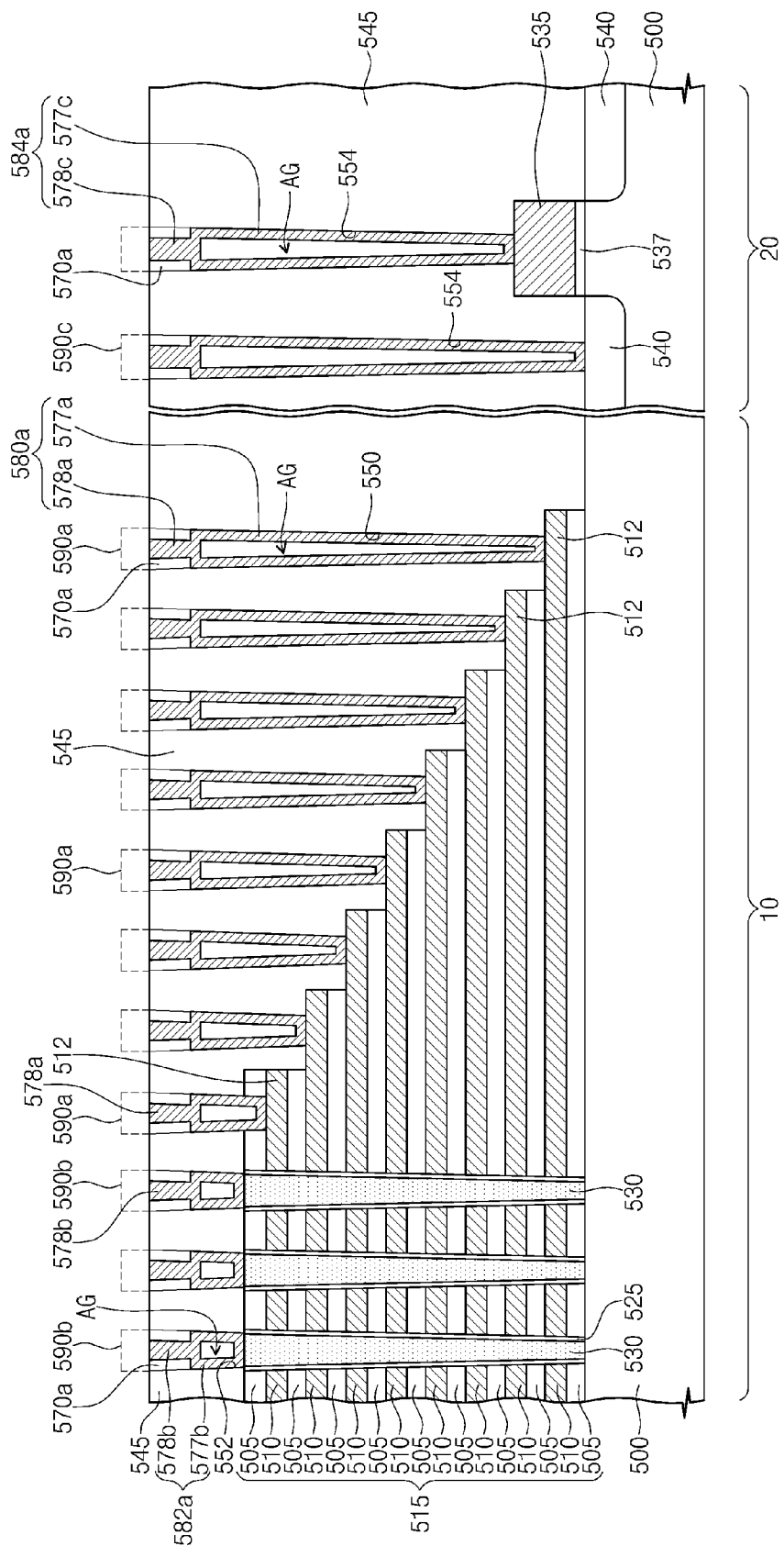
FIG. 7A is a cross sectional view illustrating a three dimensional semiconductor memory device according to an exemplary embodiment of the inventive concept.

FIG. 7A is a cross sectional view illustrating a three dimensional semiconductor memory device according to a modified exemplary embodiment of the inventive concept.

Referring to FIG. 7A, a plurality of first contact structures 580a may penetrate the interlayer dielectric layer 545 and may be respectively connected to the pad portions 512 of the gate patterns 510. The first contact structures 580a may be disposed in the first contact holes 550 penetrating the interlayer dielectric layer 545, respectively. Each of the first contact structures 580a may include a first contact portion 577a and a second contact portion 578a which are sequentially stacked. A width of a top surface of each of the second contact portions 578a may be less than a width of a top surface of each of the first contact portions 577a, and the insulating spacer 570a may be disposed between an upper sidewall of each of the first contact holes 550 and the second contact portion 578a. According to an embodiment, an air gap AG may exist inside each of the first contact portions 577a. The second contact portions 578a may be formed of the same material as the first contact portions 577a. The first and second contact portions 577a and 578a may be formed of the same material as the second contact portions 575a illustrated in FIG. 6.

Similarly, a plurality of second contact structures 582a may penetrate the interlayer dielectric layer 545 and may be respectively connected to the vertical active patterns 530. Each of the second contact structures 582a may include a first contact portion 577b and a second contact portion 578b which are sequentially stacked in each of the second contact holes 552 penetrating the interlayer dielectric layer 545. A width of a top surface of the second contact portion 578b of each of the second contact structures 582a may be less than a width of a top surface of the first contact portion 577b, and the insulating spacer 570a may be disposed between an upper sidewall of each of the second contact holes 552 and the second contact portion 578b. According to an embodiment, the air gap AG may also exist inside the first contact portion 577b of each of the second contact structures 582a.

A plurality of third contact structures 584a may penetrate the interlayer dielectric layer 545 in the peripheral circuit region 20 and may be respectively connected to the peripheral gate 535 and the peripheral source/drain regions 540. Each of the third contact structures 584a may include a first contact portion 577c and a second contact portion 578c which are sequentially stacked in each of the third contact holes 554 penetrating the interlayer dielectric layer 545. The air gap AG may also exist inside the first contact portion 577c of each of the third contact structures 584a. The contact portions 577b, 577c, 578b, and 578c of the second and third contact structures 582a and 584a may be formed of the same material as the contact portions 577a and 578a of the first contact structure 580a.

Figure 7B:
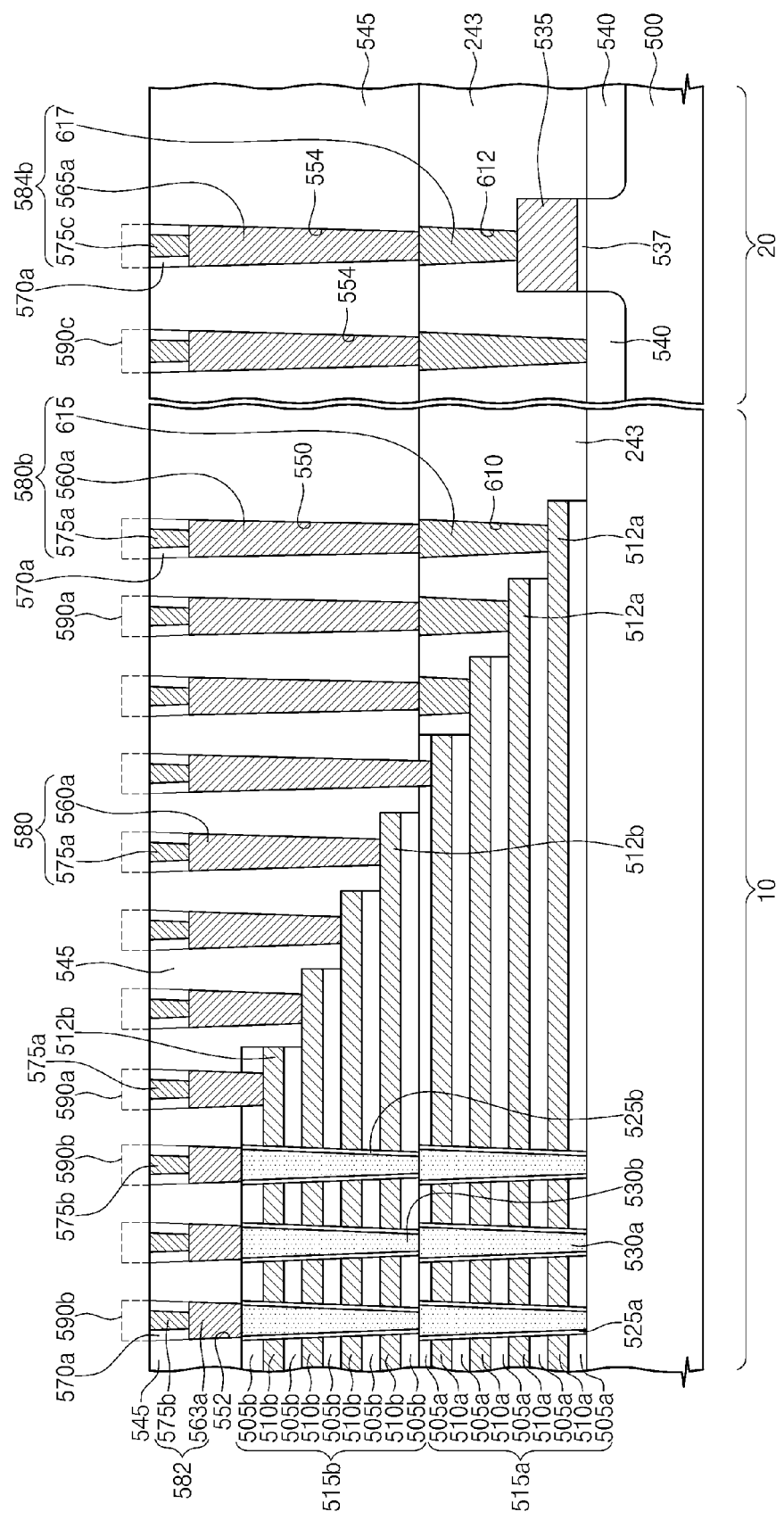
FIG. 7B is a cross sectional view illustrating a three dimensional semiconductor memory device according to an exemplary embodiment of the inventive concept.

FIG. 7B is a cross sectional view illustrating a three dimensional semiconductor memory device according to a modified exemplary embodiment of the inventive concept.

Referring to FIG. 7B, a first stacked structure 515a and a second stacked structure 515b may be sequentially stacked on the substrate 500 in the cell region 10. The first stacked structure 515a may include first insulating patterns 505a and first gate patterns 510a which are alternately and repeatedly stacked, and the second stacked structure 515b may include second insulating patterns 505b and second gate patterns 510b which are alternately and repeatedly stacked. A plurality of first vertical active patterns 530a may penetrate the first stacked structure 515a, and a plurality of second vertical active patterns 530b may penetrate the second stacked structure 515b. The second vertical active patterns 530b may be disposed on the first vertical active patterns 530a, respectively. The second vertical active patterns 530b may be connected to the first vertical active patterns 530a, respectively. A first data storing layer 525a may be disposed between a sidewall of each of the first vertical active patterns 530a and the first gate patterns 510a, and a second data storing layer 525b may be disposed between a sidewall of each of the second vertical active patterns 530b and the second gate patterns 510b. The first and second gate patterns 510a and 510b may include pad portions 512a and 512b, respectively. The pad portions 512a and 512b of the first and second gate patterns 510a and 510b may constitute a step structure. The aforementioned elements illustrated in FIG. 7B may be formed of the same materials as the corresponding elements illustrated in FIG. 6.

A lower planarized dielectric layer 243 may be disposed on the pad portions 512a of the first gate patterns 510a. Further, the lower planarized dielectric layer 243 may extend on the substrate to cover the peripheral gate 535 and the peripheral source/drain regions 540 which are disposed in the peripheral circuit region 20. A top surface of the lower planarized dielectric layer 243 may be located at the same or substantially the same level as top surfaces of the first vertical active patterns 530a. The interlayer dielectric layer 545 may be disposed on an entire surface of the substrate including the lower planarized dielectric layer 243, the second stacked structure 515b, and the second vertical active patterns 530b.

First contact structures 580b and 580 may be connected to the pad portions 512a of the first gate patterns 510a and the pad portions 512b of the second gate patterns 510b, respectively. Each of the first contact structures 580 connected to the pad portions 512b of the second gate patterns 510b may include a first contact portion 560a and a second contact portion 575a which are sequentially stacked in each of the first contact holes 550 penetrating the interlayer dielectric layer 545. The pad portions 512b of the second gate patterns 510b may be in direct contact with the first contact portions 560a of the first contact structure 580, respectively.

Alternatively, each of the first contact structures 580b connected to at least some of the pad portions 512a of the first gate patterns 510a may include a first lower contact plug 615, a first contact portion 560a, and a second contact portions 575a which are sequentially staked. The first lower contact plugs 615 may be respectively disposed in first lower holes 610 penetrating the lower planarized dielectric layer 243 and may be connected to the pad portions 512a of the first gate patterns 510a. The first and second contact portions 560a and 575a of each of the first contact structures 580b connected to the pad portions 512a of the first gate patterns 510a may be sequentially stacked in each first contact hole 550 penetrating the interlayer dielectric layer 545 and on each first lower contact plug 615. According to an embodiment, a bottom surface of the first contact portion 560a of the first contact structure 580b connected to the pad portion 512a of the first gate pattern 510a may have a width which is less than a width of a top surface of the first lower contact plug 615.

A plurality of third contact structures 584b may be connected to the peripheral gate 535 and the peripheral source/drain regions 540, respectively. Each of the third contact structures 584b may include a second lower contact plug 617, a first contact portion 565a, and a second contact portion 575c which are sequentially stacked. The second lower contact plug 617 may be disposed in a second lower hole 612 penetrating the lower planarized dielectric layer 243 in the peripheral circuit region 20. According to an embodiment, a width of a bottom surface of the first contact portion 565a of the third contact structure 584b may be less than a width of a top surface of the second lower contact plug 617.

According to an embodiment, the first contact portion 560a of the first contact structure 580 connected to the pad portion 512a of the uppermost first gate pattern 510a may be in direct contact with the pad portion 512a of the uppermost first gate pattern 510a. Each of the lower contact plugs 615 and 617 may include at least one of a doped semiconductor layer (e.g., a doped silicon layer), a conductive metal nitride layer (e.g., a titanium nitride layer or a tantalum nitride layer), a metal layer (e.g., a tungsten layer or an aluminum layer), a transition metal layer (e.g., a titanium layer or a tantalum layer), and a metal-semiconductor compound layer (e.g., a metal silicide layer).

Figure 7C:
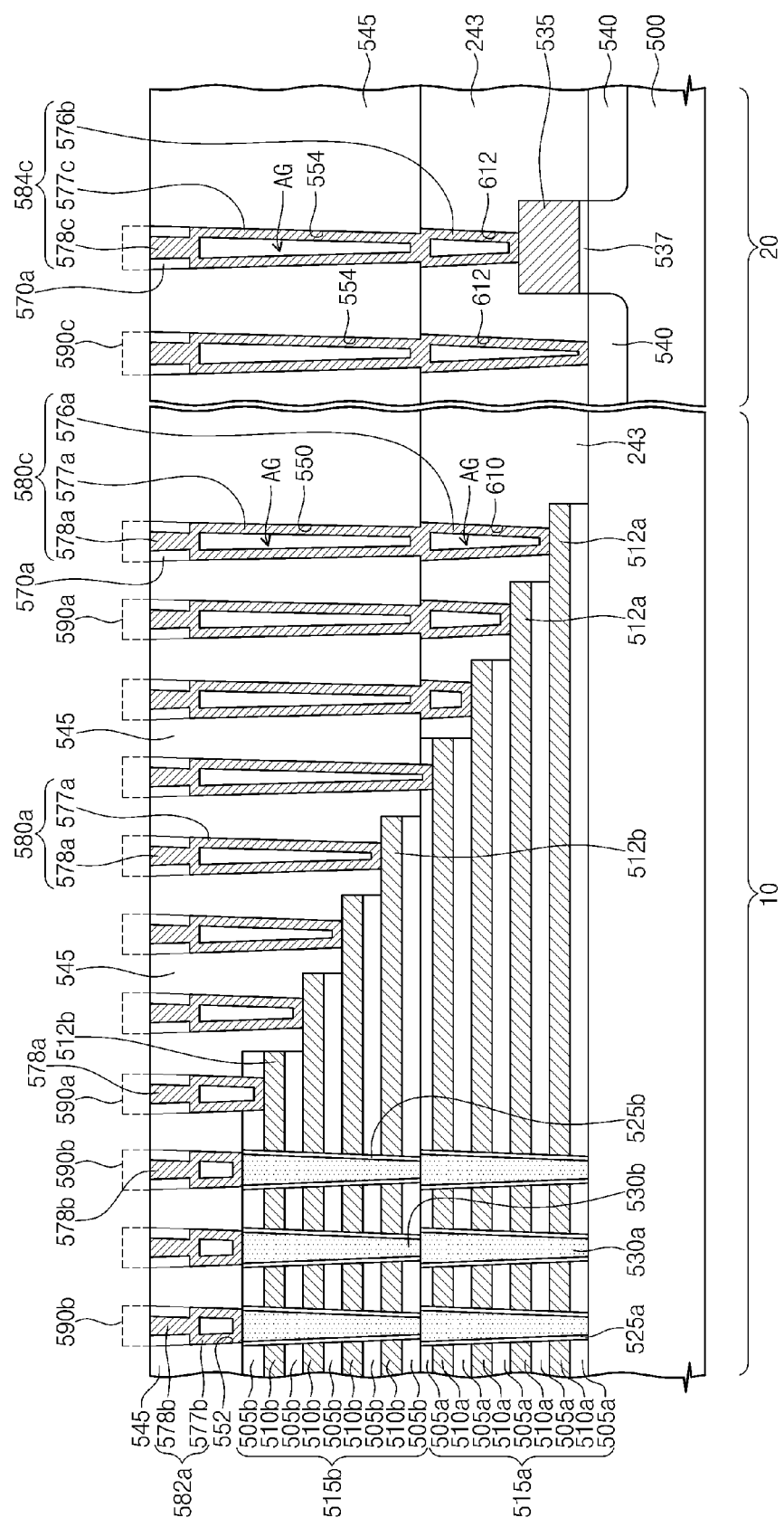
FIG. 7C is a cross sectional view illustrating a three dimensional semiconductor memory device according to an exemplary embodiment of the inventive concept.

FIG. 7C is a cross sectional view illustrating a three dimensional semiconductor memory device according to a modified exemplary embodiment of the inventive concept.

Referring to FIG. 7C, each of first contact structures 580c connected to at least some of the pad portions 512a of the first gate patterns 510a may include a first lower contact plug 576a, a first contact portion 577a, and a second contact portion 578a which are sequentially staked. The first lower contact plugs 576a may be respectively disposed in first lower holes 610 penetrating the lower planarized dielectric layer 243. According to an embodiment, a plurality of air gaps AG may be provided inside the first lower contact plugs 576a and the first contact portions 577a of the first contact structures 580c, respectively. The first lower contact plugs 576a, the first contact portions 577a, and the second contact portions 578a may be formed of the same material.

Similarly, each of third contact structures 584c in the peripheral circuit region 20 may include a second lower contact plug 576b, a first contact portion 577c, and a second contact portion 578c which are sequentially staked. The second lower contact plug 576b may be disposed in the second lower hole 612 penetrating the lower planarized dielectric layer 243 in the peripheral circuit region 20. A plurality of air gaps AG may be provided inside the second lower contact plugs 576b and the first contact portions 577c of the third contact structures 584c, respectively. The second lower contact plugs 576b may be formed of the same material as the first and second contact portions 577c and 578c.

Figure 7D:
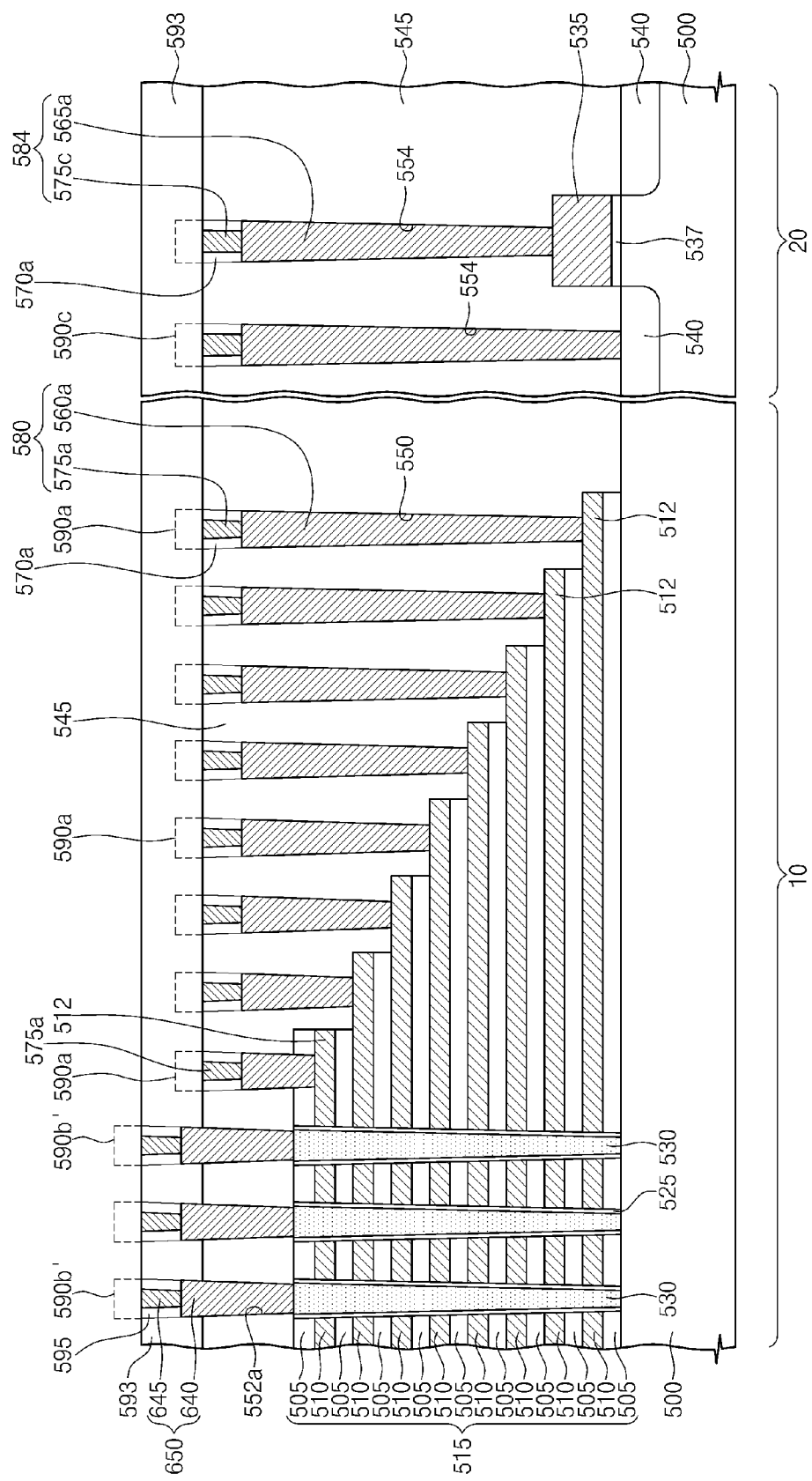
FIG. 7D is a cross sectional view illustrating a three dimensional semiconductor memory device according to an exemplary embodiment of the inventive concept.

FIG. 7D is a cross sectional view illustrating a three dimensional semiconductor memory device according to a modified exemplary embodiment of the inventive concept.

Referring to FIG. 7D, second interconnections 590b' electrically connected to upper portions of the vertical active patterns 530 may be disposed at a different level from the first interconnections 590a connected to the pad portions 512. For example, according to an embodiment, an upper dielectric layer 593 may be disposed on the interlayer dielectric layer 545 and the first and third interconnections 590a and 590c. Second contact structures 650 connected to the second interconnections 590b' may be respectively disposed in second contact holes 552a penetrating the upper dielectric layer 593 and the interlayer dielectric layer 545 in the cell region 10, and the second contact structures 650 may be respectively connected to the vertical active patterns 530.

Each of the second contact structures 650 may include a first contact portion 640 and a second contact portion 645 which are sequentially stacked in each of the second contact holes 552a. A width of a top surface of the second contact portion 645 may be less than a width of a top surface of the first contact portion 640. An insulating spacer 595 may be disposed between an upper sidewall of the second contact hole 552a and the second contact portion 645 in the second contact hole 552a. Top surfaces of the second contact portions 645 may be disposed at the same or substantially the same level as a top surface of the upper dielectric layer 593. The second interconnections 590b' may be disposed on the upper dielectric layer 593 and may be respectively connected to the second contact portions 645 of the second contact structures 650.

According to the above modified embodiment, the second interconnections 590b' may be located at a higher level than the first interconnections 590a. However, the embodiments of the present inventive concept are not limited to the positions of the first and second interconnections 590a and 590b'. For example, according to an embodiment, the first interconnections 590a may be located at a higher level than the second interconnections 590b'.

The embodiments of the inventive concept described above in connection with FIGS. 6 to 7D may be applied to the embodiments described with reference to FIGS. 1 to 5. This will be described in further detail with reference to the drawings in the following modified embodiments.

Figure 7E:
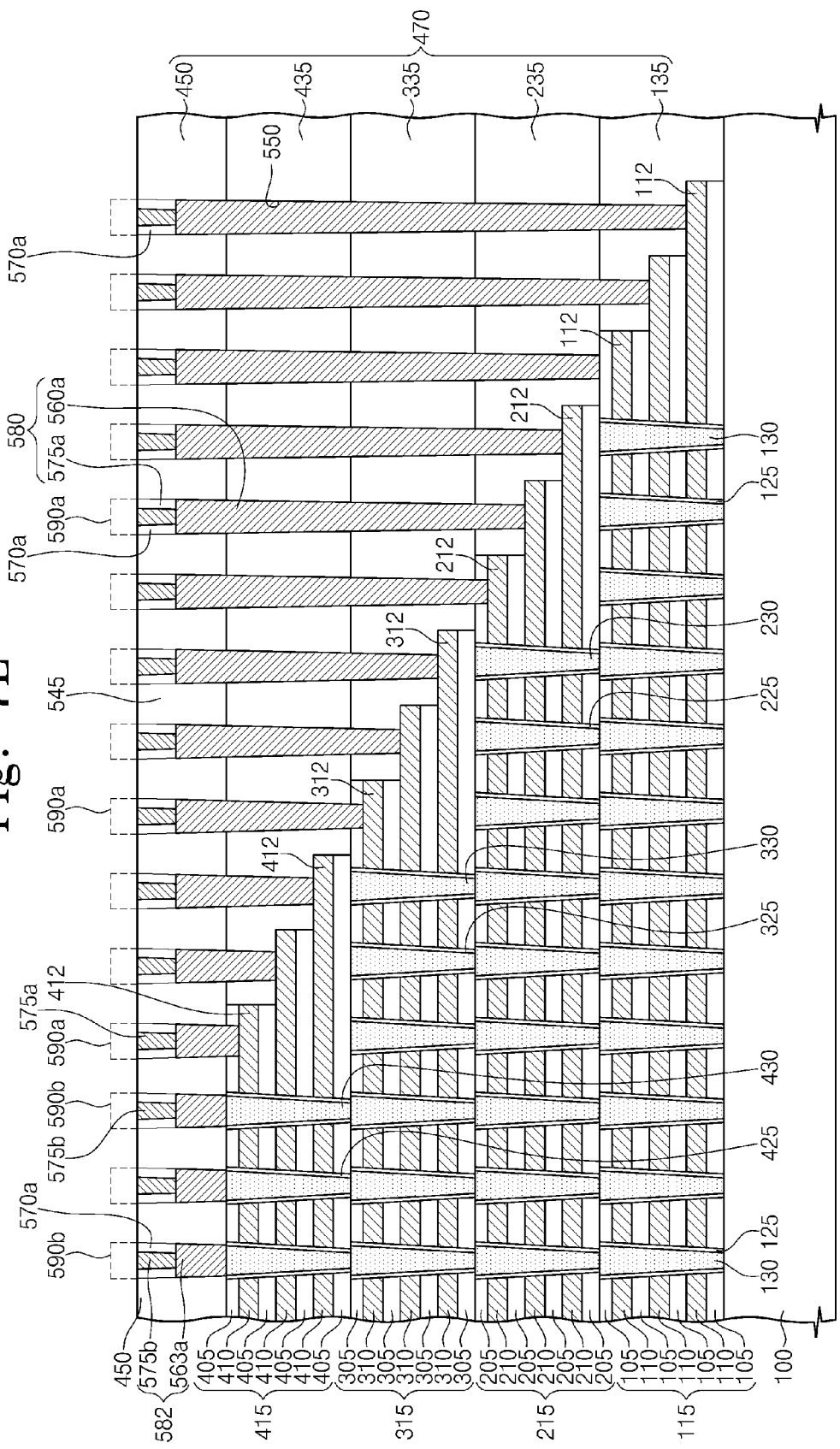
FIG. 7E is a cross sectional view illustrating a three dimensional semiconductor memory device according to an exemplary embodiment of the inventive concept.

FIG. 7E is a cross sectional view illustrating a three dimensional semiconductor memory device according to a modified exemplary embodiment of the inventive concept.

Referring to FIG. 7E, an upper dielectric layer 450 may be disposed on the fourth stacked structure 415 and the fourth planarized dielectric layer 435. The first to fourth planarized dielectric layers 135, 235, 335 and 435 and the upper dielectric layer 450 may constitute an interlayer dielectric layer 470.

First contact structures 580 may penetrate the interlayer dielectric layer 470 and may be respectively connected to the pad portions 112, 212, 312, and 412 of the gate patterns 110, 210, 310, and 410. The first contact structures 580 may be disposed in first contact holes 550 penetrating the interlayer dielectric layer 470, respectively. Each of the first contact structures 580 may include a first contact portion 560a and a second contact portion 575a which are sequentially stacked in each first contact hole 550. As illustrated in FIG. 6, a width of a top surface of the second contact portion 575a may be less than a width of a top surface of the first contact portion 560a. An insulating spacer 570a may be disposed between an upper sidewall of the first contact hole 550 and the second contact portion 575a in the first contact hole 550.

Second contact structures 582 may penetrate the interlayer dielectric layer 470. The second contact structures 582 may be disposed on the fourth vertical active patterns 430, respectively. Further, the second contact structures 582 may be connected to the fourth vertical active patterns 430, respectively. Each of the second contact structures 582 may have the same shape as described with reference to FIG. 6. The first interconnections 590a connected to the first contact structures 580 and the second interconnections 590b connected to the second contact structures 582 may be disposed on the interlayer dielectric layer 470.

According to embodiments, the first contact structures 580 may be replaced with the first contact structures 580a, 580b, or 580c illustrated in FIG. 7A, 7B, or 7C. The second contact structures 582 may be configured to have the same shape as described with reference to FIG. 7D.

Figure 8A:
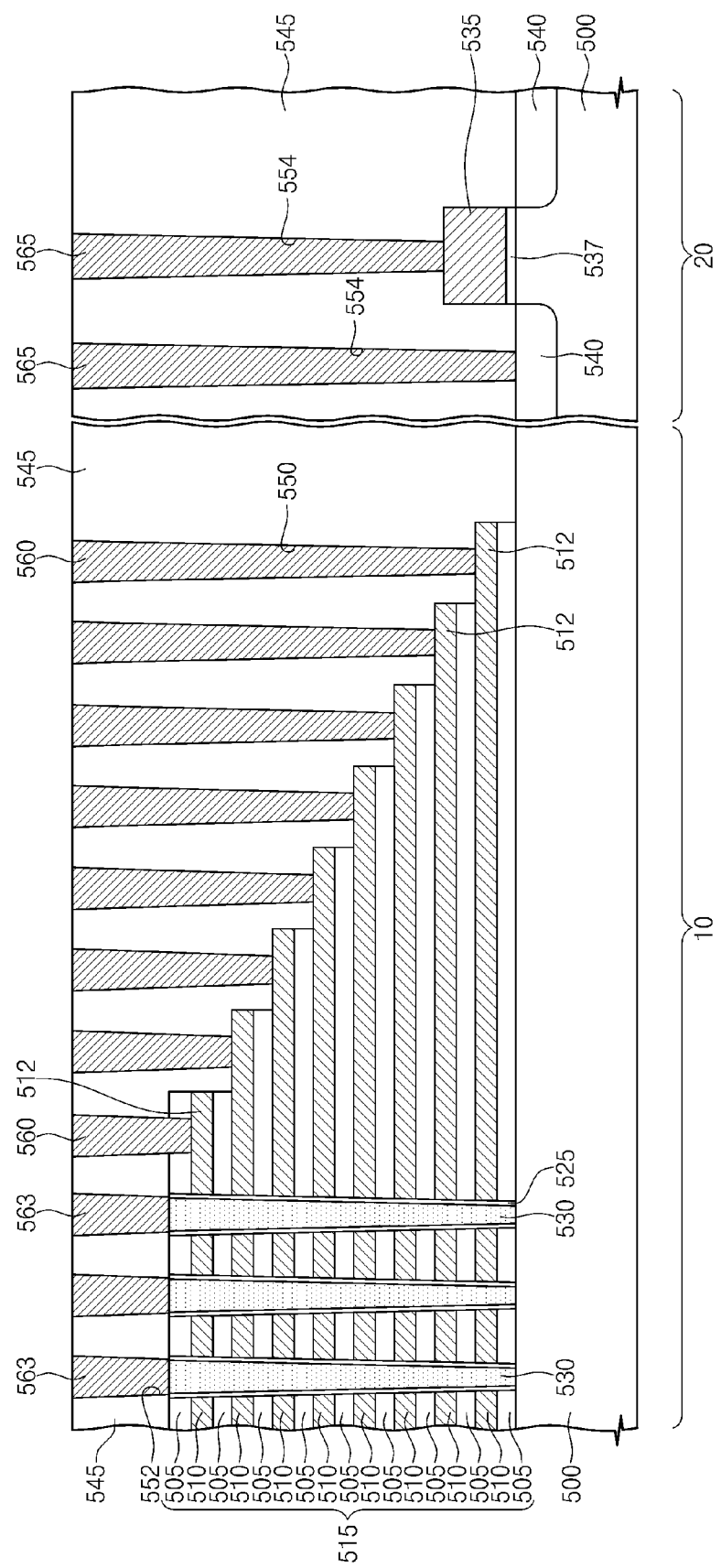
Figure 8C:
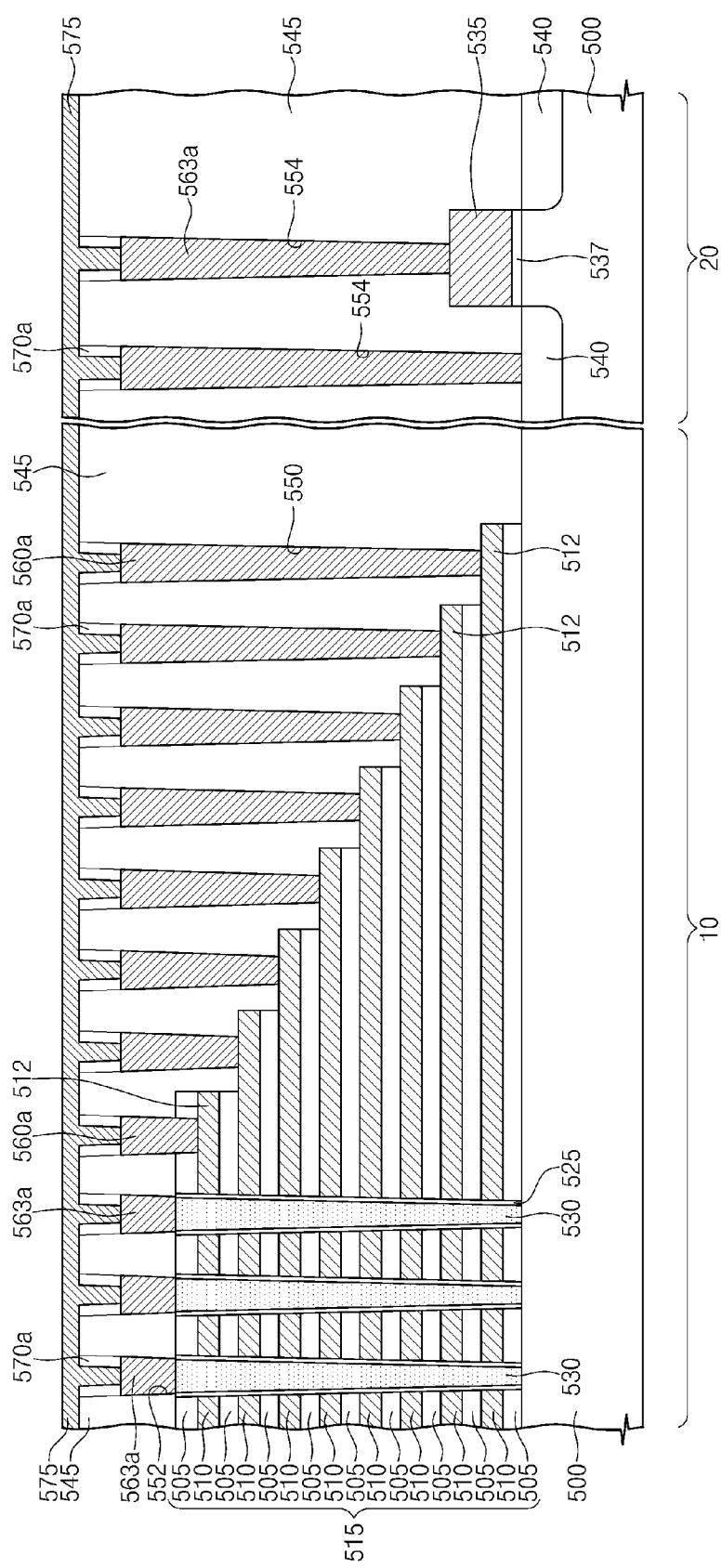

FIGS. 8A to 8C are cross sectional views illustrating a method of fabricating a three dimensional semiconductor memory device according to an exemplary embodiment of the inventive concept.

Referring to FIG. 8A, a substrate 500 having a cell region 10 and a peripheral circuit region 20 may be provided. A stacked structure 515 may be formed on the substrate 500 in the cell region 10. The stacked structure 515 may include insulating patterns 505 and gate patterns 510 which are alternately and repeatedly stacked. A plurality of vertical active patterns 530 penetrating the stacked structure 515 may be formed. A data storing layer 525 may be formed between the vertical active pattern 530 and the gate patterns 510 adjacent to the vertical active pattern 530. The gate patterns 510 may be formed to have pad portions 512 constituting a step structure. According to an embodiment, the pad portions 512 having a step structure may be formed after formation of the vertical active patterns 530. However, the embodiments of the inventive concept are not limited to the above process sequence to form the pad portions 512 and the vertical active patterns 530.

A peripheral gate dielectric layer 537 and a peripheral gate 535 may be formed on the substrate 500 in the peripheral region 20, and peripheral source/drain regions 540 may be formed in the substrate 500 at two opposite sides of the peripheral gate 535.

Subsequently, an interlayer dielectric layer 545 may be formed on an entire surface of the substrate having the peripheral source/drain regions 540. First, second, and third contact holes 550, 552, and 554 may be formed to penetrate the interlayer dielectric layer 545. The first contact holes 550 may expose the pad portions 512, respectively. The second contact holes 552 may expose the vertical active patterns 530, respectively. The third contact holes 554 may expose the peripheral gate 535 and the peripheral source/drain regions 540, respectively.

A first conductive layer filling the contact holes 550, 552, and 554 may be formed on the substrate having the contact holes 550, 552, and 554. The first conductive layer may be planarized until the interlayer dielectric layer 545 is exposed, thereby forming first contact plugs 560 in the first contact holes 550, second contact plugs 563 in the second contact holes 552, and third contact plugs 565 in the third contact holes 554.

Referring to FIG. 8B, the first, second, and third contact plugs 560, 563, and 565 may be etched back to form recessed first contact plugs 560a, recessed second contact plugs 563a, and recessed third contact plugs 565a. As a result, top surfaces of the recessed contact plugs 560a, 563a, and 565a may be located at a lower level than a top surface of the interlayer dielectric layer 545. As a consequence, the contact holes 550, 552, and 554 may be partially filled with the recessed contact plugs 560a, 563a, and 565a. Thus, an upper portion of each of the contact holes 550, 552, and 554 may remain empty after formation of the recessed contact plugs 560a, 563a, and 565a.

A spacer layer 570 may be conformably formed on an entire surface of the substrate having the recessed contact plugs 560a, 563a, and 565a. The spacer layer 570 may be formed of an oxide layer, a nitride layer, and/or an oxynitride layer.

Referring to FIG. 8C, the spacer layer 570 may be anisotropically etched back until the recessed contact plugs 560a, 563a, and 565a are exposed. As a result, insulating spacers 570a may be formed on upper sidewalls of the contact holes 550, 552, and 554 on the recessed contact plugs 560a, 563a, and 565a, respectively.

A second conductive layer 575 filling the contact holes 550, 552, and 554 may be formed on the substrate having the spacers 570a. The second conductive layer 575 may be in contact with the recessed contact plugs 560a, 563a, and 565a which are exposed after formation of the spacers 570a.

The second conductive layer 575 may be planarized until the interlayer dielectric layer 545 is exposed, thereby forming first, second and third contact structures 580, 582, and 584 illustrated in FIG. 6. Subsequently, first, second, and third interconnections 590a, 590b, and 590c of FIG. 6 may be formed to realize the three dimensional semiconductor memory device illustrated in FIG. 6.

According to the method of fabricating a three dimensional semiconductor memory device set forth above, the second contact portions 575a, 575b, and 575c each having a top surface whose width is relatively narrow may be respectively formed in upper portions of the contact holes 550, 552, and 554 on the first contact portions 560a, 563a, and 565a, respectively, using the insulating spacers 570a. For example, the second contact portions 575a, 575b, and 575c may be self-aligned with the first contact portions 560a, 563a, and 565a, respectively. Thus, the number of photolithography process steps may be reduced. Therefore, the first and second contact portions 560a, 563a, 565a 575a, 575b, and 575c may be free from misalignment. As a result, the fabrication method may be simplified to improve the throughput of the three dimensional semiconductor memory device. Further, a high reliable and highly integrated three dimensional semiconductor memory device may be realized.

Now, a method of fabricating the three dimensional semiconductor memory device disclosed in FIG. 7A will be described with reference to the drawings.

Figure 9A:
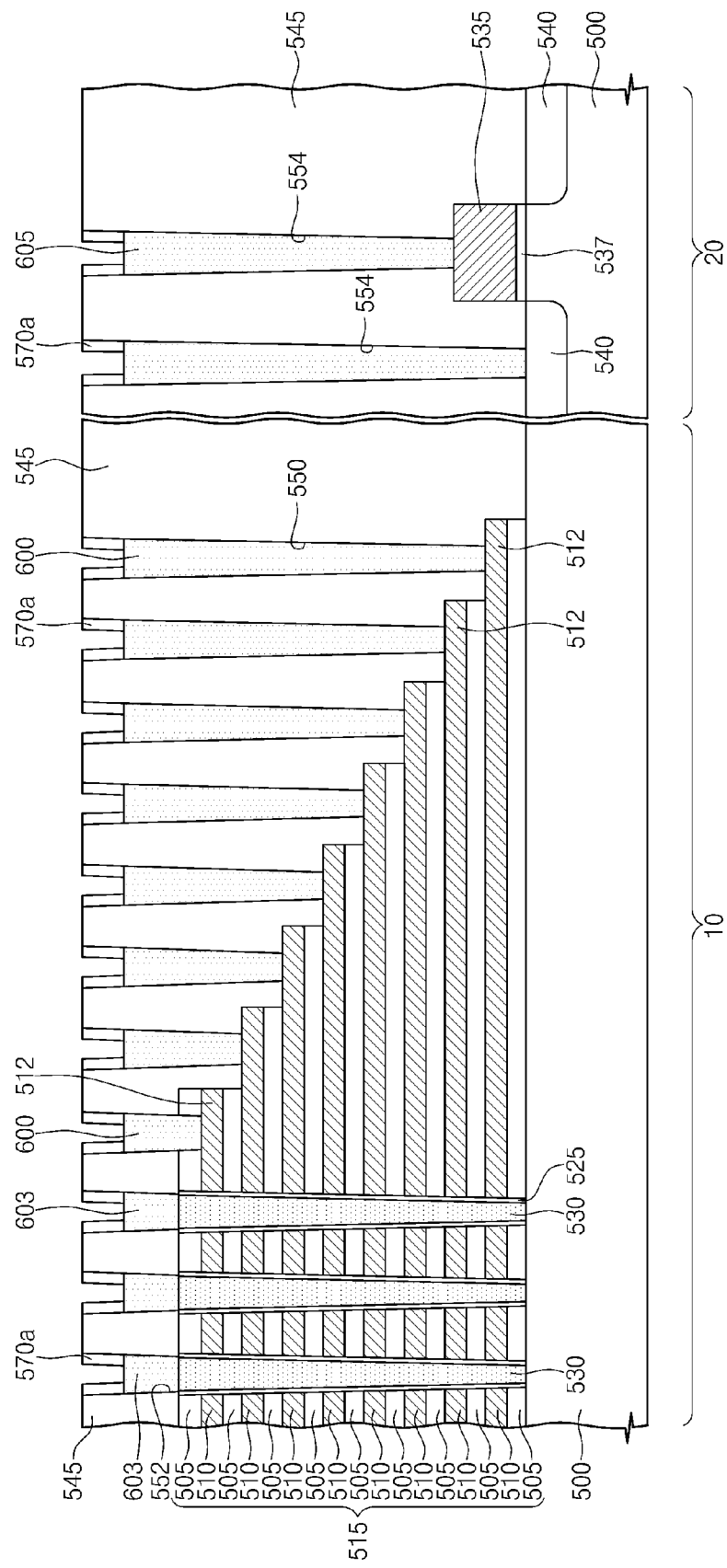
FIGS. 9A to 9C are cross sectional views illustrating a method of fabricating a three dimensional semiconductor memory device according to an exemplary embodiment of the inventive concept.
Figure 9B:
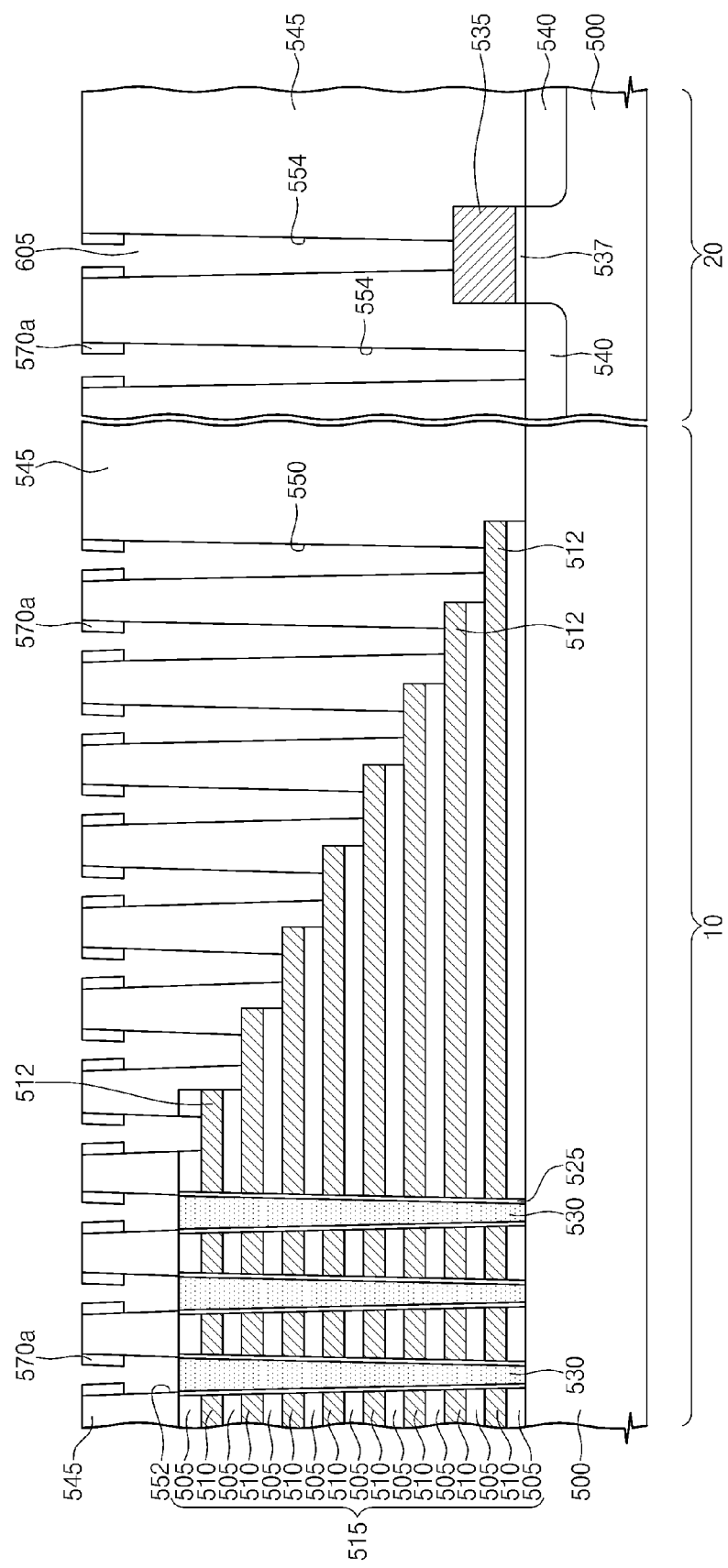
Figure 9C:
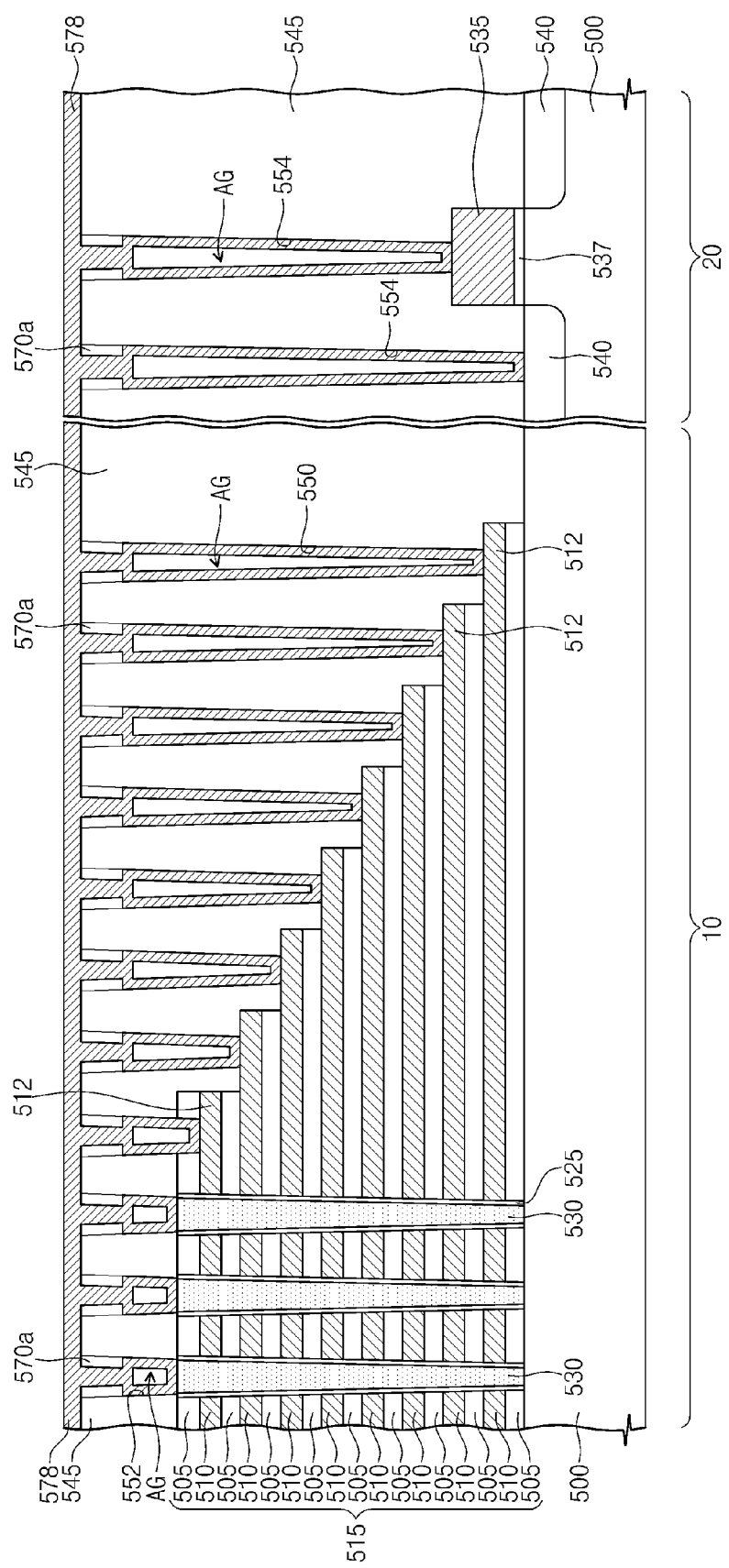

FIGS. 9A to 9C are cross sectional views illustrating a method of fabricating a three dimensional semiconductor memory device according to a modified exemplary embodiment of the inventive concept.

Referring to FIG. 9A, the same process steps as those described in connection with FIG. 8A may apply until formation of contact holes 550, 552, and 554. A sacrificial layer filling the contact holes 550, 552, and 554 may be formed on the substrate having the contact holes 550, 552, and 554. The sacrificial layer may be formed of a material having an etch selectivity with respect to the interlayer dielectric layer 545.

The sacrificial layer may be planarized until the interlayer dielectric layer 545 is exposed, thereby forming sacrificial plugs that fill the contact holes 550, 552, and 554, respectively. The sacrificial plugs may be then etched back to form recessed sacrificial plugs 600, 603, and 605. Top surfaces of the recessed sacrificial plugs 600, 603, and 605 may be located at a lower level than a top surface of the interlayer dielectric layer 545. A spacer layer may be conformably formed on the substrate having the recessed sacrificial plugs 600, 603, and 605. The spacer layer may be anisotropically etched back until the recessed sacrificial plugs 600, 603, and 605 are exposed. As a result, insulating spacers 570a may be formed on the recessed contact plugs 600, 603, and 605, respectively.

The recessed sacrificial plugs 600, 603, and 605 may be formed of a material having an etch selectivity with respect to the insulating spacers 570a. For example, according to an embodiment, in the event that the interlayer dielectric layer 545 and the insulating spacers 570a are formed of an oxide layer, the recessed sacrificial plugs 600, 603, and 605 may be formed of at least one of a polysilicon layer, a silicon carbide (SiC) layer, a silicon oxycarbide (SiOC) layer, an SiOCH layer, a silicon nitride (SiN) layer, a silicon oxynitride (SiON) layer, and a spin on hardmask (SOH) layer containing carbon.

Referring to FIG. 9B, the recessed sacrificial plugs 600, 603, and 605 may be removed. The insulating spacers 570a may remain during removal of the recessed sacrificial plugs 600, 603, and 605.

Referring to FIG. 9C, a conductive layer 578 may be formed on the substrate having the contact holes 550, 552, and 554 where the recessed sacrificial plugs 60, 603, and 605 have been removed. The conductive layer 578 may be conformably formed. For example, the conductive layer 578 may be conformably formed along inner walls of the contact holes 550, 552, and 554 under the insulating spacers 570a. The empty spaces surrounded by the spacers 570a may have a width which is less than a width of the contact holes 550, 552, and 554 under the insulating spacers 570a. Thus, before the empty spaces surrounded by the spacers 570a are filled with the conductive layer 578, the conductive layer 578 may be conformably formed on the inner walls of the contact holes 550, 552, and 554 under the insulating spacers 570a. After the empty spaces surrounded by the spacers 570a are filled with the conductive layer 578, the source material of the conductive layer 578 may not be supplied into the contact holes 550, 552, and 554 under the insulating spacers 570a. As a result, air gaps AG surrounded by the conductive layer 578 may be formed in the contact holes 550, 552, and 554 under the insulating spacers 570a, respectively.

Subsequently, the conductive layer 578 may be planarized until the interlayer dielectric layer 545 is exposed, thereby forming the contact structures 580a, 582a, and 584a shown in FIG. 7A. Interconnections 590a, 590b, and 590c may be further formed to realize the three dimensional semiconductor memory device illustrated in FIG. 7A.

Hereinafter, a method of fabricating the three dimensional semiconductor memory device illustrated in FIG. 7B will be described with reference to FIG. 7B.

Referring again to FIG. 7B, a first stacked structure 515a, first vertical active patterns 530a, and a lower planarized dielectric layer 243 may be formed using the same manners as described with reference to FIGS. 3A to 3C.

First lower holes 610 and second lower holes 612 may be formed to penetrate the lower planarized dielectric layer 243. The first lower holes 610 may expose the pad portions 512a of the first gate patterns 510a in the cell region 10, and the second lower holes 612 may expose the peripheral gate 535 and the peripheral source/drain regions 540 in the peripheral circuit region 20. First lower contact plugs 615 and second lower contact plugs 617 may be formed to fill the first lower holes 610 and the second lower holes 612, respectively.

A second stacked structure 515b, second vertical active patterns 530b, and an interlayer dielectric layer 545 may be formed on the substrate having the lower contact plugs 615 and 617. Contact structures 580, 580b, 582, and 584b may be formed using the same manners as described with reference to FIGS. 8A to 8C. Interconnections 590a, 590b, and 590c may be then formed to realize the three dimensional semiconductor memory device illustrated in FIG. 7B.

Next, a method of fabricating the three dimensional semiconductor memory device illustrated in FIG. 7C will be described with reference to the drawings.

Figure 10A:
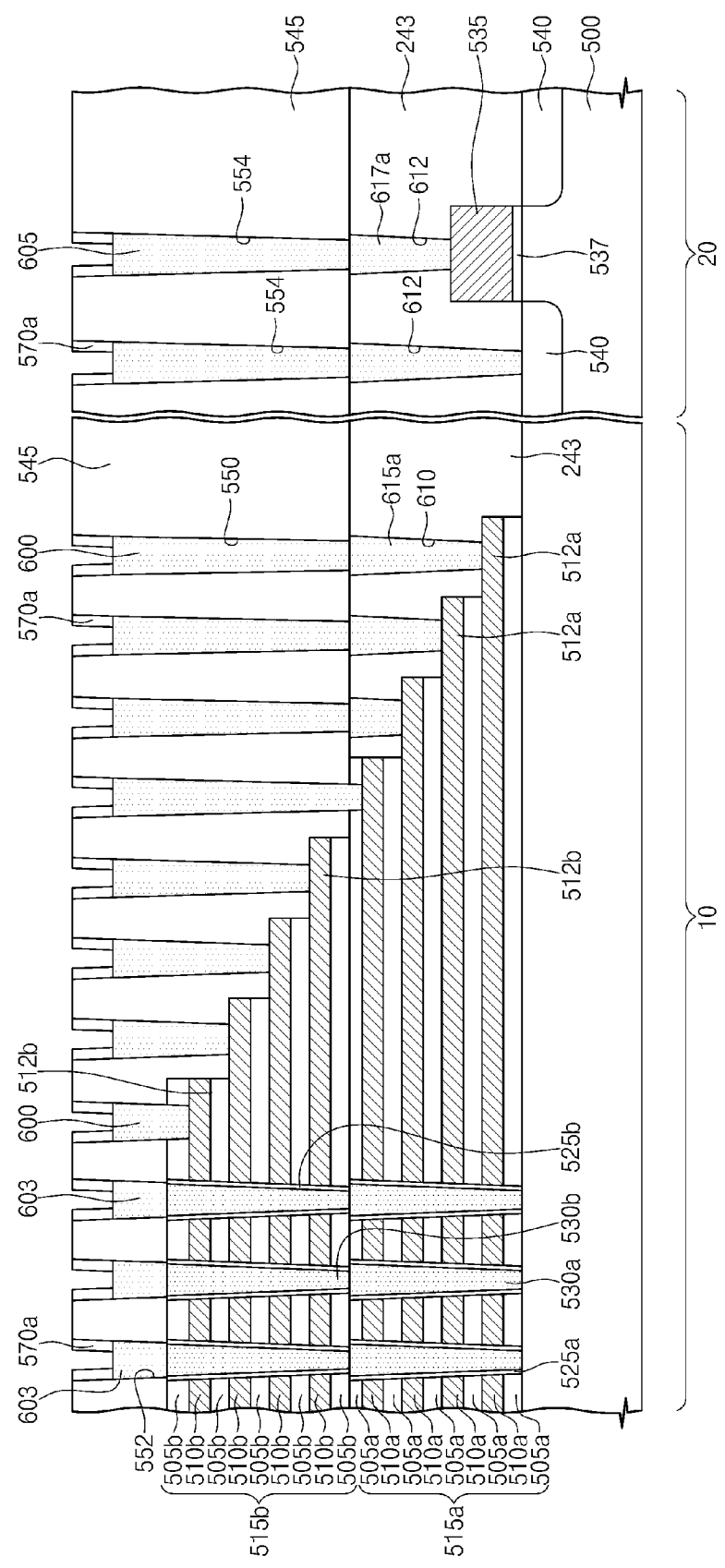
FIGS. 10A and 10B are cross sectional views illustrating a method of fabricating a three dimensional semiconductor memory device according to an exemplary embodiment of the inventive concept.
Figure 10B:
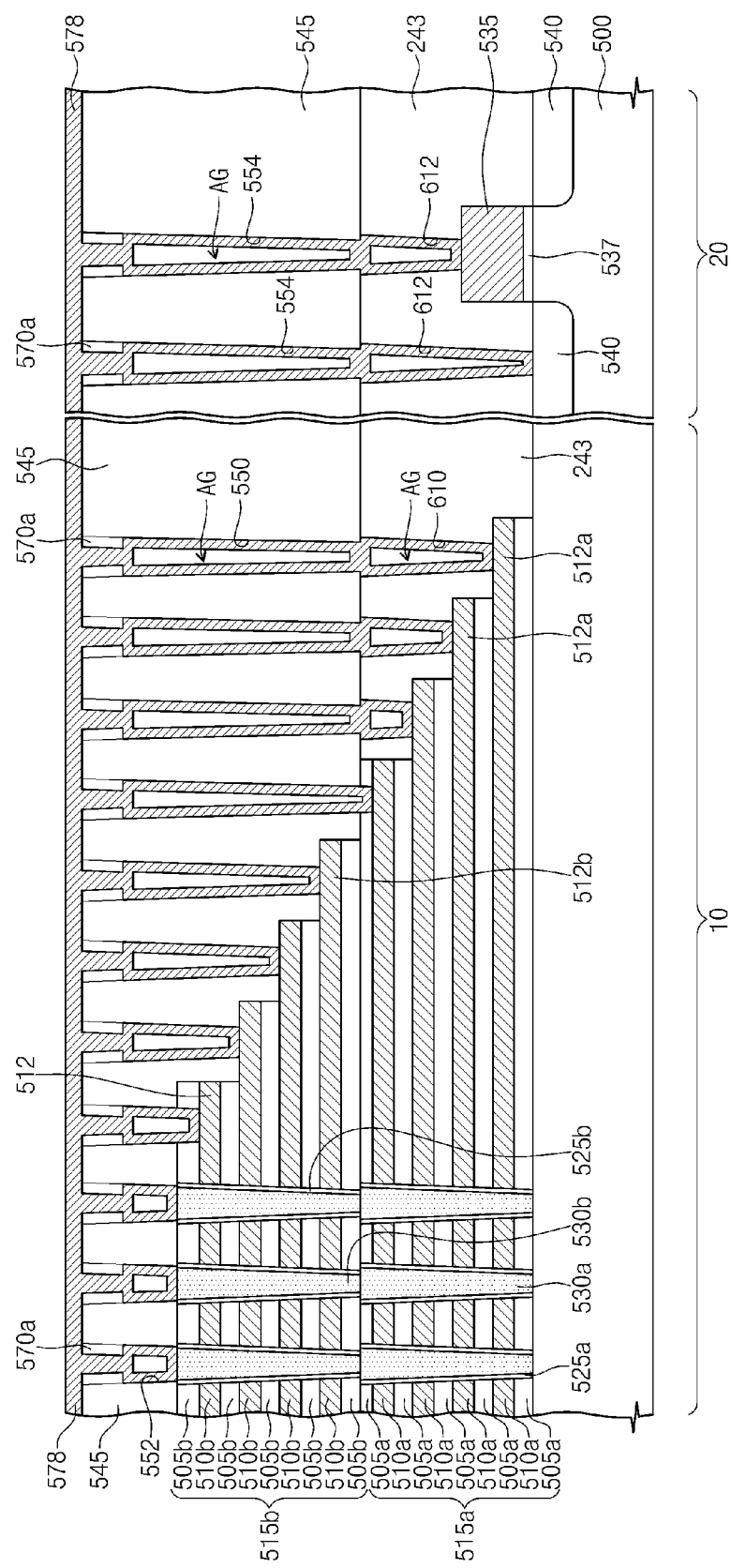

FIGS. 10A and 10B are cross sectional views illustrating a method of fabricating a three dimensional semiconductor memory device according to a modified exemplary embodiment of the inventive concept.

Referring to FIG. 10A, in the fabrication method described with reference to FIG. 7B, first and second lower sacrificial patterns 615a and 617a may be formed instead of the first and second contact plugs 615 and 617.

Recessed sacrificial plugs 600, 603, and 605 and insulating spacers 570a may be formed using the same manners as described with reference to FIG. 9A after formation of the second stacked structure 515b, the second vertical active patterns 530b, and the interlayer dielectric layer 545. Some of the recessed sacrificial plugs 600, 603, and 605, for example, the recessed sacrificial plugs 600 and 605, may be in contact with the first and second lower sacrificial plugs 615a and 617a. The first and second lower sacrificial plugs 615a and 617a may be formed of the same material as the recessed sacrificial plugs 600, 603, and 605.

Referring to FIG. 10B, the recessed sacrificial plugs 600, 603, and 605 and the lower sacrificial plugs 615a and 617a may be removed to empty out the contact holes 550, 552, and 554 and the lower holes 610 and 612 which are located under the insulating spacers 570a.

A conformal conductive layer 578 may be formed on the substrate having the empty holes 550, 552, 554, 610, and 612 under the insulating spacers 570a. Thus, as described with reference to FIG. 9C, the conductive layer 578 may be conformably formed along the inner walls of the empty holes 550, 552, 554, 610, and 612, and the conductive layer 578 may fill the spaces (e.g., portions of the contact holes 550, 552 and 554) surrounded by the insulating spacers 570a.

The conductive layer 578 may be then planarized to form contact structures 580a, 580c, 582a, and 584c, as disclosed in FIG. 7C. Subsequently, interconnections 590a, 590b, and 590c may be formed to realize the three dimensional semiconductor memory device disclosed in FIG. 7C.

A method of fabricating the three dimensional semiconductor memory device disclosed in FIG. 7D may be similar to the manners described with reference to FIGS. 8A to 8C except for the process sequence to form the first interconnections 590a and the second interconnections 590b. For example, according to an embodiment, the second contact structures 650 and the second interconnections 590b' connected to the vertical active patterns 530 may be formed after formation of the first interconnections 590a.

The three dimensional semiconductor memory device disclosed in FIG. 7E may be formed using a combination of the fabrication methods described in connection with FIGS. 1 to 10B.

Figure 11A:
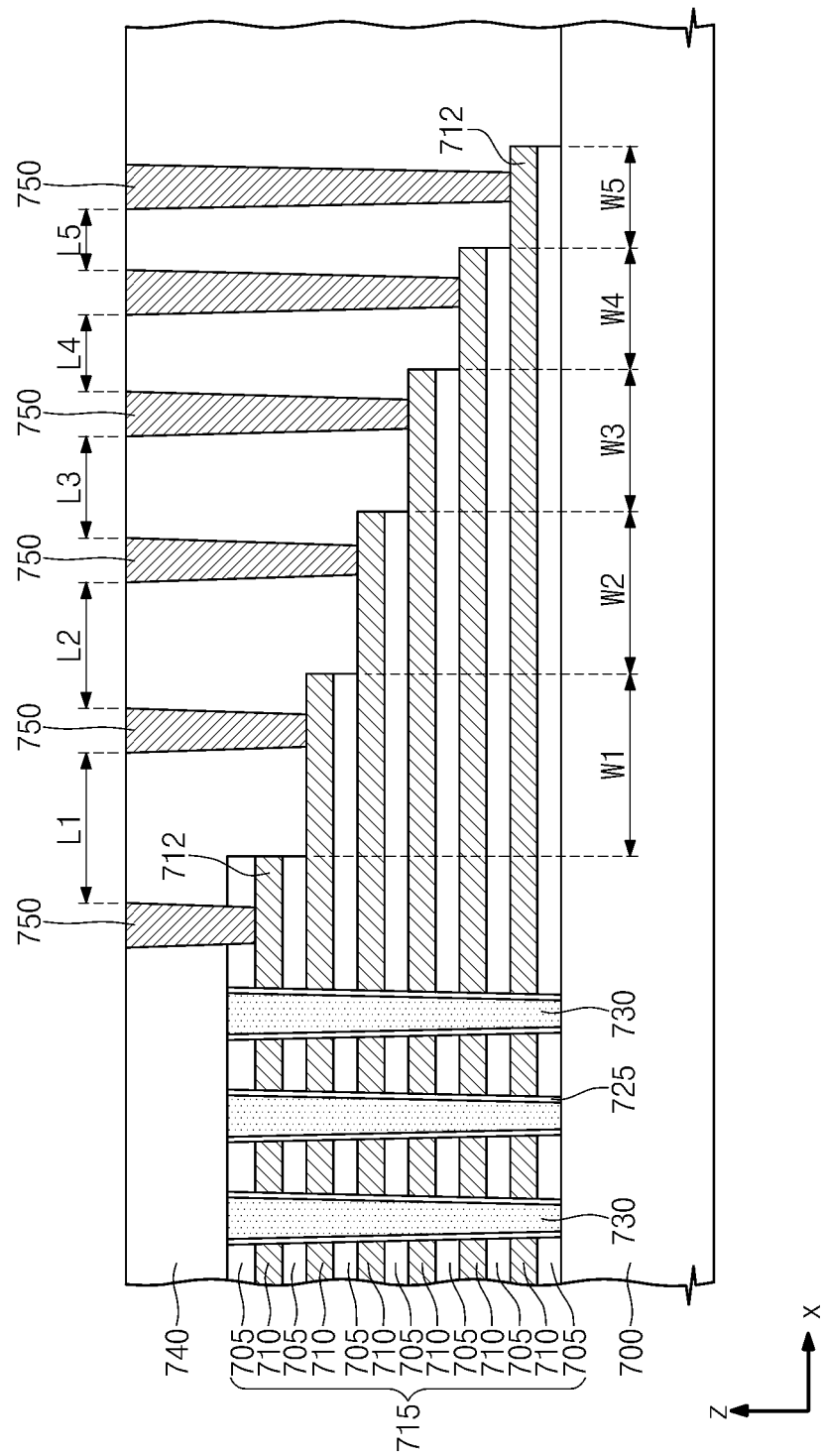
FIG. 11A is a cross sectional view illustrating a three dimensional semiconductor memory device according to an exemplary embodiment of the inventive concept.

FIG. 11A is a cross sectional view illustrating a three dimensional semiconductor memory device according to an exemplary embodiment of the inventive concept.

Referring to FIG. 11A, a stacked structure 715 may be disposed on a substrate 700. The stacked structure 715 may include insulating patterns 705 and gate patterns 710 which are alternately and repeatedly stacked. A plurality of vertical active patterns 730 may penetrate the stacked structure 715. The gate patterns 710 may include pad portions 712 having a step structure.

An interlayer dielectric layer 740 may be disposed on an entire surface of the substrate having the stacked structure 715. A plurality of contact plugs 750 may penetrate the interlayer dielectric layer 740 and may be respectively connected to the pad portions 712. The contact plugs 750 may be arrayed in a predetermined direction. For example, two immediately adjacent contact plugs 750 may be separated from each other by a contact-space L1, L2, L3, L4, or L5 in the predetermined direction. One of the contact-spaces L1, L2, L3, L4, and L5 may be different from another contact-space of the contact-spaces L1, L2, L3, L4, and L5. The predetermined direction may correspond to an x-axis direction shown in FIG. 11A.

According to an embodiment, the contact-spaces L1, L2, L3, L4, and L5 may be gradually reduced as the locations of the contact plugs 750 are moved in a descent direction of the pad portions 712 constituting the step structure, as illustrated in FIG. 11A. For example, a distance between two adjacent contact plugs 750 decreases in the x-axis direction.

Each of the pad portions 712 may have a predetermined width W1, W2, W3, W4, or W5 in the predetermined direction. According to an embodiment, the predetermined widths W1, W2, W3, W4, and W5 of the pad portions 712 may be the same or substantially to the same as each other. Alternatively, one of the predetermined widths W1, W2, W3, W4, and W5 may be different from another predetermine width, as illustrated in FIG. 11A. According to an embodiment, the predetermined widths W1, W2, W3, W4, and W5 may be gradually reduced as the locations of the pad portions 712 are moved in a descent direction of the pad portions 712 constituting the step structure. For example, the widths W1, W2, W3, W4, and W5 decrease in the x-axis direction. However, the embodiments of the inventive concept are not limited thereto.

As described above, one of the contact-spaces L1, L2, L3, L4, and L5 may be different from another contact-space of the contact-spaces L1, L2, L3, L4, and L5. As a result, the positions of the contact plugs 750 may be appropriately changed according to the positions of interconnections respectively connected to the contact plugs 750. Thus, a high reliable and highly integrated three dimensional semiconductor memory device may be realized.

According to an embodiment, the elements described in connection with FIG. 11A may be formed of the same materials as the corresponding elements described in connection with FIGS. 1 to 10B.

Figure 11B:
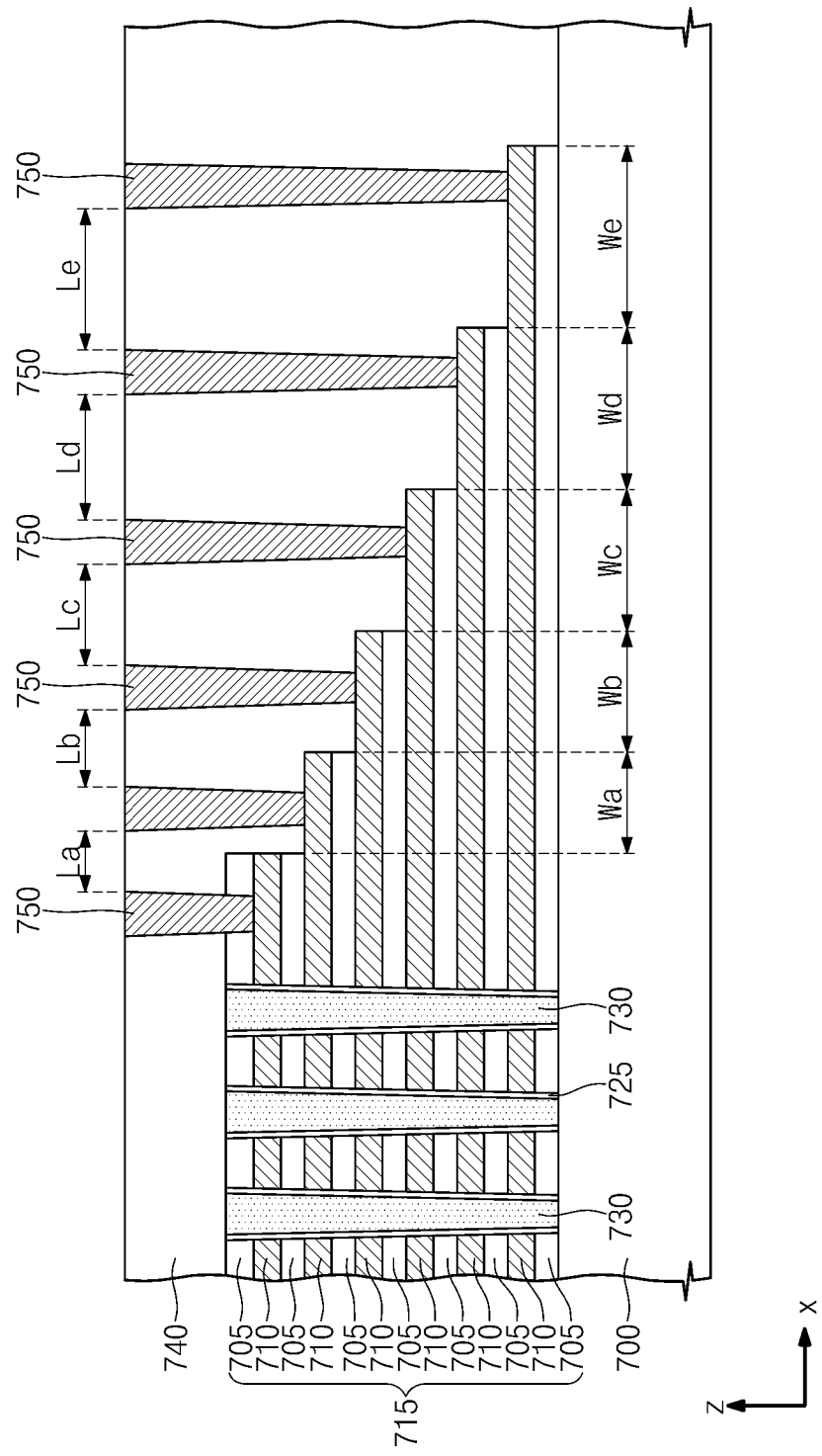
FIG. 11B is a cross sectional view illustrating a three dimensional semiconductor memory device according to an exemplary embodiment of the inventive concept.

FIG. 11B is a cross sectional view illustrating a three dimensional semiconductor memory device according to a modified exemplary embodiment of the inventive concept.

Referring to FIG. 11B, contact-spaces La, Lb, Lc, Ld, and Le may be gradually increased as the locations of the contact plugs 750 are moved in a descent direction of the step-shaped pad portions 712. The widths Wa, Wb, We, Wd, and We of the pad portions 712 may also be gradually increased as the locations of the pad portions 712 are moved in a descent direction of the step-shaped pad portions 712. For example, the distance between two adjacent contact plugs 750 and the width of the pad portion 712 may increase in the x-axis direction. However, the embodiments of the inventive concept are not limited thereto. For example, according to an embodiment, the widths Wa, Wb, Wc, Wd, and We of the pad portions 712 may be the same or substantially to the same as each other.

The embodiments described in connection with FIGS. 6 to 10B may be applied to the embodiments described in connection with FIGS. 11A and 11B. For example, according to an embodiment, the contact plugs 750 illustrated in FIG. 11A or 11B may be replaced with one of the contact structures described in connection with FIGS. 6, 7A, 7B, 7C, and 7D.

The embodiments described in connection with FIGS. 11A and 11B may be applied to the three dimensional semiconductor memory device according to the embodiments described above in connection with FIGS. 1 to 5C. This will be hereinafter described with reference to FIG. 11C.

Figure 11C:
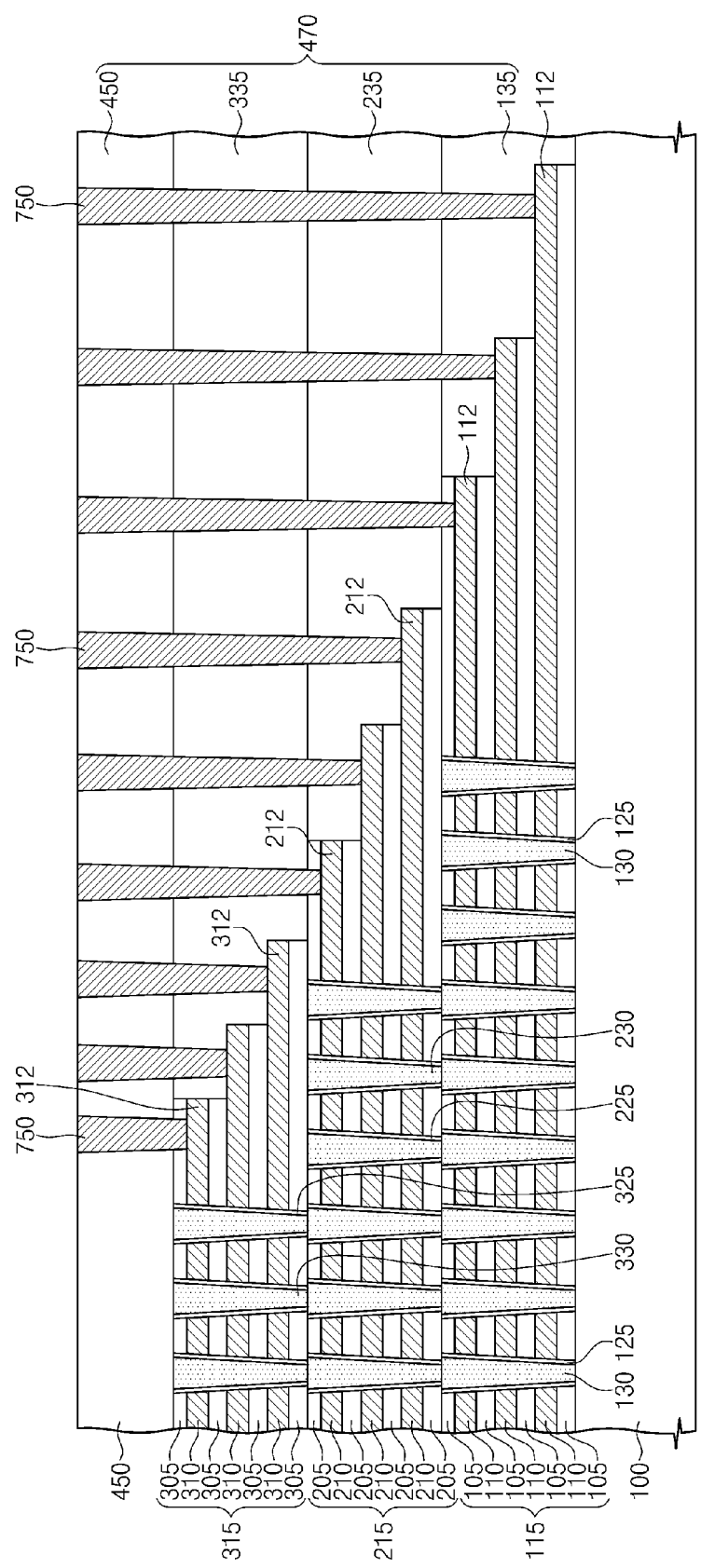
FIG. 11C is a cross sectional view illustrating a three dimensional semiconductor memory device according to an exemplary embodiment of the inventive concept.

FIG. 11C is a cross sectional view illustrating a three dimensional semiconductor memory device according to an exemplary embodiment of the inventive concept.

Referring to FIG. 11C, first, second, and third stacked structures 115, 215, and 315 may be sequentially stacked on the substrate 100, and first, second, and third planarized dielectric layers 135, 235, and 335 may be sequentially stacked. The first, second, and third planarized dielectric layers 135, 235, and 335 may cover the pad portions 112 of the first gate patterns 110, the pad portions 212 of the second gate patterns 210, and the pad portions 312 of the third gate patterns 310, respectively. In the present modified embodiment, three stacked structures 115, 215, and 315 are stacked on the substrate 100, but the embodiments of the inventive concept are not limited thereto. For example, according to an embodiment, the three dimensional semiconductor memory device may include two, four or more stacked structures, as described with reference to FIG. 1.

An upper dielectric layer 450 may be disposed on the third stacked structure 315 and the third planarized dielectric layer 335. The first to third planarized dielectric layers 135, 235, and 335 and the upper dielectric layer 450 may constitute an interlayer dielectric layer 470.

A plurality of contact plugs 750 may penetrate the interlayer dielectric layer 470 and may be respectively connected to the pad portions 112, 212, and 312. The contact plugs 750 may be arrayed in a predetermined direction. One of contact-spaces between the adjacent contact plugs 750 may be different from another contact-space. According to an embodiment, the contact-spaces may be gradually increased as the locations of the contact plugs 750 are moved in a descent direction of the step-shaped pad portions 112, 212 and 312. Alternatively, the contact-spaces may be gradually reduced as the locations of the contact plugs 750 are moved in a descent direction of the step-shaped pad portions 112, 212 and 312. According to an embodiment, each of the pad portions 112, 212, and 312 may have a width in the predetermined direction, and the widths of the pad portions 112, 212, and 312 may be the same or substantially to the same as or different from each other.

The embodiments described in connection with FIGS. 1 to 11C may be combined with each other. For example, according to an embodiment, the contact plugs 750 illustrated in FIG. 11C may be replaced with the contact structures disclosed in any one of the embodiments described in connection with FIGS. 6, 7A, 7B, 7C, and 7D.

Figure 12A:
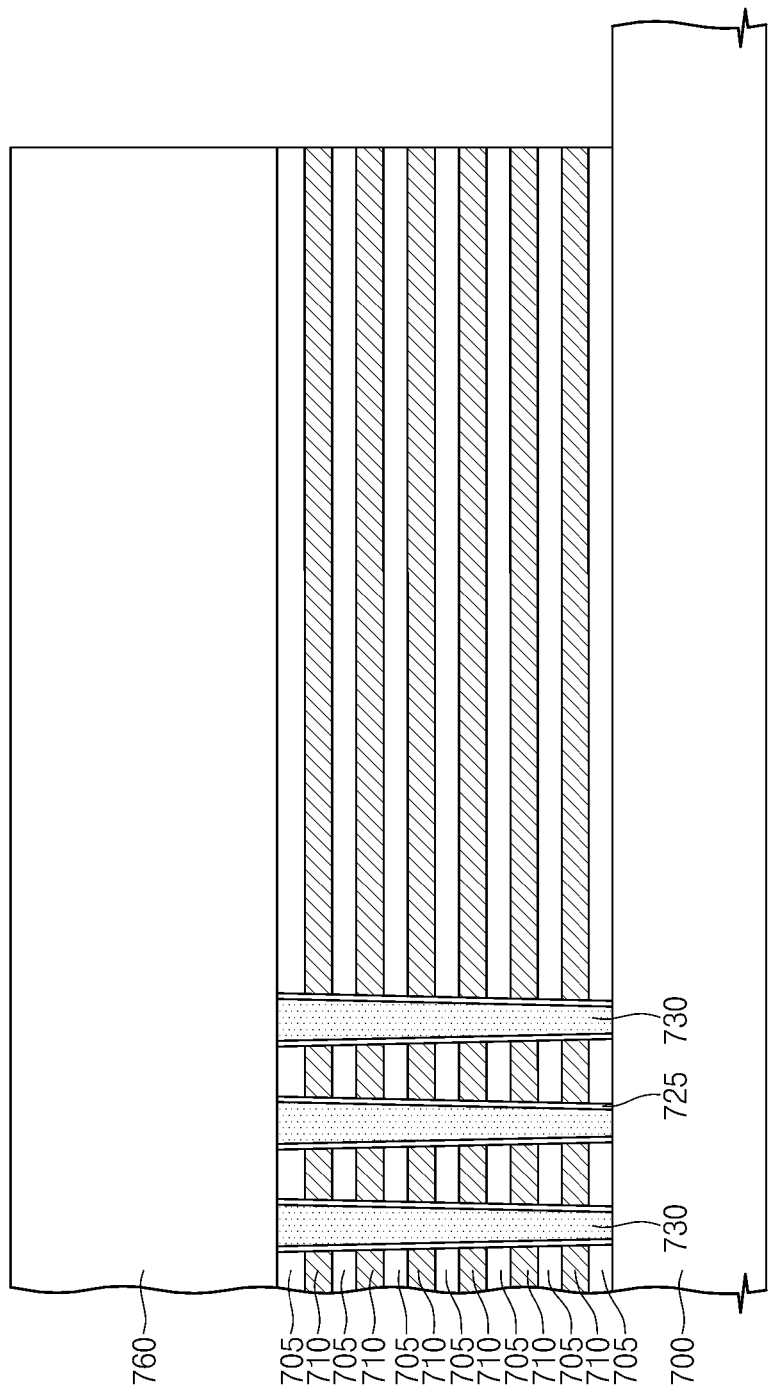
FIGS. 12A and 12B are cross sectional views illustrating a method of fabricating a three dimensional semiconductor memory device according to an exemplary embodiment of the inventive concept.
Figure 12B:
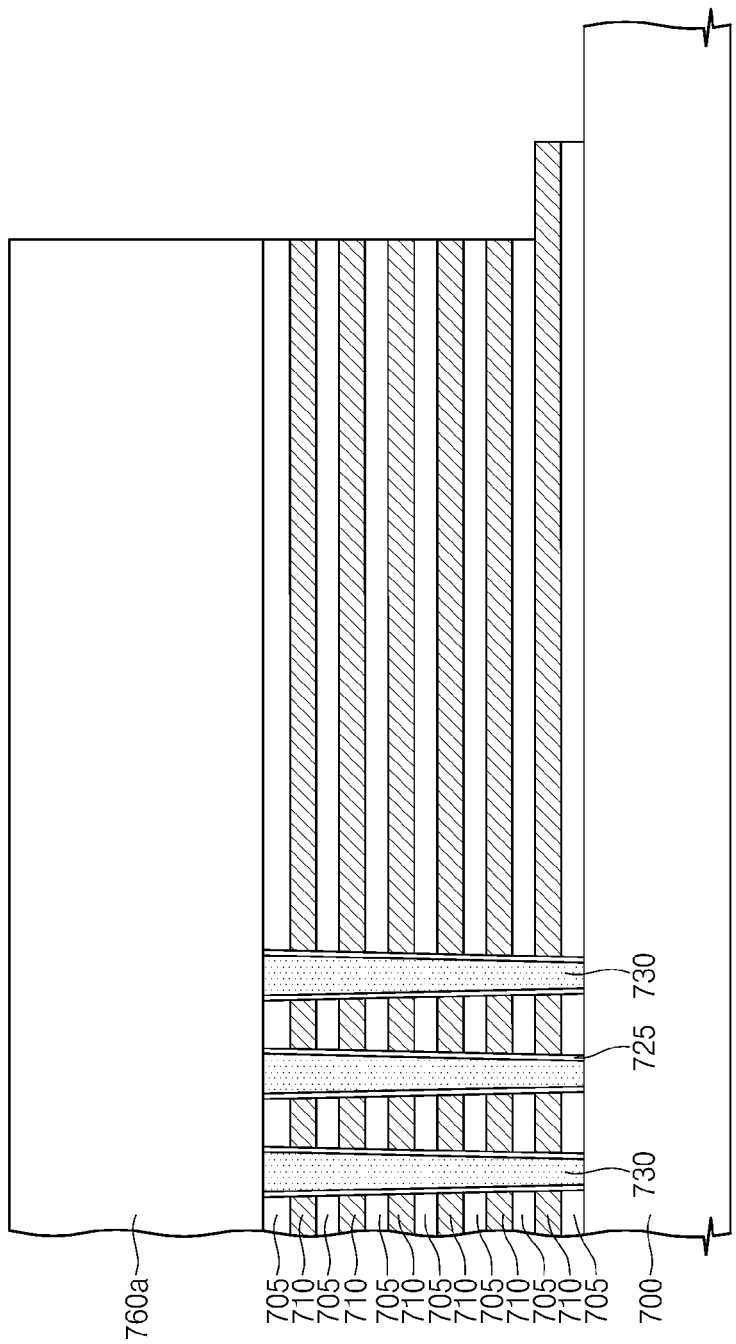

FIGS. 12A and 12B are cross sectional views illustrating a method of fabricating a three dimensional semiconductor memory device according to an exemplary embodiment of the inventive concept.

Referring to FIG. 12A, insulating layers 705 and gate layers 710 may be alternately and repeatedly stacked on a substrate 700. A plurality of channel holes may be formed to penetrate the insulating layers 705 and the gate layers 710, and a data storing layer 725 may be formed on each of sidewalls of the channel holes. A plurality of vertical active patterns 730 may be formed in the channel holes, respectively.

A mask pattern 760 may be formed on an uppermost insulating layer of the insulating layers 705 and the vertical active patterns 730. The mask pattern 760 may define a pad portion in a lowermost gate pattern 710 by a subsequent process. The insulating layers 705 and the gate layers 710 may be etched using the mask pattern 760 as an etch mask.

Referring to FIG. 12B, the mask pattern 760 may be isotropically etched to form a shrunk mask pattern 760a. Thus, the shrunk mask pattern 760a may expose an edge of the uppermost insulating layer 705. The insulating layers 705 and the gate layers 710 may be etched using the shrunk mask pattern 760a as an etch mask except for the lowermost gate layer 710 and the lowermost insulating layer 705. The shrunk mask pattern 760a may be then isotropically etched again to form a second shrunk mask pattern, which is also referred to as a second isotropically etched mask pattern. The insulating layers 705 and the gate layers 710 may be etched using the second isotropically etched mask pattern as an etch mask except for the insulating layer 705 located directly over the lowermost gate layer 710, which is also referred to as the second lowermost insulating layer and the gate layer 710 located directly over the second lowermost insulating layer, which is also referred to as the second lowermost gate layer, may not be etched. The isotropic etching process of the mask pattern and the etching process of the stacked insulating layers and the gate layers may be alternately and repeatedly performed to form pad portions 712 having a step structure illustrated in FIG. 11A or 11B. The pad portions 712 having different widths from each other (see FIG. 11A or 11B) may be formed by adjusting the isotropic etching amount of the mask pattern. The method of forming the pad portions 712, which is described with reference to FIGS. 12A and 12B, may correspond to the first patterning process employing the consumption etching mask mentioned in the descriptions to FIG. 3C. The first patterning process may be applied to the method of forming the pad portions having a step structure described in connection with FIGS. 1 to 10B.

Subsequently, the interlayer dielectric layer 740 of FIG. 11A may be formed on the substrate including the pad portions with a step structure, and the contact plugs 750 of FIG. 11A or 11B may be formed to penetrate the interlayer dielectric layer 740. All the contact plugs 750 may be simultaneously formed. Contact-spaces between the contact plugs 750 may be determined according to spaces between the corresponding patterns in a photo mask defining the contact plugs 750. Thus, the contact plugs 750 of FIG. 11B may be realized by appropriately designing the spaces between the corresponding patterns in the photo mask.

A method of forming the pad portions 712 having a step structure will be described with reference to FIGS. 13A and 13B.

Figure 13A:
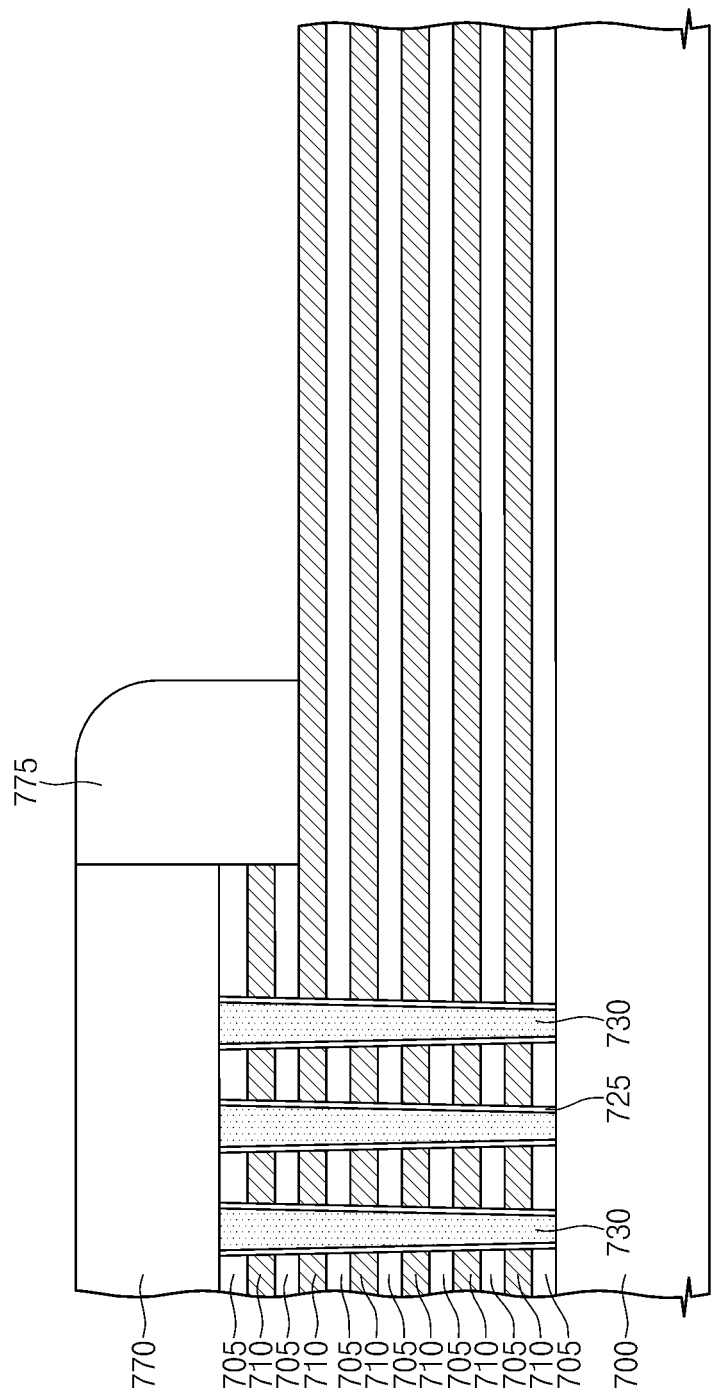
FIGS. 13A and 13B are cross sectional views illustrating a method of fabricating a three dimensional semiconductor memory device according to an exemplary embodiment of the inventive concept.
Figure 13B:
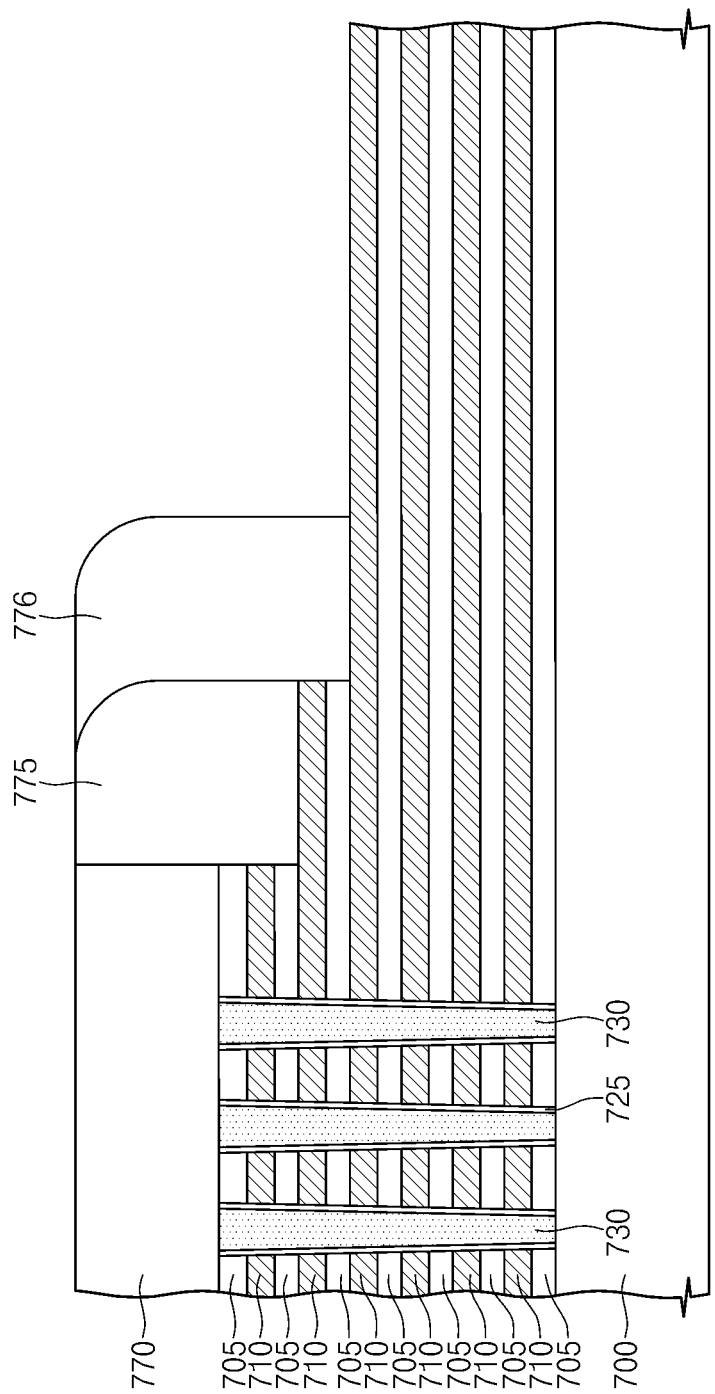

FIGS. 13A and 13B are cross sectional views illustrating a method of fabricating a three dimensional semiconductor memory device according to a modified exemplary embodiment of the inventive concept.

Referring to FIG. 13A, a reference mask pattern 770 may be formed on the uppermost insulating layer 705 and the vertical active patterns 730. The reference mask pattern 770 may define a pad portion in an uppermost gate pattern by a subsequent process. The uppermost insulting layer 705, the uppermost gate layer, and the second uppermost insulating layer directly under the uppermost gate layer may be etched using the reference mask pattern 770 as an etch mask. As a result, an edge of the second uppermost gate layer may be exposed.

Subsequently, a first mask spacer 775 may be formed on a sidewall of the reference mask pattern 770. A bottom width of the first mask spacer 775 may define a width of a pad portion of the second uppermost gate pattern. Thus, the width of the pad portion of the second uppermost gate pattern may be appropriately changed by adjusting the bottom width of the first mask spacer 775. The first mask spacer 775 may include a polymer material.

Referring to FIG. 13B, the exposed gate layer 710 and the insulating layer 705 under the exposed gate layer 710 may be etched using the reference mask pattern 770 and the first mask spacer 775 as etch masks. A second mask spacer 776 may be then formed on a sidewall of the first mask spacer 775. The gate layer 710 and the insulating layer 705 may be etched using the reference mask pattern 770, the first mask spacer 775, and the second mask spacer 776 as etch masks. The aforementioned manners may be repeatedly performed to form pad portions 712 having a step structure illustrated in FIG. 11A or 11B.

The method of forming the pad portions 712, which is described with reference to FIGS. 13A and 13B, may correspond to the second patterning process described in connection with FIG. 3C. For example, the second patterning process may employ the masking method that adds mask spacers to a reference mask pattern step by step, as described with reference to FIGS. 13A and 13B. The second patterning process may be applied to the method of forming the pad portions having a step structure described in connection with FIGS. 1 to 10B.

The three dimensional semiconductor memory devices described above may be encapsulated using various packaging techniques. For example, according to an embodiment, the three dimensional semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique, and a wafer-level processed stack package (WSP) technique.

The package in which the three dimensional semiconductor memory device according to one of the above embodiments is mounted may further include at least one semiconductor device (e.g., a controller and/or a logic device) that controls the three dimensional semiconductor memory device.

Figure 14:
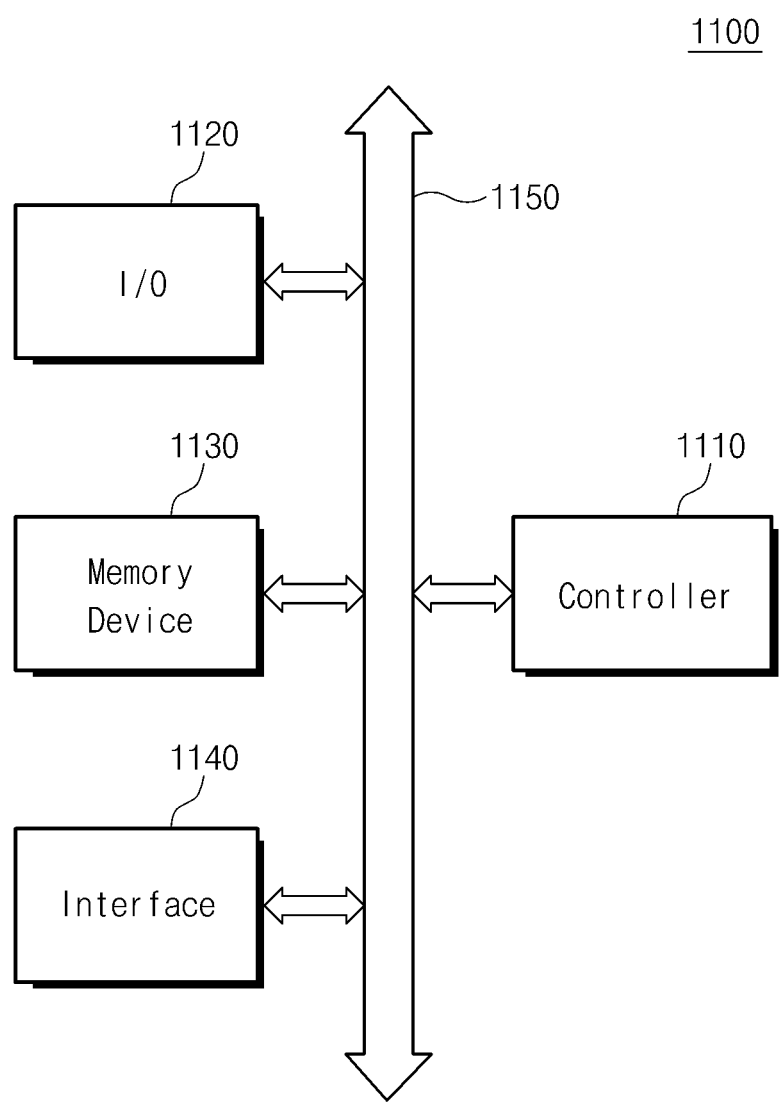
FIG. 14 is a schematic block diagram illustrating an example of electronic systems including three dimensional semiconductor memory devices according to embodiments of the inventive concept.

FIG. 14 is a schematic block diagram illustrating an exemplary electronic system including a three dimensional semiconductor memory device according to an embodiment of the inventive concept.

Referring to FIG. 14, an electronic system 1100 according to an embodiment may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device. The other logic device may have a similar function to any one of the microprocessor, the digital signal processor, and the microcontroller. The I/O unit 1120 may include a keypad, a keyboard, or a display unit. The memory device 1130 may store data and/or commands. The memory device 1130 may include at least one of the three dimensional semiconductor memory devices according to the embodiments of the inventive concept. The memory device 1130 may further include another type of semiconductor memory devices which are different from the three dimensional semiconductor memory devices described above. For example, according to an embodiment, the memory device 1130 may further include a magnetic memory device, a phase change memory device, a dynamic random access memory (DRAM) device, and/or a static random access memory (SRAM) device. The interface unit 1140 may transmit electrical data to a communication network or may receive electrical data from a communication network. The interface unit 1140 may operate by wired or wireless. For example, according to an embodiment, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or any electronic product that may wirelessly receive or transmit information data.

Figure 15:
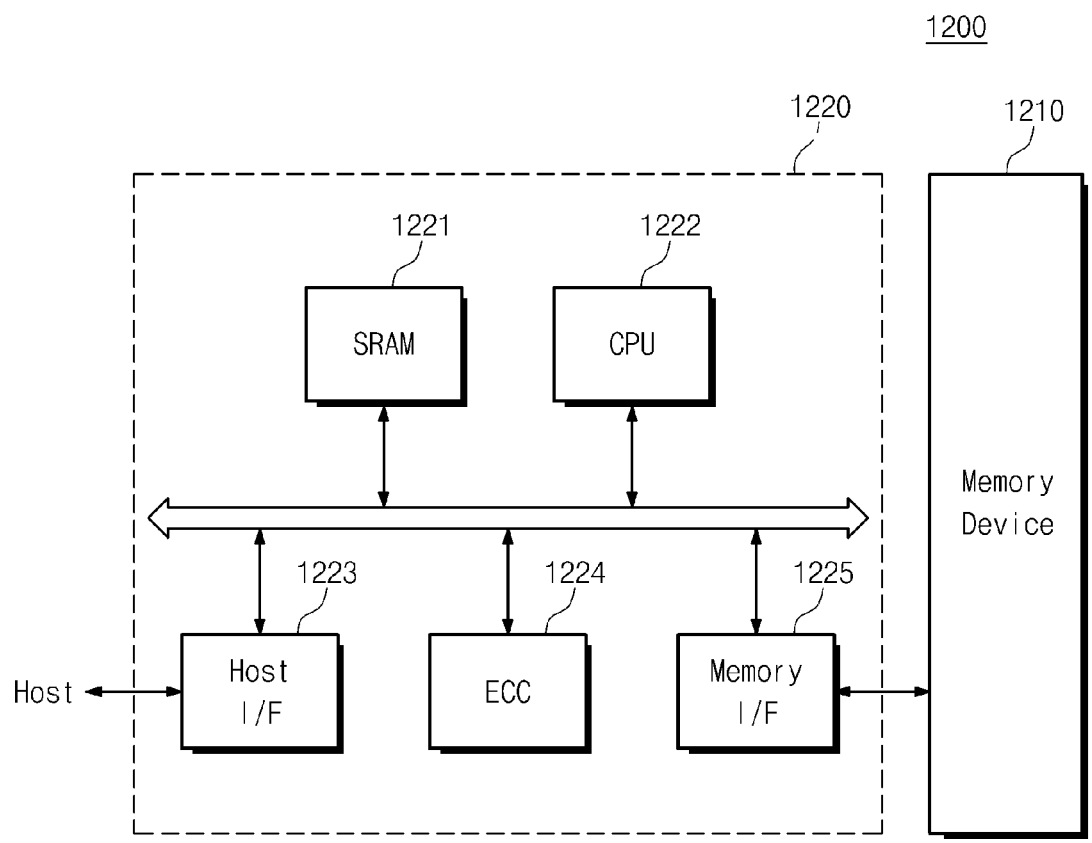
FIG. 15 is a schematic block diagram illustrating an example of memory cards including three dimensional semiconductor memory devices according to embodiments of the inventive concept.

FIG. 15 is a schematic block diagram illustrating an exemplary memory card including a three dimensional semiconductor memory device according to an embodiment of the inventive concept.

Referring to FIG. 15, a memory card 1200 according to an embodiment of the inventive concept may include a memory device 1210. The memory device 1210 may include at least one of the three dimensional semiconductor memory devices according to the embodiments mentioned above. According to an embodiment, the memory device 1210 may further include another type of semiconductor memory device which is different from the three dimensional semiconductor memory devices according to the embodiments described above. For example, according to an embodiment, the memory device 1210 may further include a magnetic memory device, a phase change memory device, a dynamic random access memory (DRAM) device, and/or a static random access memory (SRAM) device. The memory card 1200 may include a memory controller 1220 that controls data communication between a host and the memory device 1210.

The memory controller 1220 may include a central processing unit (CPU) 1222 that controls the overall operation of the memory card 1200. According to an embodiment, the memory controller 1220 may include an SRAM device 1221 used as an operation memory of the CPU 1222. According to an embodiment, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks of the computer systems.

According to the embodiments set forth above, a first outer sidewall of an uppermost electrode may be covered with an extension of an electrode-dielectric layer. As a consequence, the first outer sidewall of the uppermost electrode may be protected from an etching process. As a result, physical loss of the uppermost electrode may be minimized during the etching process to prevent electrical resistance of the uppermost electrode from increasing. Thus, high reliable and highly integrated three dimensional semiconductor memory devices may be realized.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A three dimensional semiconductor memory device comprising:
a first stacked structure including first insulating patterns and first gate patterns which are alternately and repeatedly stacked on a substrate;

a plurality of first vertical active patterns penetrating the first stacked structure;

a second stacked structure including second insulating patterns and second gate patterns which are alternately and repeatedly stacked on the first stacked structure; and a plurality of second vertical active patterns penetrating the second stacked structure, wherein the number of the first vertical active patterns is greater than the number of the second vertical active patterns, wherein at least one first vertical active pattern is not connected to the second vertical active patterns.

2. The device of claim 1, wherein the first vertical active patterns include some of the first vertical active patterns which are respectively connected to the second vertical active patterns.

3. The device of claim 2, wherein each of the first and second gate patterns includes a pad portion, wherein the pad portions of the first and second gate patterns are stacked to constitute a step structure, and wherein the at least one first vertical active pattern not connected to the second vertical active patterns is disposed between the first vertical active patterns connected to the second vertical active patterns and the pad portions of the first gate patterns.

4. The device of claim 3, further comprising:
an interlayer dielectric layer including a first planarized dielectric layer covering the pad portions of the first gate patterns and a second planarized dielectric layer covering the pad portions of the second gate patterns; and
a plurality of contact structures penetrating the interlayer dielectric layer, wherein the plurality of contact structures are connected to the pad portions of the first and second gate patterns, respectively.

5. The device of claim 4, wherein each of the contact structures includes a first contact portion and a second contact portion which are sequentially stacked in a contact hole penetrating the interlayer dielectric layer, and wherein a width of a top surface of the second contact portion is less than a width of a top surface of the first contact portion.

6. The device of claim 5, further comprising:
an insulating spacer between an inner sidewall of each of the contact holes and the second contact portion included in the contact hole, wherein the insulating spacer is disposed on an edge of the top surface of the first contact portion, and the second contact portion is disposed on a central portion of the top surface of the first contact portion.

7. The device of claim 5, wherein the second contact portion includes a different conductive material from the first contact portion.

8. The device of claim 5, wherein the second contact portion includes the same conductive material as the first contact portion.

9. The device of claim 5, wherein the first contact portion includes an air gap.

10. The device of claim 4, wherein the plurality of contact structures are arrayed in a predetermined direction, wherein two immediately adjacent contact structures of the plurality of contact structures are separated from each other by a contact-space in the predetermined direction, and wherein one of the contact-spaces is different in size from another contact-space.

11. The device of claim 10, wherein the contact-spaces are gradually reduced in a descent direction of the pad portions constituting a step structure.

12. The device of claim 10, wherein the contact-spaces are gradually increased in a descent direction of the pad portions constituting a step structure.

13. The device of claim 1, further comprising:
a first data storing layer between a sidewall of each first vertical active pattern and the first gate patterns adjacent to the first vertical active patterns; and
a second data storing layer between a sidewall of each second vertical active pattern and the second gate patterns adjacent to the second vertical active patterns.

14. The device of claim 1, further comprising:
a lower stacked structure between the first stacked structure and the substrate, the lower stacked structure including lower insulating patterns and lower gate patterns which are alternately and repeatedly stacked;
a plurality of lower vertical active patterns penetrating the lower stacked structure;
an upper stacked structure on the second stacked structure, the upper stacked structure including upper insulating patterns and upper gate patterns which are alternately and repeatedly stacked; and
a plurality of upper vertical active patterns penetrating the upper stacked structure, wherein the number of the lower vertical active patterns is equal to the number of the first vertical active patterns, and the first vertical active patterns are respectively disposed on the lower vertical active patterns, and wherein the number of the upper vertical active patterns is equal to the number of the second vertical active patterns, and the upper vertical active patterns are respectively disposed on the second vertical active patterns.

15. The device of claim 14, wherein each of the lower gate patterns, the first gate patterns, the second gate patterns, and the upper gate patterns includes a pad portion, and
wherein the pad portions of the lower gate patterns, the first gate patterns, the second gate patterns, and the upper gate patterns are stacked to constitute a step structure.

16. A semiconductor memory device comprising:
a substrate;
a plurality of stacked structures that are sequentially stacked on a top surface of the substrate, wherein each of the stacked structures includes insulating patterns and gate patterns that are alternately arranged in a first direction perpendicular to the top surface of the substrate;
a plurality of rows of vertical active patterns that are sequentially arranged on the top of the surface to penetrate the plurality of stacked structures, respectively, wherein vertical active patterns in each row are spaced apart from each other by a predetermined distance in a second direction parallel to the top surface of the substrate, wherein the number of vertical active patterns in a first row of the rows is equal to or less than the number of vertical active patterns in a second row of the rows, wherein the second row is positioned under the first row, wherein at least one of the vertical active patterns in the second row is not connected to the vertical active patterns in the first row.

17. The semiconductor memory device of claim 16, wherein the vertical active patterns in the first row are connected to at least some of the vertical active patterns in the second row, respectively.

18. The semiconductor memory device of claim 17, further comprising:
a plurality of contact structures that are respectively formed on top surfaces of the vertical active patterns in an uppermost row and pad portions that are respectively included in side edges of the gate patterns and form a step structure; and an interlayer dielectric layer filling a space between top surfaces of the contact structures and the top surface of the substrate.

19. The semiconductor memory device of claim 18, wherein each of the plurality of contact structures includes a first contact portion and a second contact portion that is formed under the first contact portion and has a width larger than a width of the first contact portion.

20. The semiconductor memory device of claim 19, wherein a distance between two neighboring contact structures increases in the second direction from the vertical active patterns toward the pad portions.

* * * * *